United States Patent
Saida et al.

(10) Patent No.: US 10,388,350 B2
(45) Date of Patent: Aug. 20, 2019

(54) MEMORY SYSTEM, SEMICONDUCTOR STORAGE DEVICE, AND SIGNAL PROCESSING SYSTEM

(71) Applicant: Kabushiki Kaisha Toshiba, Tokyo (JP)

(72) Inventors: Daisuke Saida, Shinagawa Tokyo (JP); Yousuke Isowaki, Yokohama Kanagawa (JP); Michael Arnaud Quinsat, Yokohama Kanagawa (JP); Kenichiro Yamada, Minato Tokyo (JP); Kosuke Tatsumura, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/911,211

(22) Filed: Mar. 5, 2018

(65) Prior Publication Data
US 2019/0035449 A1     Jan. 31, 2019

(30) Foreign Application Priority Data
Jul. 26, 2017    (JP) .................................. 2017-144840

(51) Int. Cl.
*G11C 11/16*    (2006.01)
*G06N 7/00*    (2006.01)

(52) U.S. Cl.
CPC .......... *G11C 11/1675* (2013.01); *G06N 7/005* (2013.01); *G11C 11/161* (2013.01); *G11C 11/1673* (2013.01)

(58) Field of Classification Search
CPC . G11C 11/1675; G11C 11/1673; G11C 11/16; G06N 7/005
See application file for complete search history.

(56) References Cited

U.S. PATENT DOCUMENTS 6,094,374 A * 7/2000 Sudo ................... G11C 11/5621
                                                            365/185.21
7,493,353 B2   2/2009 Ueda et al.
(Continued)

FOREIGN PATENT DOCUMENTS

JP    3708113    8/2005
JP    2016-62463    4/2016

OTHER PUBLICATIONS

Ma et al., "A 600-μW ultra-low-power associative processor for image pattern recognition employing magnetic tunnel junction-based nonvolatile memories with autonomic intelligent power-gating scheme," Japanese Journal of Applied Physics (2016), pp. 04EF15-1-04EF15-11.

(Continued)

*Primary Examiner* — Pho M Luu
(74) *Attorney, Agent, or Firm* — Finnegan, Henderson, Farabow, Garrett & Dunner, L.L.P.

(57) ABSTRACT

A memory system has a nonvolatile memory having a plurality of readable and writable memory cells, a write voltage control unit that controls at least one of a voltage value and a pulse width of a write voltage of the nonvolatile memory in accordance with a weight of a signal processing path or a signal processing node, a write unit that writes data in two or more memory cell groups among the plurality of memory cells using the write voltage controlled by the write voltage control unit, a reversal probability detection unit that detects a reversal probability of the memory cell group when writing data is written by the write unit, and a weight conversion unit that converts the detected reversal probability into a weight.

17 Claims, 50 Drawing Sheets

(56) References Cited

U.S. PATENT DOCUMENTS

| | | | |
|---|---|---|---|
| 7,710,793 B2* | 5/2010 | Nakagaki | G11C 16/30 |
| | | | 365/189.07 |
| 8,787,070 B2* | 7/2014 | Shimakawa | G11C 13/004 |
| | | | 365/148 |
| 10,078,550 B2* | 9/2018 | Marukame | G06F 11/1076 |
| 2016/0085627 A1 | 3/2016 | Marukame et al. | |

OTHER PUBLICATIONS

Borders et al., "Analogue spin-orbit torque device for artificial-neural-network-based associative memory operation," Applied Physics Express (2017), pp. 013007-1-013007-4.

Yamaoka et al., "20k-spin Ising Chip for Combinational Optimization Problem with CMOS Annealing," 2015 IEEE International Solid-State Circuits Conference (2015), pp. 432-433, and ISSCC 2015 paper continuations.

* cited by examiner

FIG.6A

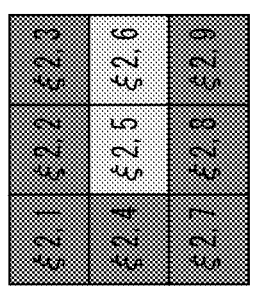
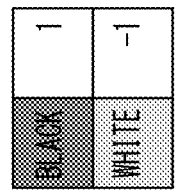
FIG.6B

FIG.6C

  
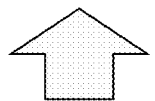 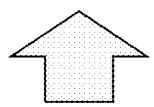 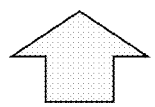
FIG.10B

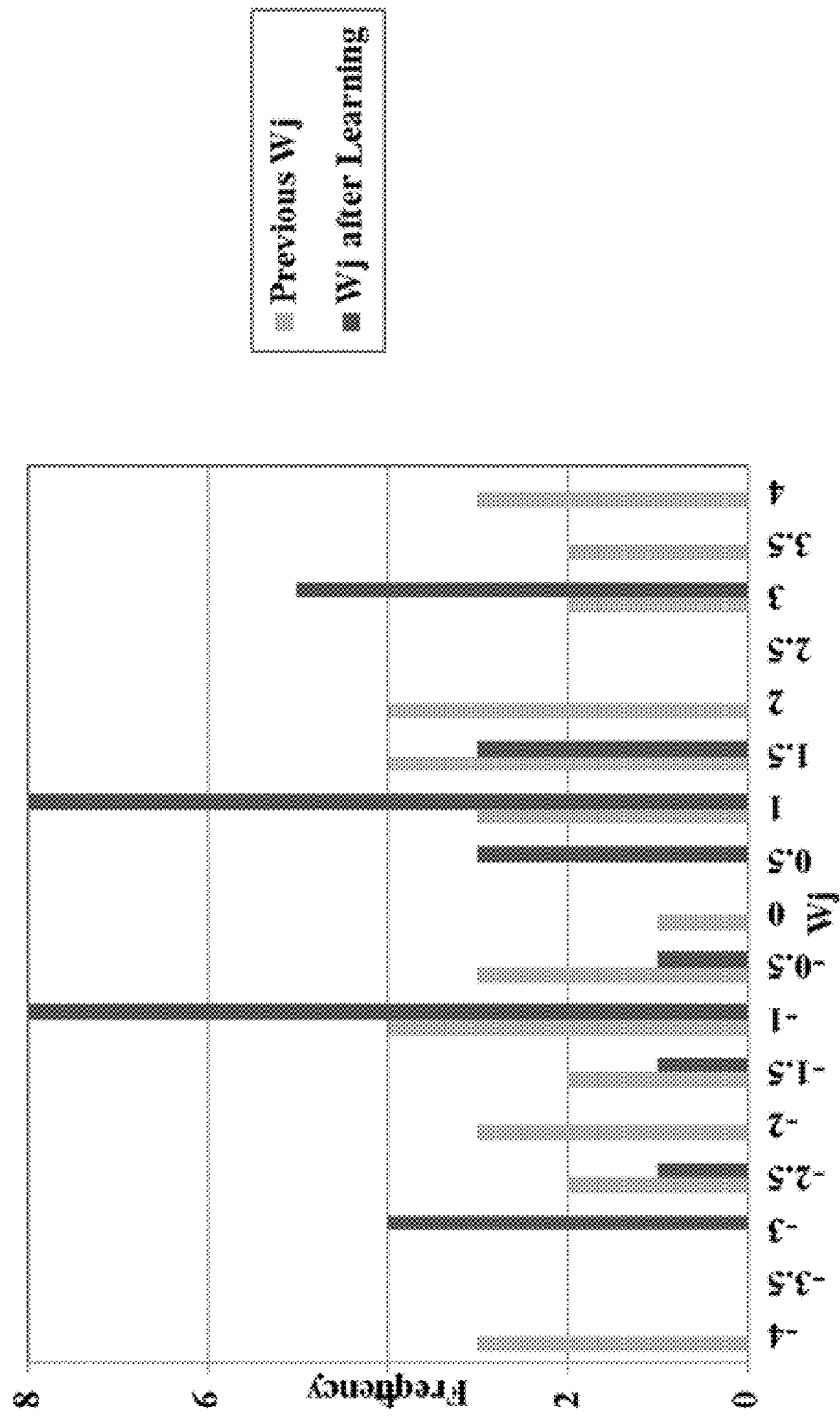

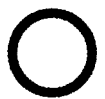
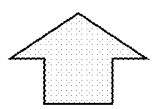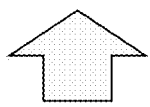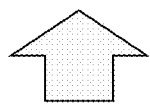
FIG.12B

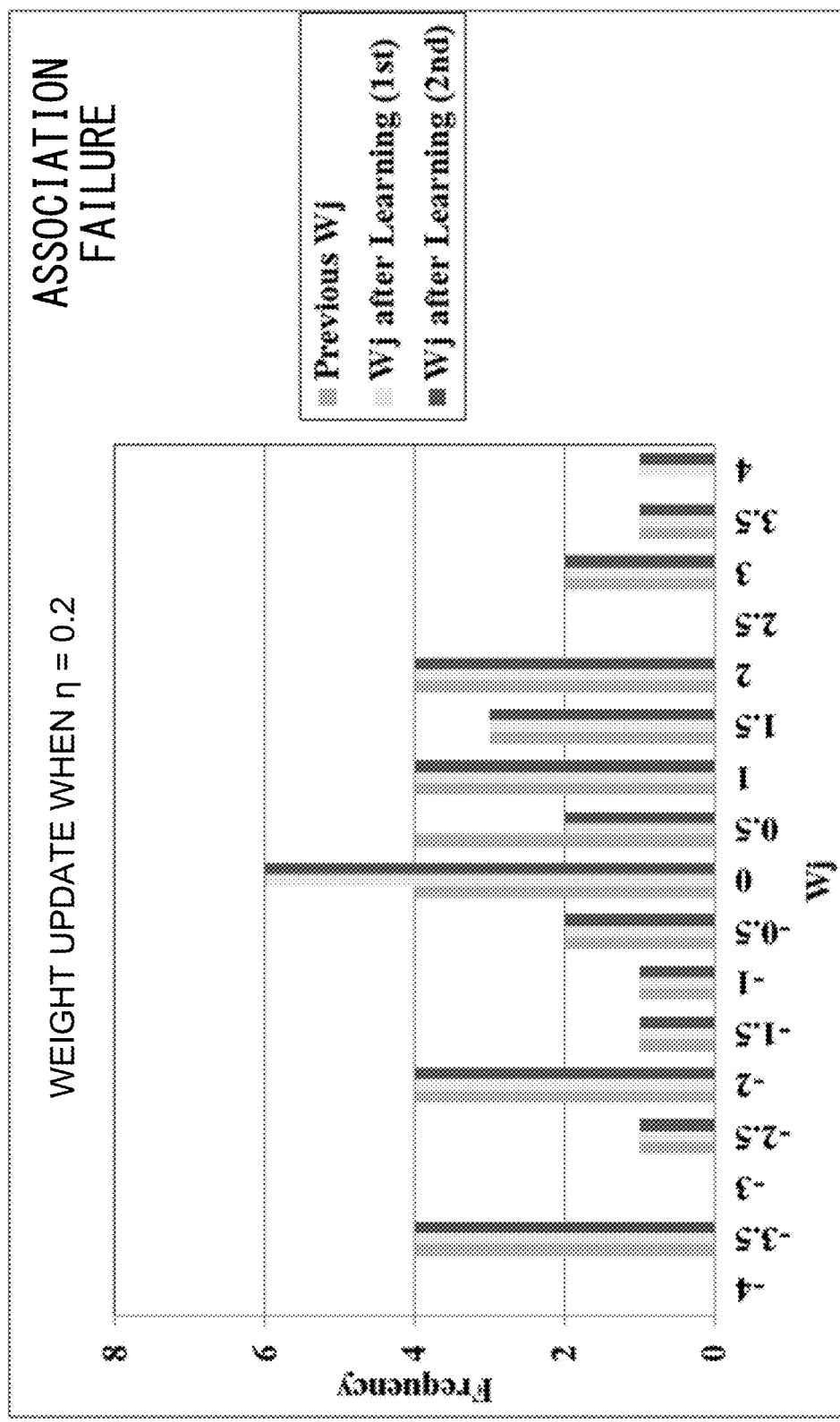

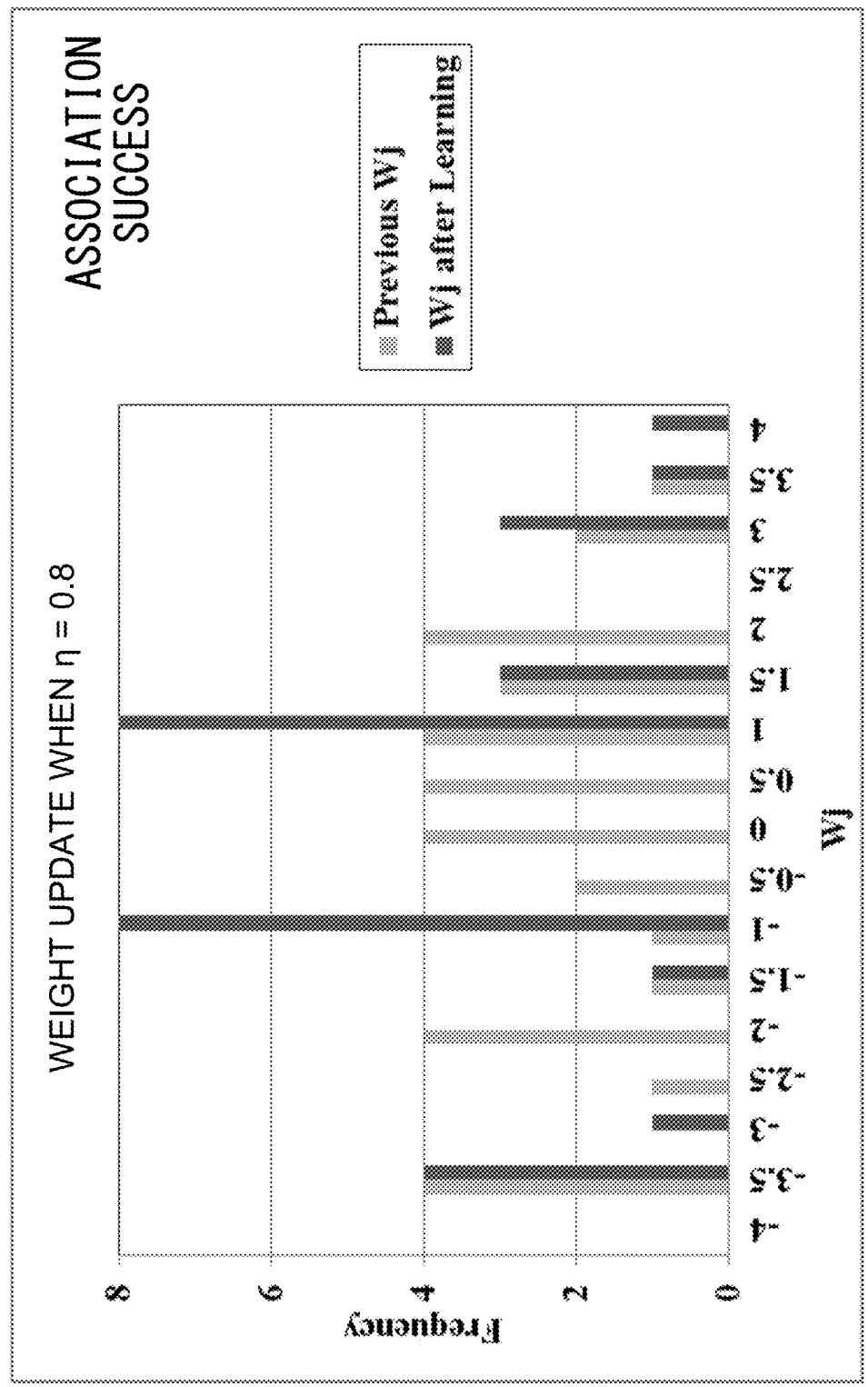

| | ANALOG VALUE | DIGITAL VALUE OF FIRST EXAMPLE | DIGITAL VALUE OF SECOND EXAMPLE |
|---|---|---|---|
| SYSTEM | REPRESENTED USING PRESENCE OR ABSENCE OF REVERSAL OF NUMBER OF MTJ ELEMENTS LARGER THAN $2^n$ | REPRESENTING $2^n$ WEIGHT STATES USING PRESENCE OR ABSENCE OF REVERSAL OF $n$ MTJ ELEMENTS | REPRESENTED USING NUMBER OF REVERSAL OF $2^n$ MTJ ELEMENTS |
| NUMBER OF MTJ ELEMENTS | 20 GRADATIONS × 36 = 720 | 4 GRADATIONS × 36 = 144 | 16 GRADATIONS × 36 = 576 |
| CHARACTERISTIC | ALLOWING WRITE SUCH THAT 0.1 < REVERSAL PROBABILITY < 0.9 HAVING ROBUSTNESS WITH AVERAGING EFFECT | WEIGHT GREATLY CHANGES WITH WRITE ERROR | WEIGHT CHANGE CAUSED BY WRITE ERROR IS SMALL WRITE NEEDS TO BE PERFORMED UNDER CONDITION WHERE WRITE ERROR DOES NOT OCCUR |
| AREA | LARGE | SMALL | MIDDLE |
| POWER | LOW (ex. 0.5V × 720) | HIGH | MIDDLE (ex. 0.5V × 1.6 × 576) |

FIG.16

MEMORY SYSTEM, SEMICONDUCTOR STORAGE DEVICE, AND SIGNAL PROCESSING SYSTEM

CROSS REFERENCE TO RELATED APPLICATIONS

This application is based upon and claims the benefit of priority from the prior Japanese Patent Application No. 2017-144840, filed on Jul. 26, 2017, the entire contents of which are incorporated herein by reference.

FIELD

Embodiments of the present invention relate to a memory system, a semiconductor storage device, and a signal processing system.

BACKGROUND

Although artificial intelligence (AI) has attracted attention recently, it is necessary to perform learning using a large number of data and calculation processing using a learning result, so that the processing amount is enormous. In particular, it is necessary to perform calculation using weights of signal processing paths or signal processing multiple times in a process of AI learning and utilizing learning results. In addition, it is also necessary to perform product-sum calculation multiple times in a neural network or the like, and there is a demand for hardware that performs calculation of multiple weights and the product-sum calculation with high speed and low power consumption.

A memory that can be accessed at high speed with low power consumption is required in order to perform the calculation of multiple weights, the product-sum calculation, and the like with high speed and low power consumption. A magnetoresistive random access memory (MRAM) has attracted attention as a candidate of this type of memory. The MRAM is a memory that can simultaneously satisfy three characteristics of a high rewrite resistance, operation performance of performing read and write at high speed, and a small cell area that enables high integration. In particular, a write current and a write delay are extremely small so that a high-speed operation is possible in a system that uses spin injection of a vertical magnetic field, called a spin transfer torque MRAM (STT-MRAM) using a magnetoresistive tunnel junction (MTJ) element, among MRAMs, and thus, a wide range of applications thereof are expected.

BRIEF DESCRIPTION OF THE DRAWINGS

FIG. 6A is a view illustrating an example of representing three kinds of characters I with 3×3 grids;

FIG. 6B is a view illustrating an example of representing three kinds of characters C with 3×3 grids;

FIG. 6C is a view illustrating an example of representing three kinds of characters T with 3×3 grids;

FIG. 10B is a view illustrating character recognition results in FIG. 10A;

FIG. 11A is a graph illustrating weight confirmation results after updating the weights once;

FIG. 12B is a view illustrating character recognition results in FIG. 12A;

FIG. 13A is a graph illustrating weight update results when n=0.2;

FIG. 13D is a graph illustrating weight update results when n=0.8;

FIG. 16 is a view summarizing characteristics when a weight is stored as each of an analog value, the digital value of the first example, and the digital value of the second example;

DETAILED DESCRIPTION

According to one embodiment, a memory system has a nonvolatile memory having a plurality of readable and writable memory cells, a write voltage control unit that controls at least one of a voltage value and a pulse width of a write voltage of the nonvolatile memory in accordance with a weight of a signal processing path or a signal processing node, a write unit that writes data in two or more memory cell groups among the plurality of memory cells using the write voltage controlled by the write voltage control unit, a reversal probability detection unit that detects a reversal probability of the memory cell group when writing data is written by the write unit, and a weight conversion unit that converts the detected reversal probability into a weight.

Hereinafter, embodiments will be described with reference to the drawings. In the present specification and accompanying drawings, the description and illustration are given by omitting, changing, or simplifying some components for ease of understanding and convenience in illustration, but technical contents at the extent with which similar functions can be expected are also interpreted as being included in the embodiments.

Figure 1:
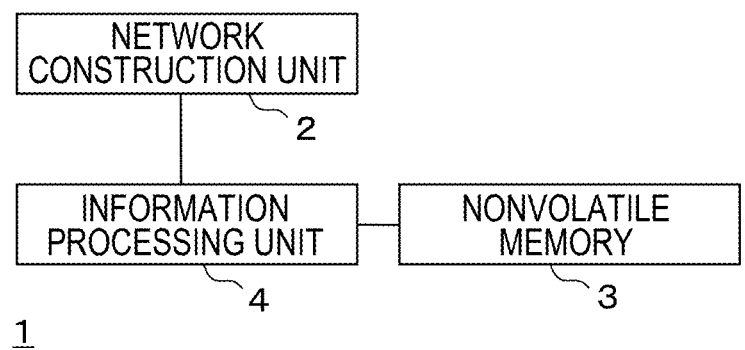
FIG. 1 is a block diagram illustrating a schematic configuration of a signal processing system 1 according to one embodiment.

FIG. 1 is a block diagram illustrating a schematic configuration of a signal processing system 1 according to one embodiment. The signal processing system 1 of FIG. 1 includes a network construction unit 2, a nonvolatile memory 3, and an information processing unit 4.

The network construction unit 2 constructs various signal processing networks including weights of signal processing paths or signal processing nodes. There is no limit on a specific mode of the signal processing network. The signal processing path or signal processing node included in the signal processing network is also called a synapse. The signal processing network includes a plurality of synapses and a unique weight for each synapse. The weight is a value represented by gradations including two or more levels. The gradation is a kind of the weight, and each value that the weight can take is a different gradation.

A typical example of the signal processing network is a neural network. The neural network is a mathematical model simulating a human neural circuit. The neural network includes a full-connect type network such as a Hopfield model and a locally competitive algorithm. In addition, the neural network also includes a deep neural network such as a convolutional neural network, a recurrent neural network, a binary neutral network and a ternary neutral network.

In this manner, various neural networks can be applied to the signal processing network according to the present embodiment. In addition, a network other than the neural network, such as an Ising model, can also be applied to the signal processing network according to the present embodiment.

The nonvolatile memory 3 has a plurality of readable and writable memory cells (nonvolatile memory cells). In the present embodiment, each memory cell is used to store the weight on the signal processing network. A reason for using the nonvolatile memory 3 is to retain weight information in the nonvolatile memory 3 even when a power supply of the signal processing system 1 is turned off. As a result, it is possible to continuously perform calculation processing using the signal processing network when the power supply is turned on thereafter by utilizing a weight that has been valid immediately before turning off the power supply.

The plurality of memory cells is two-dimensionally arranged in the directions of a plurality of word lines and a plurality of bit lines as will be described later. An area in which these memory cells are two-dimensionally arranged is called a memory cell array (nonvolatile memory cell array) or a memory cell area.

Each memory cell is, for example, a spin-transfer torque magnetic tunnel junction MRAM (STT-MRAM). The STT-MRAM is a spin injection memory that causes magnetization reversal by utilizing a magnetic moment generated by spin of electrons (rotation), and is characterized in that power necessary for write and write delay are extremely small as compared with nonvolatile memories that have been researched and developed so far. The STT-MRAM has high-speed operation (access speed is 10 ns or less) comparable to an SRAM and high rewrite resistance ($10^{15}$ or higher), and has high affinity with a CMOS logic process for low power, and thus is suitable for a cache application or the like Details of the nonvolatile memory 3 will be described later.

The information processing unit 4 reads a weight from the nonvolatile memory 3, causes the signal processing network to adapt to the read weight, and performs calculation processing according to the signal processing network. As a result, at least a part of the processing of the signal processing network can be executed using hardware so that it is possible to obtain a complicated calculation processing result in a shorter time than a case of executing the entire processing by software processing.

Figure 2:
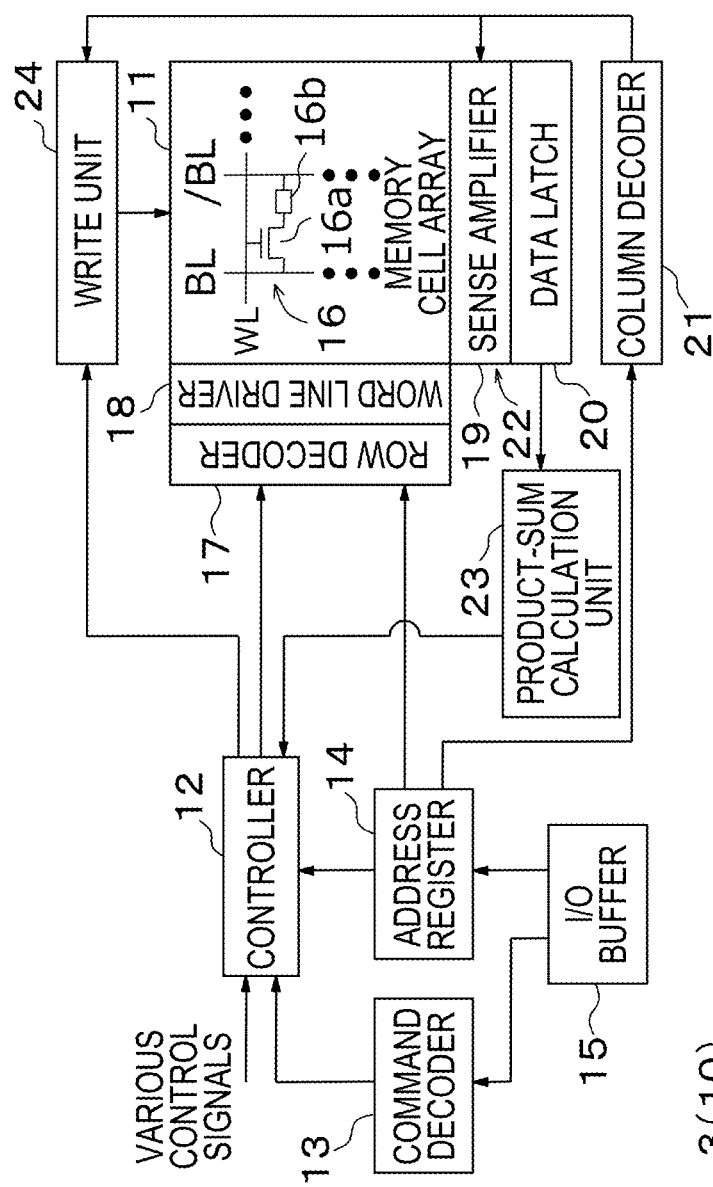
FIG. 2 is a block diagram illustrating an internal configuration of a nonvolatile memory 3 and a memory system 10.

FIG. 2 is a block diagram illustrating an internal configuration of the nonvolatile memory 3 and the memory system 10; FIG. 2 illustrates a block configuration of a main part inside the nonvolatile memory 3 and the memory system 10. FIG. 2 does not illustrate blocks irrelative to an operation of the present embodiment.

The nonvolatile memory 3 and the memory system 10 of FIG. 2 include a memory cell array 11, a controller 12, a command decoder 13, an address register 14, and an I/O buffer 15. When all the constituent parts in FIG. 2 are formed into one chip, the nonvolatile memory 3 and the memory system 10 have the same configuration. When the memory cell array 11 of FIG. 2 and some peripheral parts thereof are formed into one chip as the nonvolatile memory 3 and the other constituent parts are formed as a separate chip, a combination of the chip of the nonvolatile memory 3 and the other chip form the memory system 10.

The memory cell array 11 includes a plurality of memory cells (nonvolatile memory cells) 16 two-dimensionally arrayed along a plurality of word lines (first wirings) and a plurality of bit lines (second wirings) crossing the word lines, respectively. Each of the memory cells 16 has, for example, a transistor 16*a* and a resistance-change element 16*b*. Incidentally, an internal configuration of the memory cell 16 is optional.

The word line is driven by a row decoder 17 and a word line driver 18. A sense amplifier 19 is connected to the bit line, and the data sensed by the sense amplifier 19 is once latched by a data latch 20 and then sent to the controller 12. In addition, data that needs to be written to an arbitrary memory cell 16 is supplied to the bit line via a column decoder 21.

The data of the memory cell 16 may be read using a current sum circuit or the like as well as read using the sense amplifier 19 as will be described later. In the present embodiment, circuits to read the data of the memory cell 16 via the bit line are collectively referred to as a read unit 22.

The read unit 22 may integrate voltages of the plurality of bit lines or currents flowing through the plurality of bit lines and determine a value of a reversal probability using this integrated value. Alternatively, the reversal probability may be determined by determining whether each bit line is 0 or 1, and comparing the number of bits of 0 and the number of bits of 1.

A product-sum calculation unit 23 may be connected to the read unit 22. The product-sum calculation unit 23 performs product-sum calculation processing using the data read by the read unit 22 as will be described later. A result of the product-sum calculation processing performed by the product-sum calculation unit 23 is sent to the controller 12, for example.

In FIG. 2, a write unit 24 is provided on a side of the bit line opposite to the sense amplifier 19. The write unit 24 supplies a write voltage obtained by controlling at least one of a voltage value and a pulse width by the controller 12 to be described later, to a corresponding bit line to drive the bit line. In the present embodiment, write voltages having the same voltage level are simultaneously supplied to two or more bit lines to simultaneously drive a plurality of bit lines.

The nonvolatile memory 3 writes or reads data in accordance with an access request from a processor (not illustrated). A command, an address and data issued by the processor (not illustrated) are input to the I/O buffer 15. The command from the processor that has passed through the I/O buffer 15 is decoded by the command decoder 13 and then input to the controller 12. The address from the processor that has passed through the I/O buffer 15 is input to the address register 14. The address register 14 sends a row address to the row decoder 17 and sends a column address to the column decoder 21. The data (write data) that has passed through the I/O buffer 15 is sent to the write unit 24.

Figure 3:
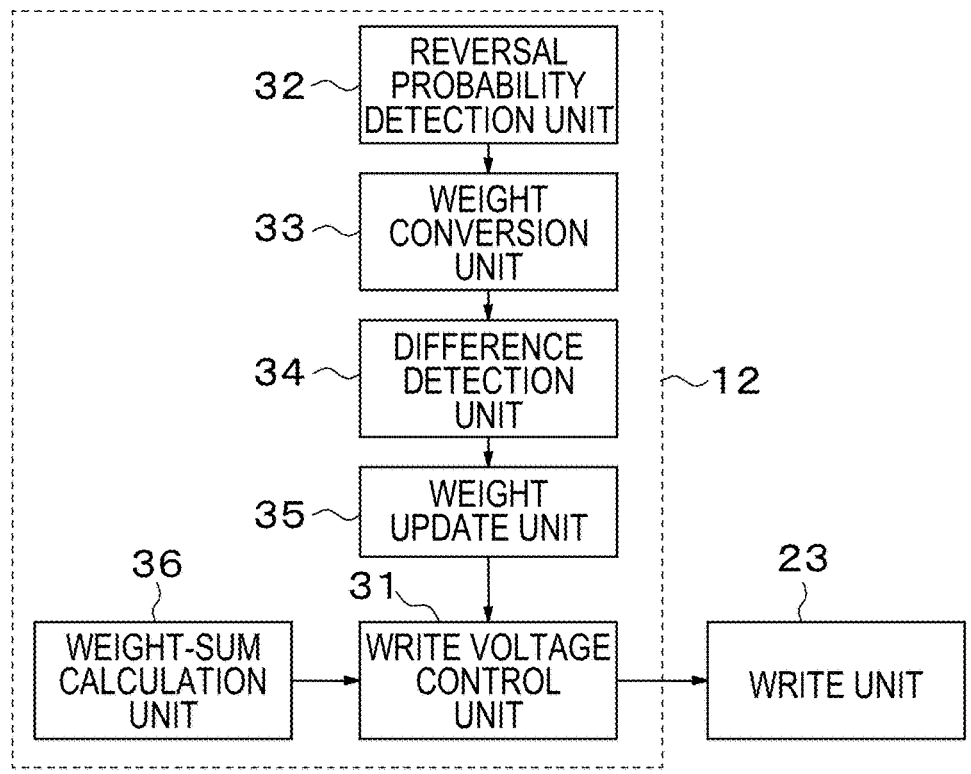
FIG. 3 is a block diagram illustrating an example of an internal configuration of a controller 12.

The controller 12 controls each unit in the memory system 10. FIG. 3 is a block diagram illustrating an example of an internal configuration of the controller 12. As illustrated in FIG. 3, the controller 12 includes a write voltage control unit 31, a reversal probability detection unit 32, a weight conversion unit 33, a difference detection unit 34, a weight update unit 35, and a weight-sum calculation unit 36.

The write voltage control unit 31 controls at least one of the voltage value and the pulse width of the write voltage of the nonvolatile memory 3 according to the weight of the signal processing path or the signal processing node. When data is written by the write voltage control unit 31, the reversal probability detection unit 32 detects a reversal probability indicating a ratio of the number of the memory cells 16 whose logic is reversed among a group of the memory cells 16. The weight conversion unit 33 converts the detected reversal probability into a weight.

The write voltage control unit 31, the reversal probability detection unit 32, and the weight conversion unit 33 are indispensable constituent elements, but the difference detection unit 34 and the weight update unit 35 are required in the case of updating the weight.

The difference detection unit 34 detects a difference between the weight, which has been obtained by conversion in the weight conversion unit 33 and the weight which has been used by the write voltage control unit 31 to control a write pulse. The weight update unit 35 updates the weight used by the write voltage control unit 31 to control the write pulse based on the difference.

The weight-sum calculation unit 36 calculates a sum of a plurality of weights. The weight-sum calculation unit 36 is required at the time of storing a weight obtained by combining a plurality of weights in the nonvolatile memory 3. In this case, the write voltage control unit 31 controls at least one of the voltage value and the pulse width of the write voltage according to the weight calculated by the weight-sum calculation unit 36.

Figure 4:
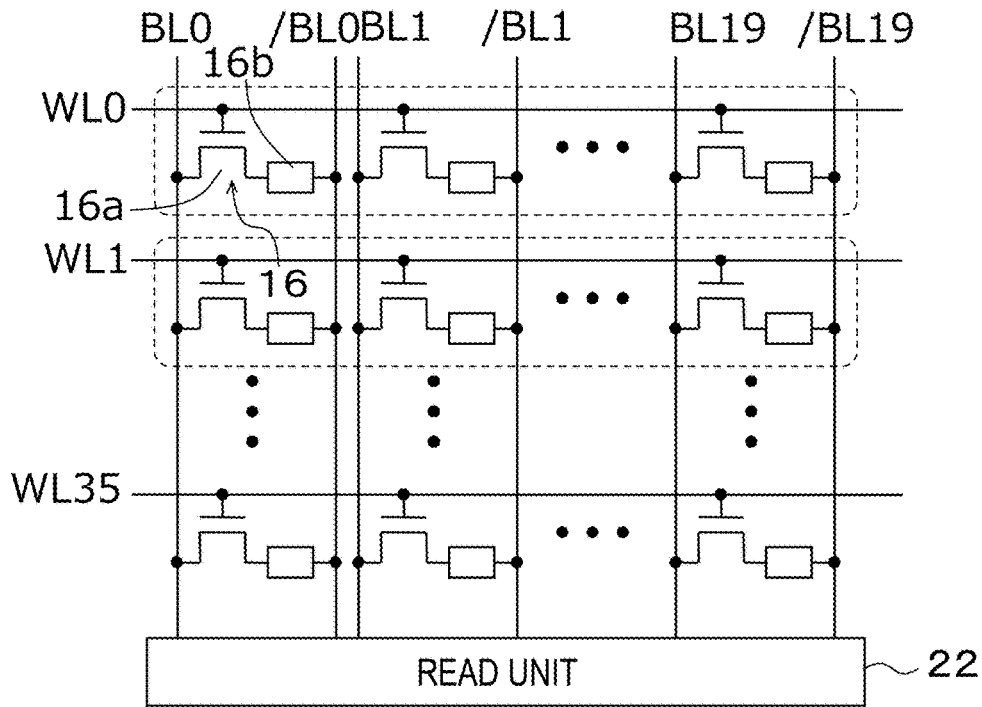
FIG. 4 is a diagram illustrating a memory cell area having 36 word lines and 20 bit line pairs.

Next, a description will be given regarding an example in which the Hopfield model is used as the signal processing network for association of a character inside 3×3 grids in vertical and horizontal directions. The Hopfield model is a network model in which each signal processing node has signal processing paths (synapses) with all the other signal processing nodes and weights specific, respectively, to the signal processing paths are set. Here, as illustrated in FIG. 4, it is assumed to use a memory cell area in the nonvolatile memory 3 including 36 word lines WL0 to WL35 and 20 bit line pairs (BL0/BL0) to (BL19/BL19). The memory cell 16 includes, for example, an MTJ element of a vertical magnetization type. The MTJ element is an STT-MRAM excellent in the rewrite resistance and writing speed. Incidentally, the memory cell 16 may have a cell structure other than the MTJ element.

The twenty memory cells 16 connected to each word line in FIG. 4 store a weight of one synapse. Accordingly, the memory cell area of FIG. 4 stores weights of 36 synapses.

The row decoder 17 illustrated in FIG. 2 drives an arbitrary one word line among the 36 word lines. At this time, a driving potential of the word line is set to a predetermined potential. In addition, a write voltage having at least one of a voltage value and a pulse width in accordance with a weight value of the corresponding synapse are supplied to at least some bit lines connected to all the memory cells 16 connected to the word line in a driving state.

A kind of the bit line to be driven is selected by the column decoder 21. When a weight is written as an analog value in the memory cell area illustrated in FIG. 4, the column decoder 21 selects all the 20 bit lines as will be described later. Then, the write unit 24 simultaneously drives the 20 bit lines with the same voltage to simultaneously write data to the twenty memory cells 16 connected to this word line. The write voltage to be supplied to the 20 bit lines by the write unit 24 is a voltage that depends on the weight value (gradation). Alternatively, the write unit 24 may set the write voltage to be supplied to the 20 bit lines to a common voltage level, and change the pulse width of the write voltage, that is, time to supply the write voltage to each bit line, in accordance with the weight value.

In the present embodiment, a ratio of the number of memory cells 16 in which the data has been correctly written and the logic is reversed among the twenty memory cells 16 is defined as a reversal probability. This reversal probability is associated with the weight of the corresponding synapse. Since the twenty memory cells 16 are provided, there are 20 reversal probabilities, and the weight can be represented using 20 gradations. The higher the write voltage is, the higher the reversal probability is. For example, it is possible to change the reversal probability in accordance with the weight by setting the write voltage to be higher as the weight is larger.

Figure 5:
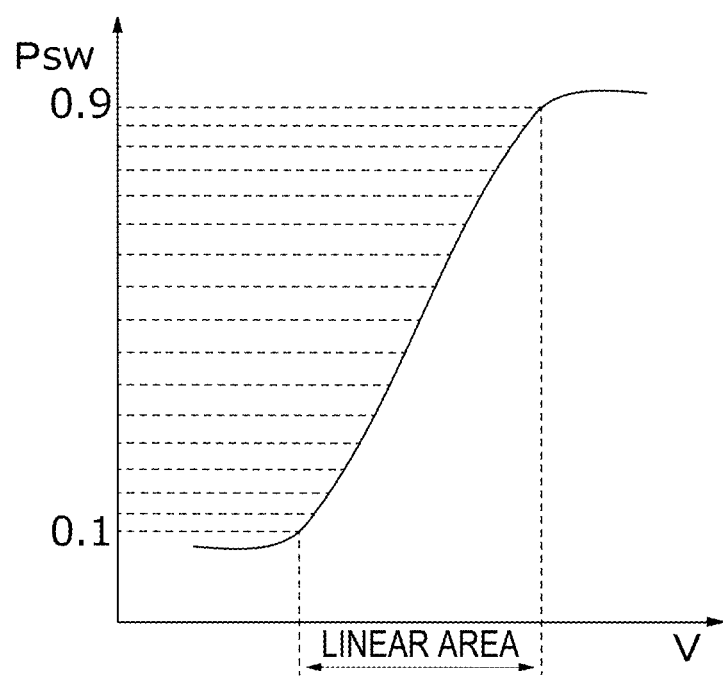
FIG. 5 is a graph illustrating a correspondence relationship between a write voltage V of a bit line and a reversal probability Psw.

FIG. 5 is a graph illustrating a correspondence relationship between a write voltage V of a bit line and a reversal probability Psw. The graph of FIG. 5 has a non-linear characteristic when the weight and the reversal probability Psw are in the vicinity of the maximum and minimum, but has a linear characteristic in the other cases. In the non-linear characteristic area, the weight and reversal probability do not change so much even if the write voltage is changed. Thus, in the present embodiment, the write voltage is associated with the weight and reversal probability using the linear characteristic area. The number of gradations of the weight is 16 gradations, for example, and a write voltage in accordance with each gradation is set. In this case, since the reversal probability is obtained as the ratio in the 16 memory cells 16, variations among the respective memory cells 16 are averaged, and it is less susceptible to influence of the variation.

In the Hopfield model, energy E of the entire signal processing network is defined as the following Formula (1).

$$E = -\frac{1}{2}\sum_{i=1}^{n}\sum_{j=1}^{n}W_{ij}X_iX_j \quad (1)$$

Wij is a weight of a signal processing path (synapse) from signal processing nodes i to j. The weight Wij=0 when the signal processing node i=j. When i and j are different, Wij=Wji.

Further, xi is +1 or −1, and (Xi)$^2$ is constantly 1. Accordingly, the weight that minimizes the energy function of Formula (1) is expressed by the following Formula (2).

$$Wij=XiXj \quad (2)$$

Figure 6A:
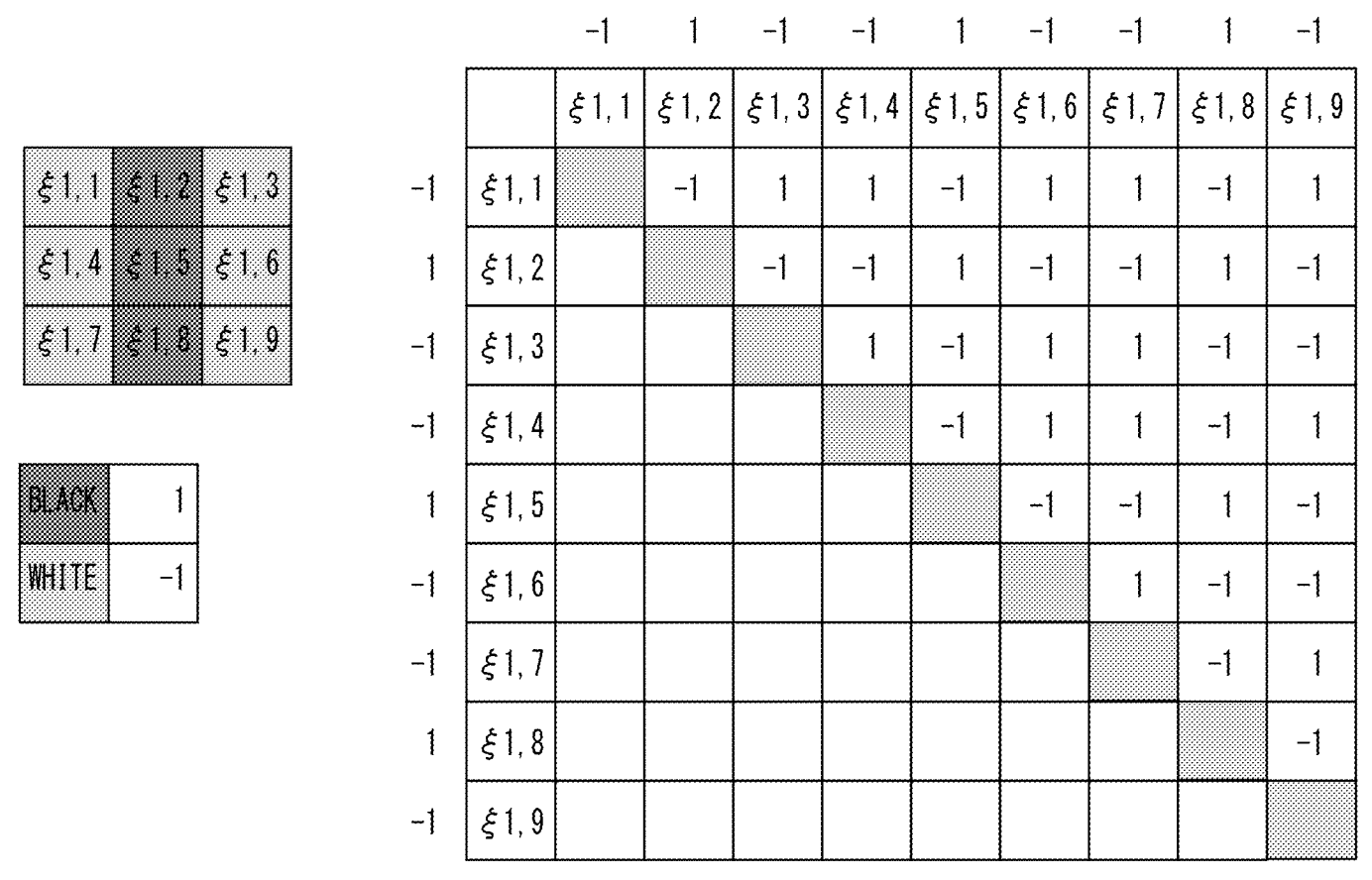
Figure 6C:
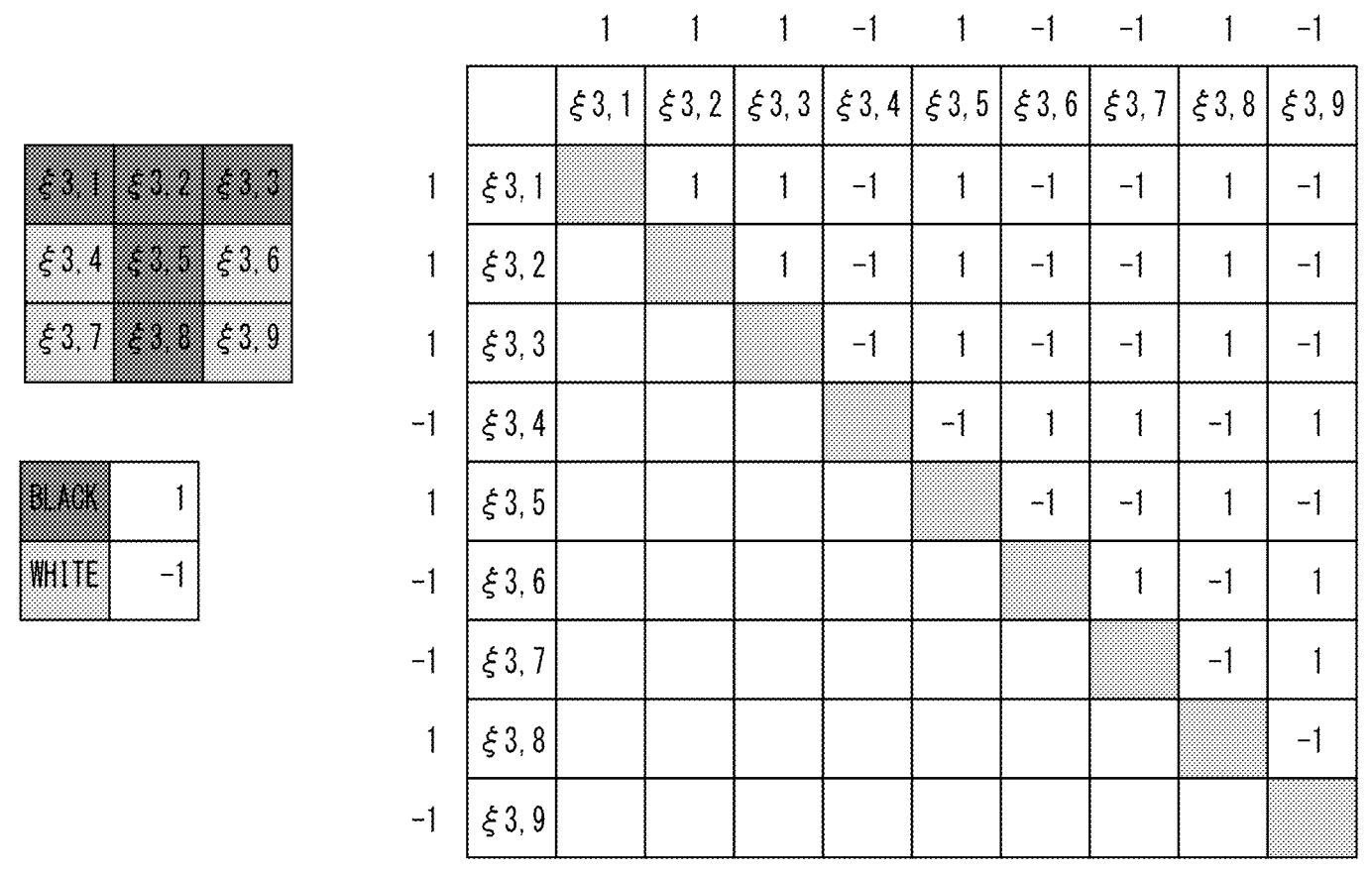

FIGS. 6A, 6B, and 6C illustrate examples of representing three kinds of characters I, C, and T in 3×3 grids. In these drawings, a grid characterizing each character within the 3×3 grids is set to +1, and the other grid is set to −1. In order to represent each character, a correspondence relationship between one specific grid in the 3×3 grids and each of the other 8 grids may be expressed by each weight. A table showing each weight in a correspondence relationship between arbitrary two grids in the 3×3 grids is illustrated on the right side of each of FIGS. 6A to 6C. In these tables, there are 36 valid weights since a weight between the same grids is set to zero and the weights Wij between a grid i and a grid j is set to be equal to the weight Wji between the grid j and the grid i. Each weight can be obtained by multiplying values of two areas to be associated with each other as expressed in Formula (2).

The 36 weights of each character can be stored in the memory cell area illustrated in FIG. 4 using the 36 word lines. The three characters may be stored in different memory cell areas, but 36×3=108 word lines are required in this case.

Figure 7:
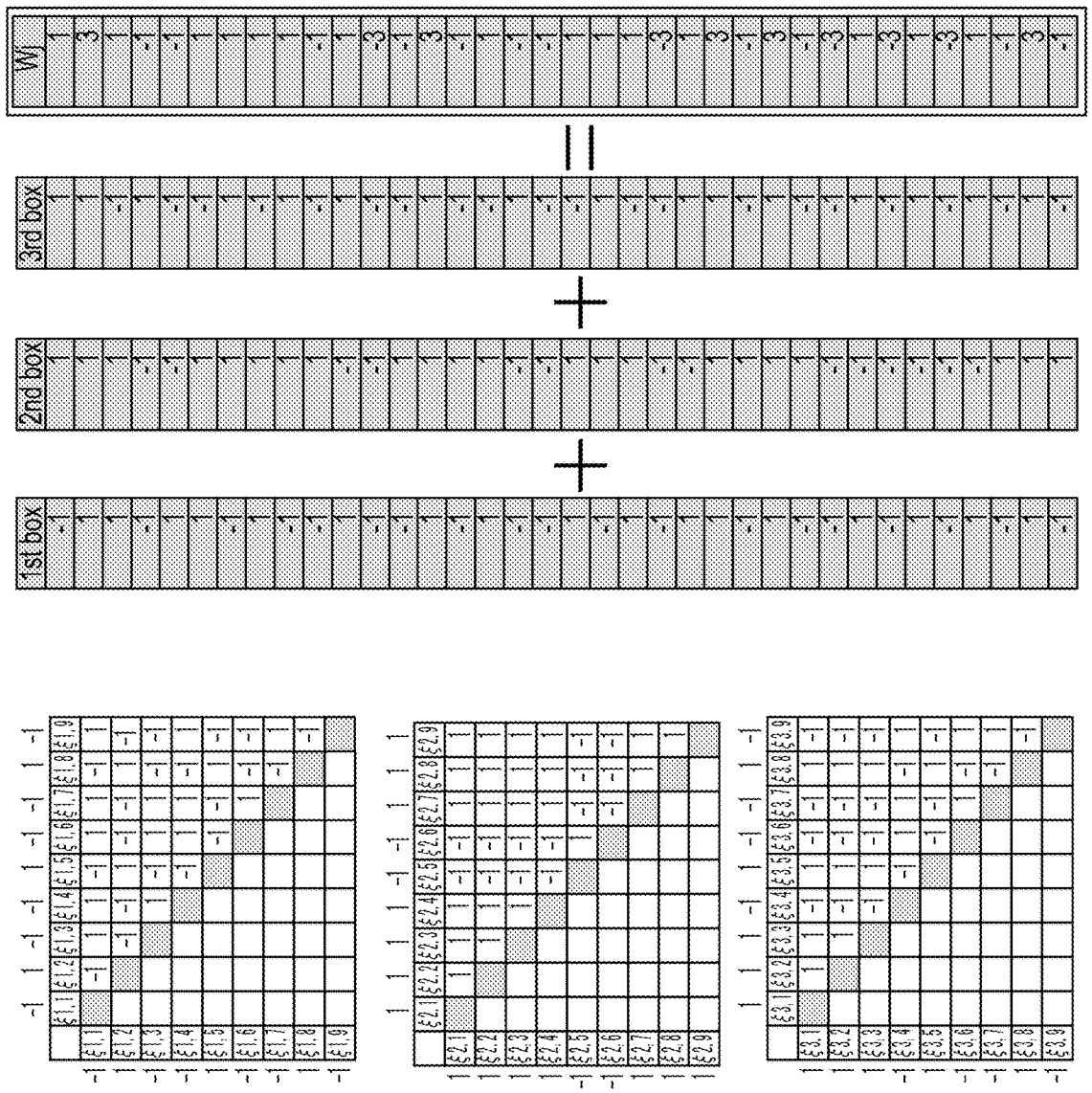
FIG. 7 is a view illustrating a process of calculating the sum of weights in FIGS. 6A to 6C.

It is also possible to combine the 36 weights representing each of the three characters and store the combined weight in the memory cell area. FIG. 7 is a view illustrating a process of calculating a sum of the weights in FIGS. 6A to 6C. FIG. 7 illustrates results obtained by adding 36 weights representing each of the three characters for each weight. As a result, as illustrated in FIG. 7, the weight Wi=−3, the weight Wi=−1, the weight Wi=+1, and the weight Wi=+3 appear 5 times, 11 times, 15 times, and 5 times, respectively.

In this manner, the weights Wi correctly representing the three kinds of characters I, C, and T have four kinds of −3, −1, +1, and +3, and a range of values indicating the weights is −4 to +4 if considering the update of weights. It is desirable to provide a weight by a 0.5 step in order to accurately represents a character.

Figure 8:
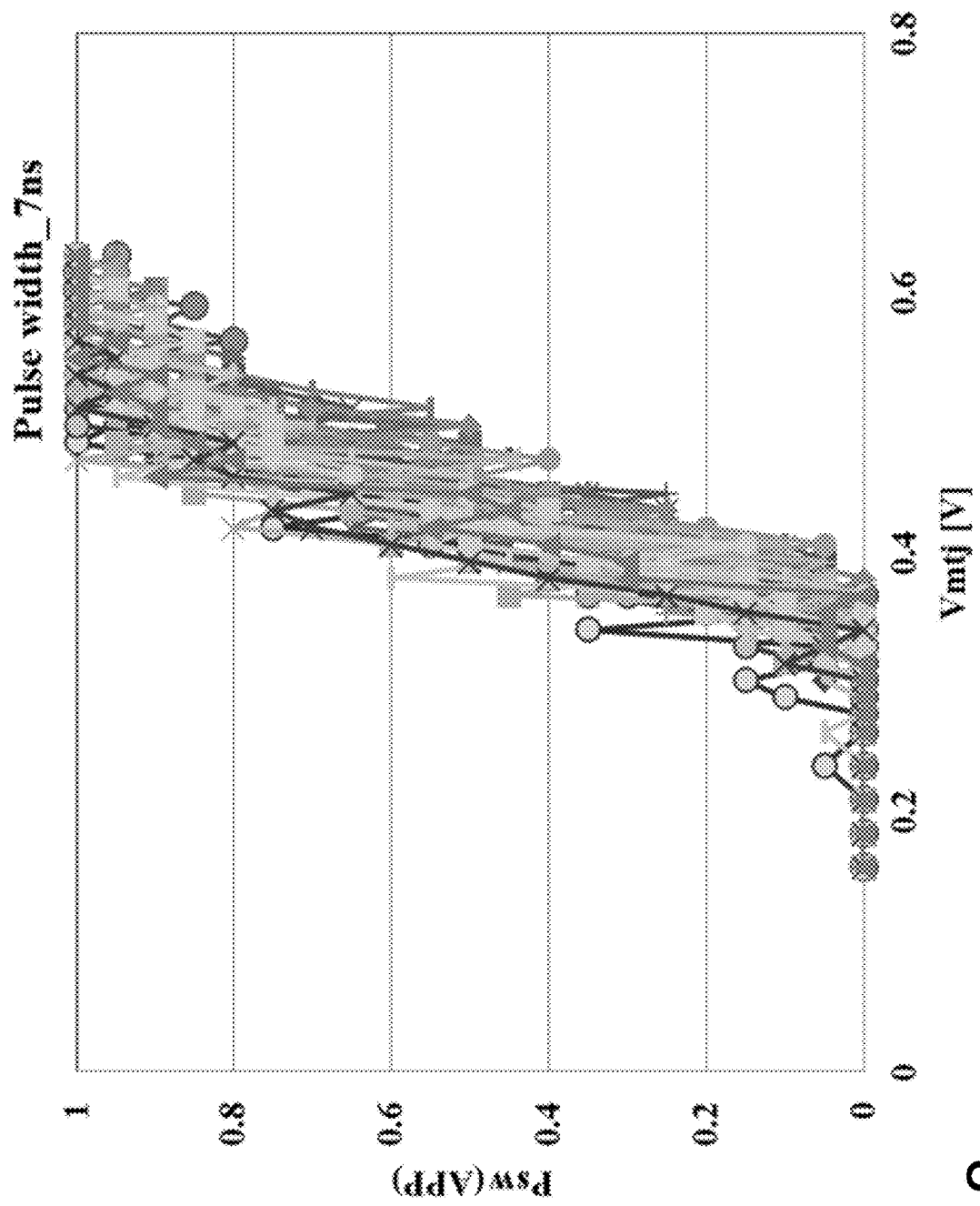
FIG. 8 illustrates experimental results of reversal probabilities of 36 synapses.

FIG. 8 illustrates experimental results of reversal probabilities of 36 synapses. In FIG. 8, the horizontal axis indicates a voltage Vmtj applied to the MTJ element when a word line and a bit line are activated, and the vertical axis indicates the reversal probability Psw. In the experiment of FIG. 8, the twenty memory cells 16 are connected to each of 36 word lines, and the MTJ element is used as each of the memory cell 16 as illustrated in FIG. 4. FIG. 8 illustrates a degree of a variation in the reversal probability of each of the memory cells 16 when a word line voltage is changed.

Figure 9:
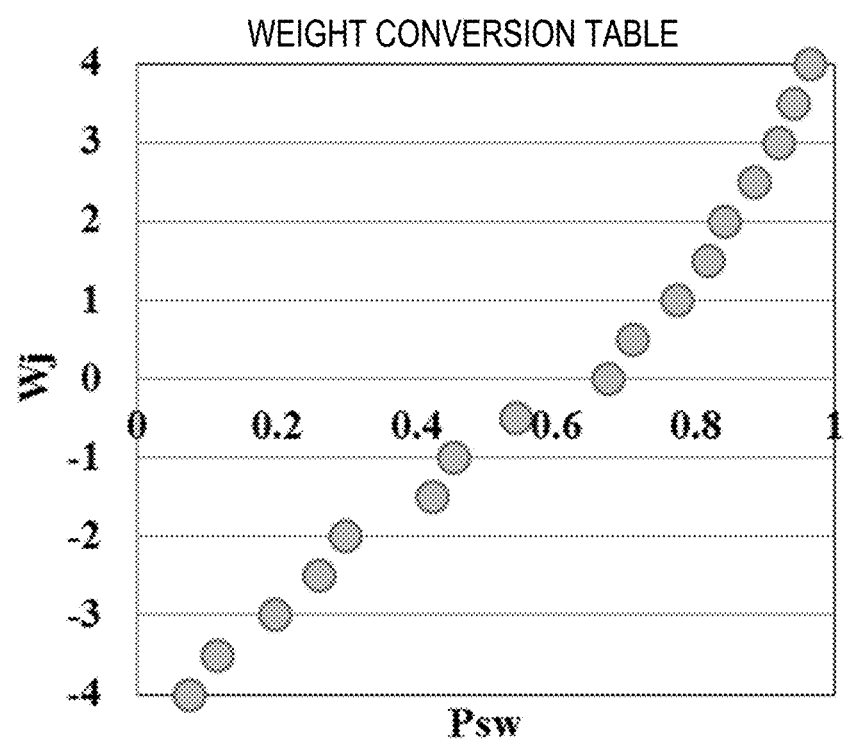
FIG. 9 is a weight conversion table obtained by calculating average values of the reversal probabilities of 36 synapses from FIG. 8 and allocating the average values to 16 gradations of weights.

FIG. 9 is a weight conversion table obtained by calculating average values of the reversal probabilities of the 36 synapses from FIG. 8 and allocating the average values to 16 gradations of weights. In FIG. 9, the horizontal axis indicates the reversal probability Psw and the vertical axis indicates the weight Wj. For example, when write is performed at 0.5 V, an average value of the reversal probabilities of the 36 synapses is 0.8. In FIG. 9, a reversal probability of 0.8 corresponds to a weight of 1.5. The weight conversion unit 33 converts the reversal probability into the weight based on the weight conversion table as illustrated in FIG. 9.

Figure 10A:
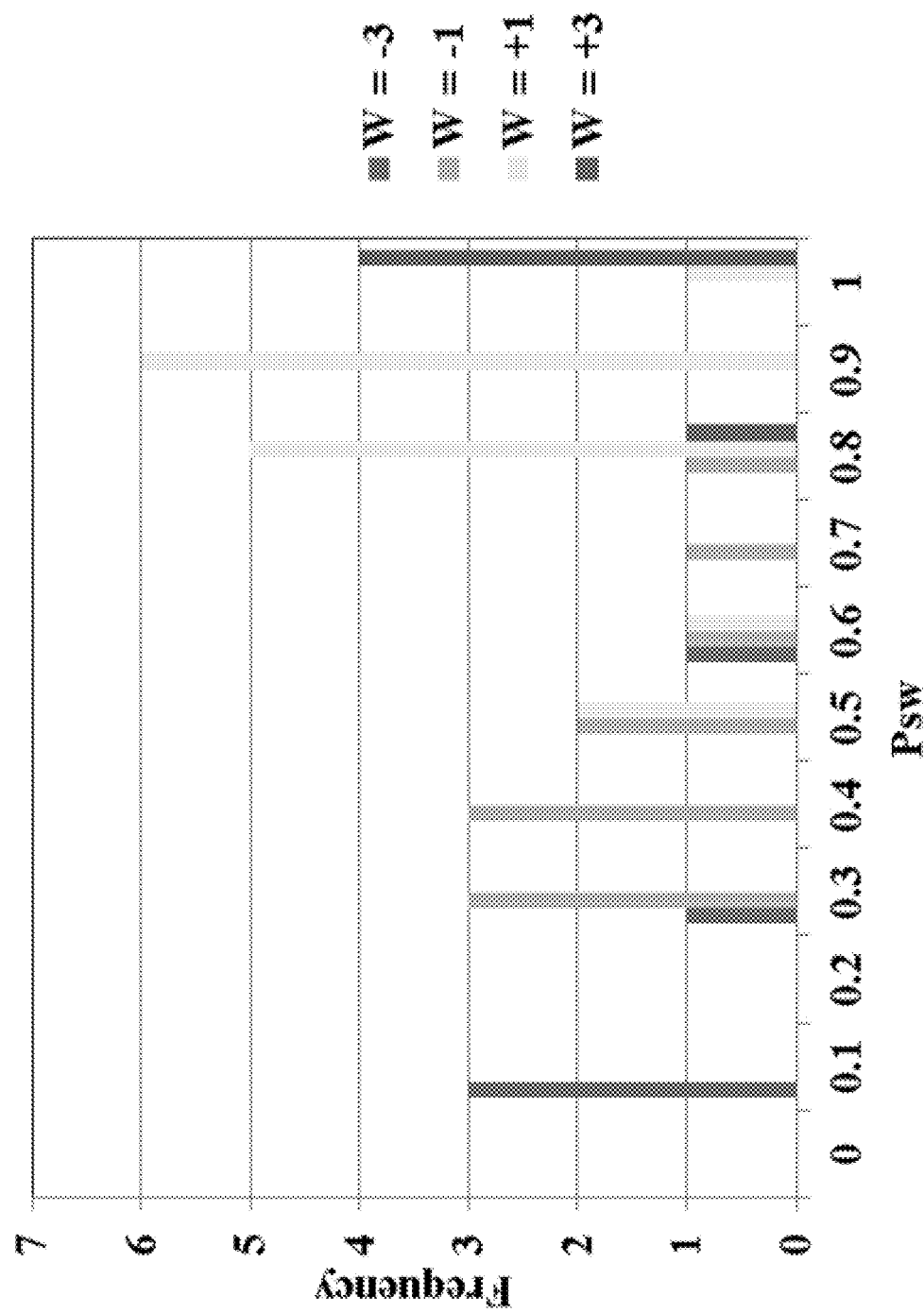
FIG. 10A is a graph illustrating weight confirmation results.

After each weight in FIG. 7 was written into each memory cell area connected to 36 word lines with a bit line voltage corresponding to each weight, the stored data of each of the memory cells 16 was read, the reversal probability was converted to the weight the weight conversion table in FIG. 9, and the weight was confirmed. FIGS. 10A and 10B illustrate weight confirmation results. In FIG. 10A, the horizontal axis indicates the reversal probability Psw and the vertical axis indicates a frequency. Ideally, the weight Wi=−3, the weight Wi=−1, the weight Wi=+1, and the weight Wi=+3 are to appear 5 times, 11 times, 15 times, and 5 times, respectively, as described above. Practically, however, weights having different values also appear, and the frequency is also different from an ideal number.

FIG. 10B is the graph in which the characters are represented within the 3×3 grids using the data read from each of the memory cells 16. Although the character I has been correctly represented, the characters C and T have not been correctly represented because values of some grids are different.

Thus, a difference between a correct weight and a currently stored weight was calculated, a write voltage necessary to store a weight, obtained by multiplying the calculated difference by an update coefficient η, again in the memory cell 16 was obtained, the write voltage was supplied to the corresponding bit line, and the stored weight was updated. Then, the stored data of each of the memory cells 16 after the weight update was read again to confirm the weight.

Figure 11B:
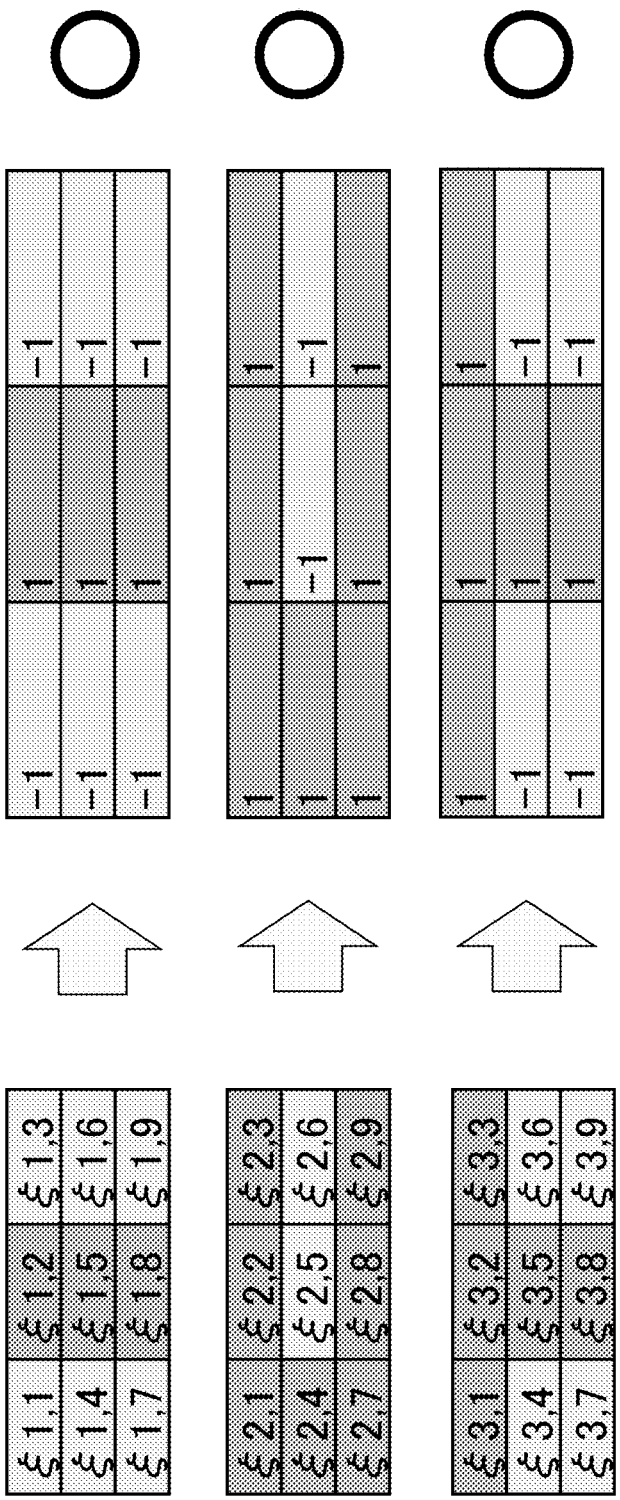
FIG. 11B is a view illustrating character recognition results in FIG. 11A.

FIGS. 11A and 11B illustrate weight confirmation results after updating the weights once. A bar graph with a light color in FIG. 11A indicates a weight value before update and a frequency, and a bar graph with a dark color thereof indicates an updated weight value and a frequency. It is understood that the frequencies of the weights Wi of −1 and +1 have increased, which has approached ideal weight values.

FIG. 11B is the graph in which the characters are represented within the 3×3 grids using the data read from each of the memory cells 16. All the characters I, C and T have been correctly represented.

Figure 12A:
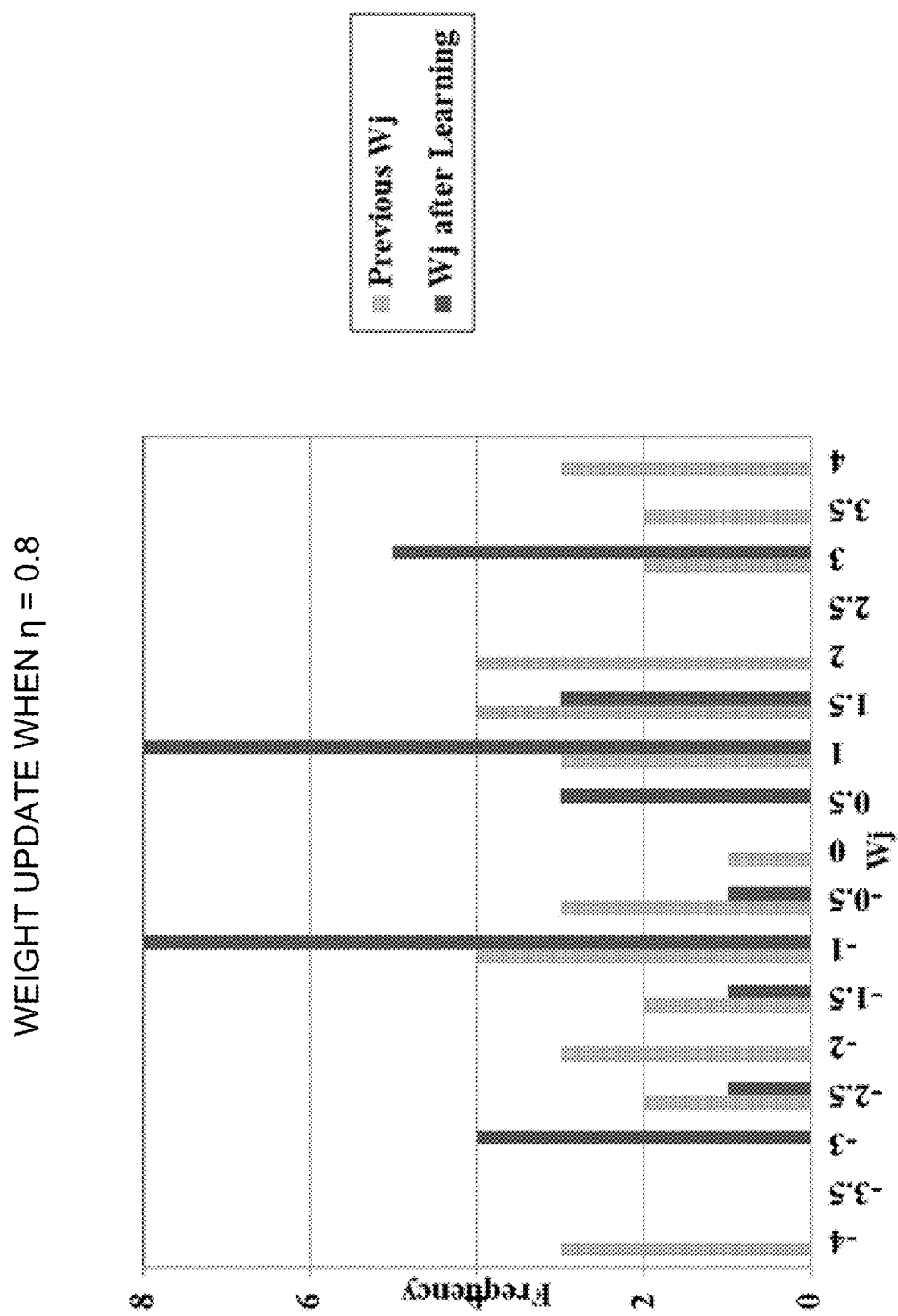
FIG. 12A is a graph illustrating weight confirmation results having defects which are different from those in FIGS. 10A and 10B.

FIGS. 12A and 12B illustrate results obtained by performing weight confirmation by performing update of weights once for the memory cell area in which weights having defects, different from those in FIGS. 10A and 10B, are stored, and then, reading the stored data of each of the memory cells 16 again. The weight value and the frequency approach the ideal values as illustrated in FIG. 12A, and the characters have been correctly represented also in the 3×3 grids as illustrated in FIG. 12B.

In this manner, it is understood that the character association can be performed with robustness by using the nonvolatile memory 3 according to the present embodiment even if the weight value and the frequency do not completely coincide with the ideal values.

Figure 13B:
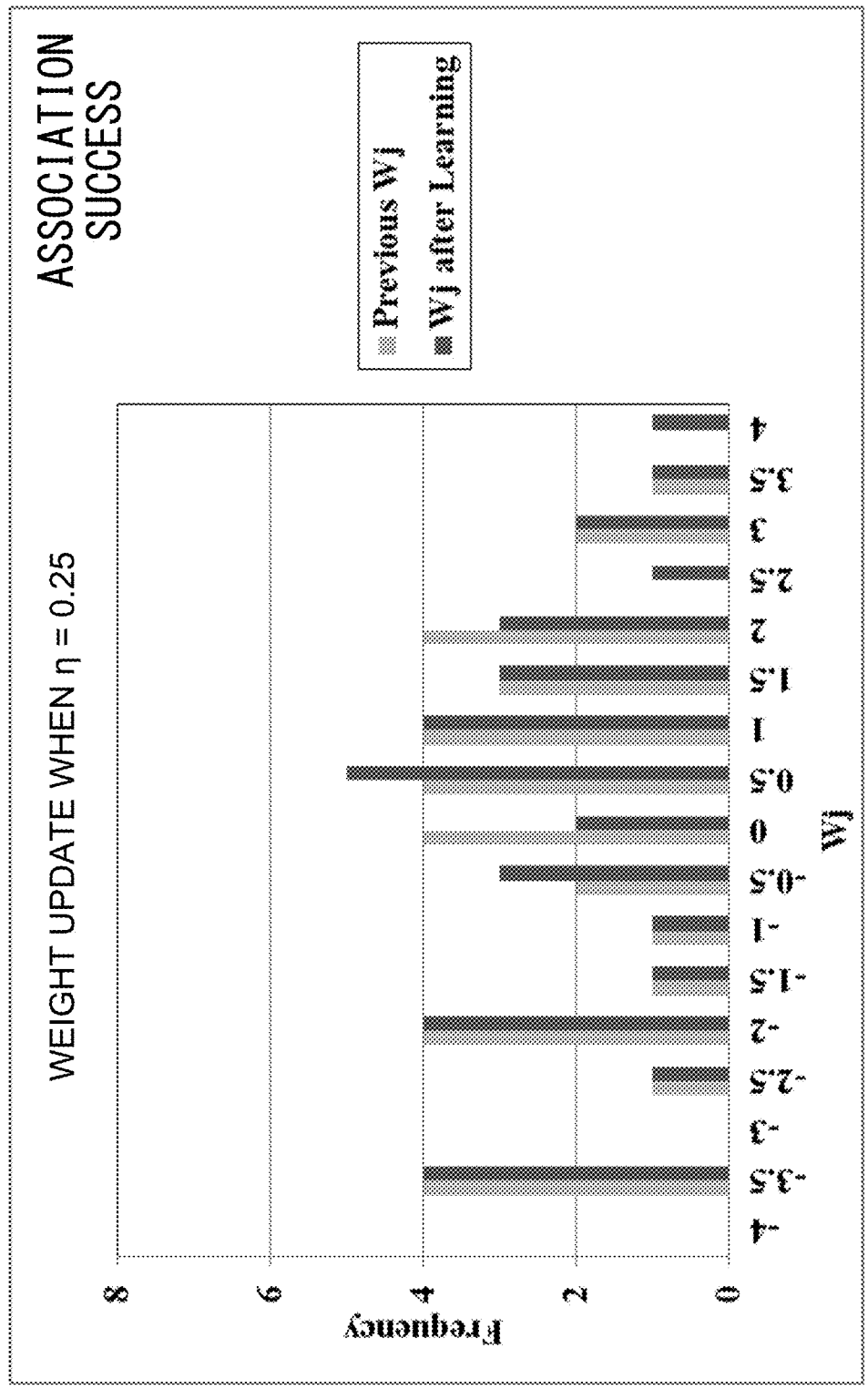
FIG. 13B is a graph illustrating weight update results when n=0.25.
Figure 13C:
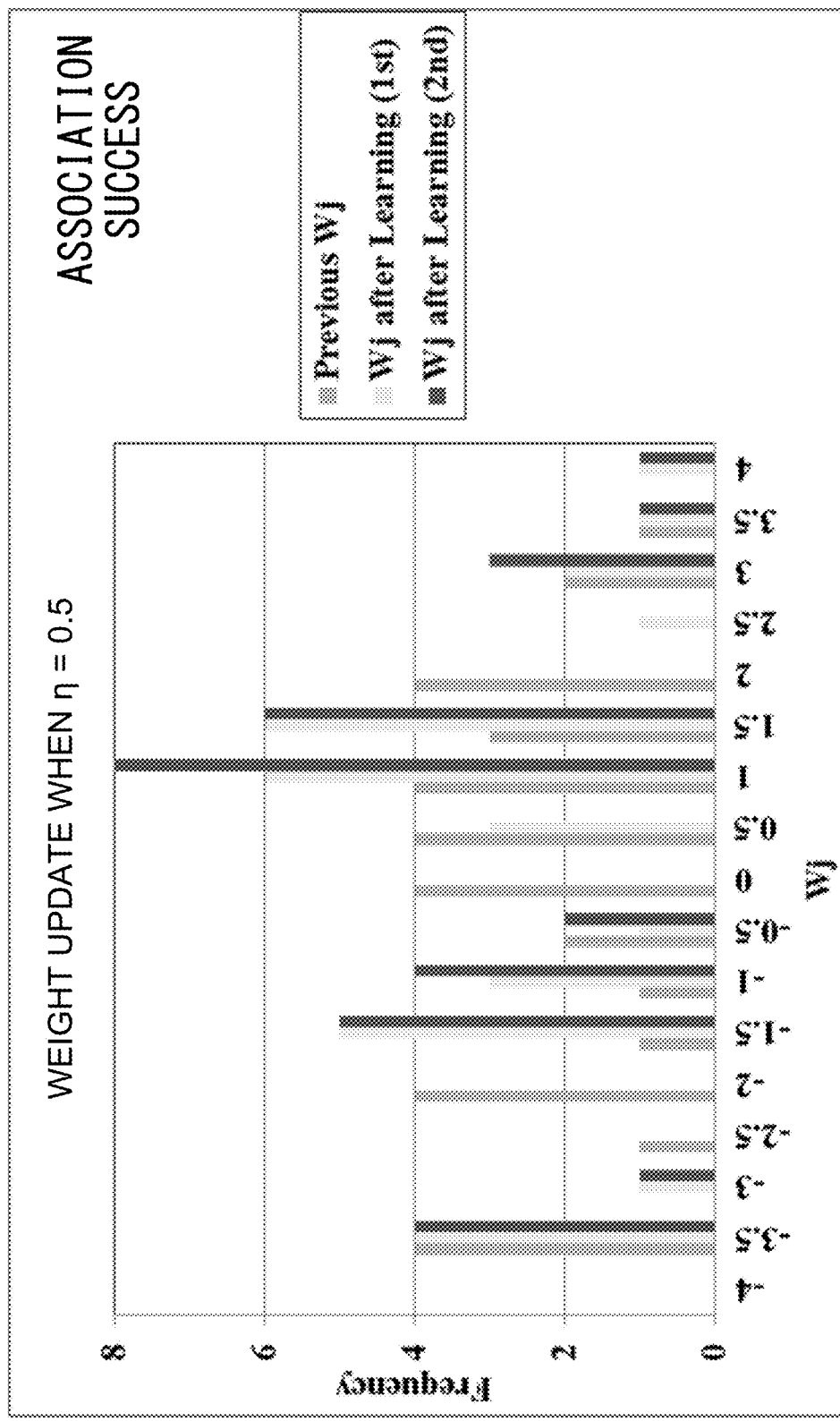
FIG. 13C is a graph illustrating weight update results when n=0.5.

The update coefficient η used when updating the weight depends on the number of gradations of the weight. For example, when the gradation of the weight is set by the 0.5 step, the update coefficient η needs to be equal to or larger than a value that allows an updated weight value to be increased by one digit after being rounded off. FIGS. 13A to 13D illustrate examples in which values of the update coefficient η are variously changed. When the update coefficient η=0.2, as illustrated in FIG. 13A, the weight value and the frequency are hardly changed before and after updating the weight, and the weight update has failed. On the other hand, the weight has been successfully updated although there is a difference in degree when the update coefficient η is 0.25 or larger as illustrated in FIGS. 13A to 13D. An update width of a weight is smaller as the update coefficient η is smaller, but the characters have been correctly represented. In this manner, when the update coefficient η is 0.25 or larger, the characters association has been successfully achieved by updating the weight once. This means that the memory system 10 has the robustness.

Figure 14A:
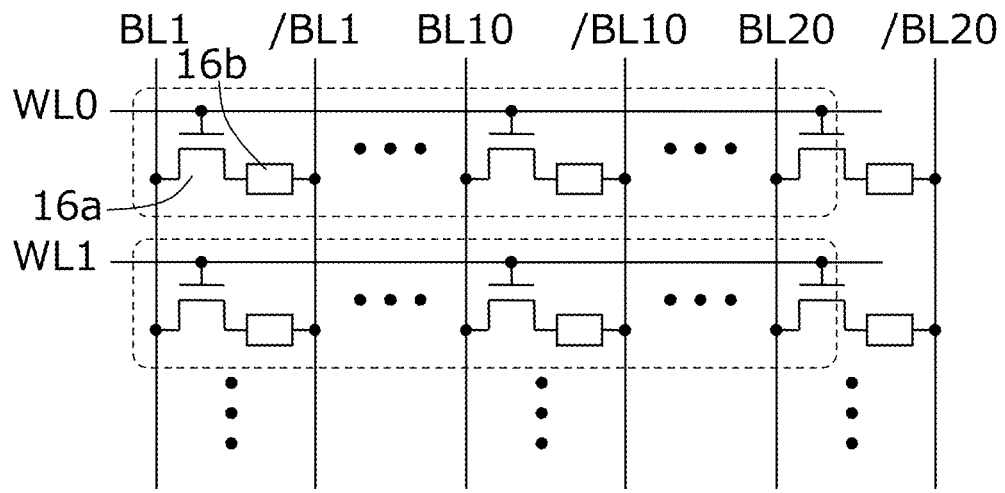
FIG. 14A is a circuit diagram used to verify a rising timing of a bit line.

As described above, the write voltage having the same voltage value is supplied to the 20 bit lines before and after driving the word line, thereby simultaneously writing the same data into the 20 memory cell areas in the present embodiment. In this case, a problem such as a decrease of the bit line voltage is expected. In order to verify this problem, a wiring capacitance was added to the word line and the bit line to verify whether a delay occurs at each rising timing of the bit lines BL1, BL10, and BL20 illustrated in FIG. 14A by simulation.

Figure 14B:
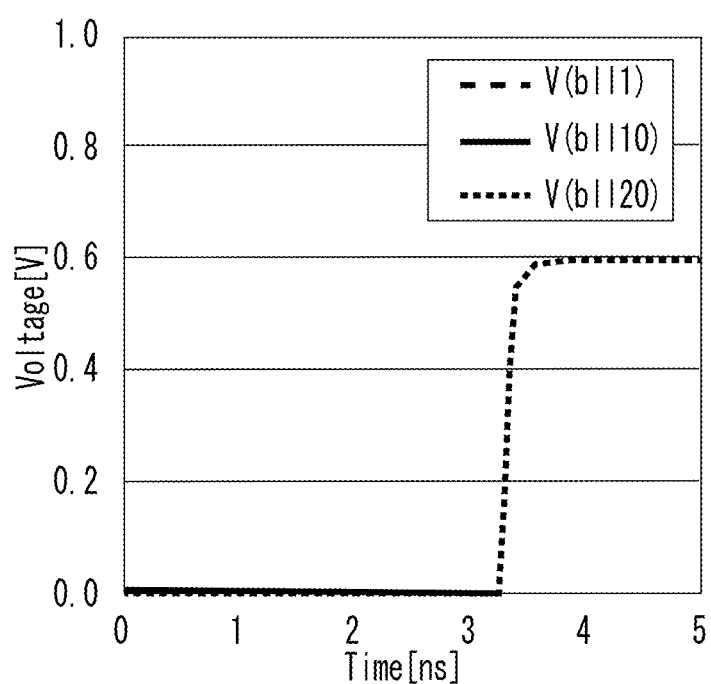
FIG. 14B is a waveform graph illustrating simulation results.

FIG. 14B is a waveform graph illustrating simulation results. In FIG. 14B, the horizontal axis indicates time and the vertical axis indicates voltages of the bit lines BL1, BL10, and BL20. According to FIG. 14B, it is understood that waveforms of these three bit lines overlap with each other, and there is no shift in timing at which the voltage of each bit line rises.

In this manner, the write voltage having the same voltage value is supplied to the plurality of bit lines to simultaneously write the same data in the plurality of memory cells 16 before and after driving the word line in the present embodiment. However, even when such a writing system is adopted, there is no risk of shift in write timing to each of the memory cells 16, and the write voltage does not decrease either. In addition, since the data can be simultaneously written in the plurality of memory cells 16 connected on the same word line according to the present embodiment, it is possible to perform the storage and update of the weight at high speed.

Although the weight is stored as the analog value in the memory cell area in the above-described example, the memory system 10 according to the present embodiment can also store the weight in the memory cell area as the digital value having the smaller number of bits than the analog value.

Figure 15A:
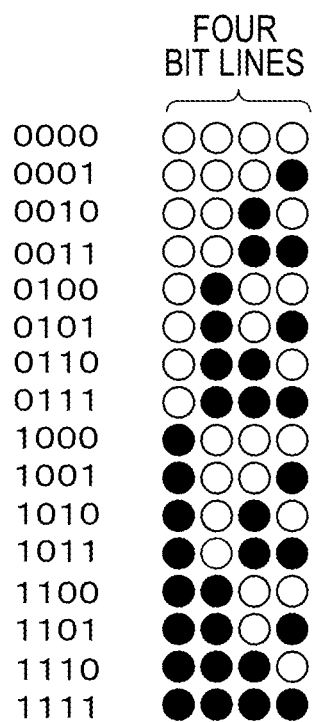
FIG. 15A is a view illustrating a first example in which weights are stored as digital values in a memory cell area.

FIG. 15A is a view illustrating a first example in which weights are stored as digital values in a memory cell area. In the first example, weights of 16 gradations are represented by 4-bit digital values. In the first example, there are 16 digital values from 0000 to 1111 in total as illustrated in FIG. 15A. In the first example, the weights of 16 gradations are stored using four memory cells 16 connected to to common word line. Although the weights of 16 gradations are stored using the 20 bit lines in the above-described case of storing the weight as the analog value, it is possible to store the weights of 16 gradations using only the four bit lines in the case of the digital value of the first example.

Figure 15B:
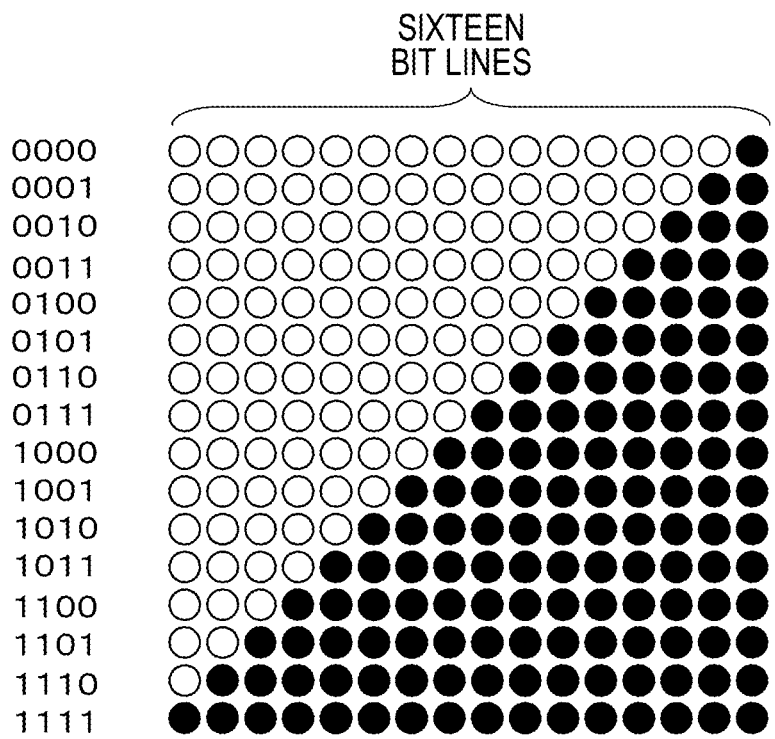
FIG. 15B is a view illustrating a second example in which weights are stored as digital values in a memory cell area.

FIG. 15B is a view illustrating a second example in which weights are stored as digital values in a memory cell area. In the second example, weights of 16 gradations are represented by 16-bit digital values. The number of values of 0 and 1 in 16 bits changes one by one for each gradation. In the second example, the weights of 16 gradations are stored using sixteen memory cells 16 connected to to common word line.

FIG. 16 is a view summarizing characteristics when the weight is stored as each of the analog value, the digital value of the first example, and the digital value of the second example. When the weight is written as the analog value, 20 memory cells×36 word lines=720 memory cells 16 are required. When the weight is written as the digital value of the first example, 4 memory cells×36 word lines=144 memory cells 16 are required. When the weight is written as the digital value of the second example, 16 memory cells×36 word lines=576 memory cells 16 are required. In this manner, the weight of the digital value of the first example has the highest area efficiency, the weight of the digital value of the second example is the second highest area efficiency, and the weight of the analog value is the worst area efficiency.

When the weight is stored as the analog value, the weights of 16 gradations are stored in the twenty memory cells 16 as described above, and a write voltage that allows a reversal probability to have a value within a range of 0.1 to 0.9 is mainly used. In this case, the reversal probability is distributed before and after 0.5. A voltage at which the reversal probability becomes 0.5 is a threshold voltage Vc. It can also be said that the threshold voltage Vc is an average operating point when the weight is stored as the analog value. Accordingly, it is possible to suppress the word line voltage to be low and to reduce power consumption when the weight is stored as the analog value.

In the case of the digital value of the first example, there is only the 4 bits, and it is possible to drastically reduce the area of the memory cell area used to store the weight as compared with the case of storing the weight as the analog value. However, when a value of 1 bit among 4 bits is not correctly stored, for example, the read weight becomes a significantly different value. Thus, in the case of the digital value of the first example, it is necessary to prevent occurrence of erroneous write by increasing a voltage value of the write voltage to be supplied to the bit line or increasing a write pulse width. However, the increase of the voltage value of the write voltage or the increase of the write pulse width leads to the increase of the power consumption. Alternatively, there is also a method of providing error correction (ECC) and performing verification is performed after write, but it is necessary to provide such a process every write. This becomes a factor of reducing operation speed. In addition, a circuit to perform error correction with the ECC is provided, which becomes overhead in view of a circuit area and latency for access to the circuit.

The digital value of the second example use 16 bits, and a weight is shifted only by one step when a value of 1 bit among the 16 bits is not correctly stored, and a tolerance of erroneous write is widened. However, the power consumption may increase by about 30% compared with the case of writing the weight as the analog value because it is necessary to increase the voltage value of the write voltage or to increase the write pulse width. Instead, the area of the memory cell area can be reduced by about 20% in the case of writing the weight as the digital value of the second example as compared with the case of writing the weight as the analog value.

On the other hand, the power consumption at the time of write can be reduced on average in the case of writing the weight as the analog value as compared with the case of writing the weight as the digital value of the first example or the second example. This means the improvement of the write resistance so that the memory cell 16 is hardly broken, the robustness is improved, and it is possible to reduce a redundant circuit. Although it is possible to reduce the memory cell area by about 20% in the case of writing the weight as the digital value of the second example as compared with the case of writing the weight as the analog value, the substantial area efficiency may be the same level because a redundant circuit is unnecessarily required.

Figure 17:
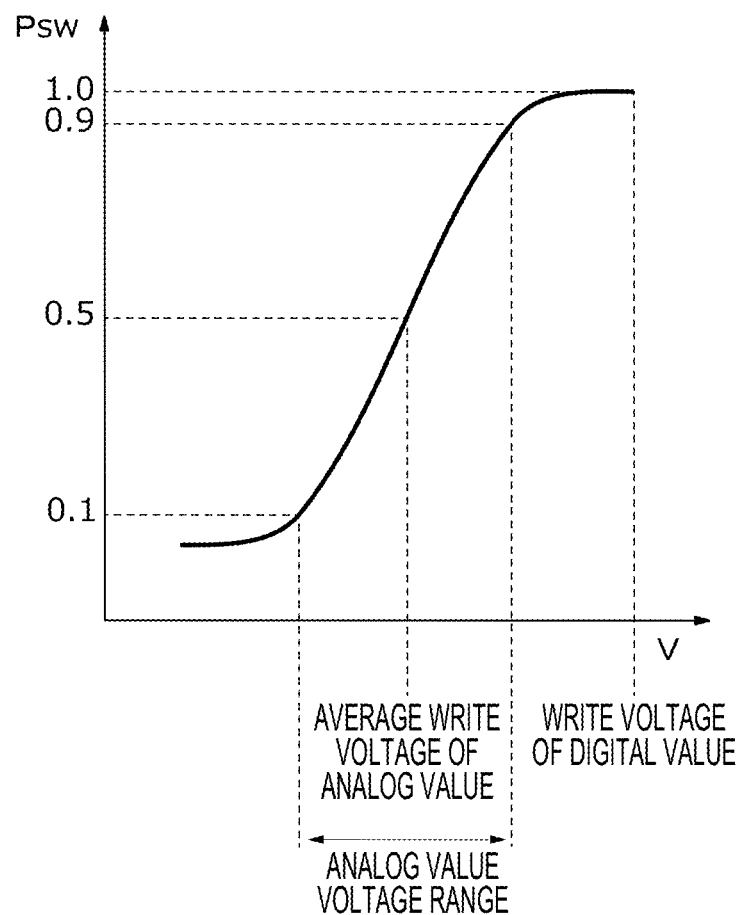
FIG. 17 is a graph in which the case of writing the weight as the analog value is compared with the case of writing the weight as the digital value of the second example.

FIG. 17 is a graph in which the case of writing the weight as the analog value is compared with the case of writing the weight as the digital value of the second example. FIG. 17 illustrates an example in which the weight is written to the memory cell 16 by controlling the voltage value of the write voltage. An average write voltage in the case of writing the weight with the analog value is 0.5 V, but a write voltage in the case of writing the weight with the digital value of the second example has a voltage value that is 1.6 times or more of 0.5 V. This is because an operating point in the case of writing the weight as the digital value of the second example is a write voltage when a reversal probability becomes 1. In this manner, since the write voltage can be lowered on average in the case of writing the weight as the analog value, the write resistance is improved and the redundant circuit can be reduced.

The signal processing network using the full-connect type Hopfield model has been exemplified as above, but a weight in a deep neural network can also be stored in the memory cell area by the above-described technique. In the deep neural network, product-sum calculation using the weight is performed.

Figure 18:
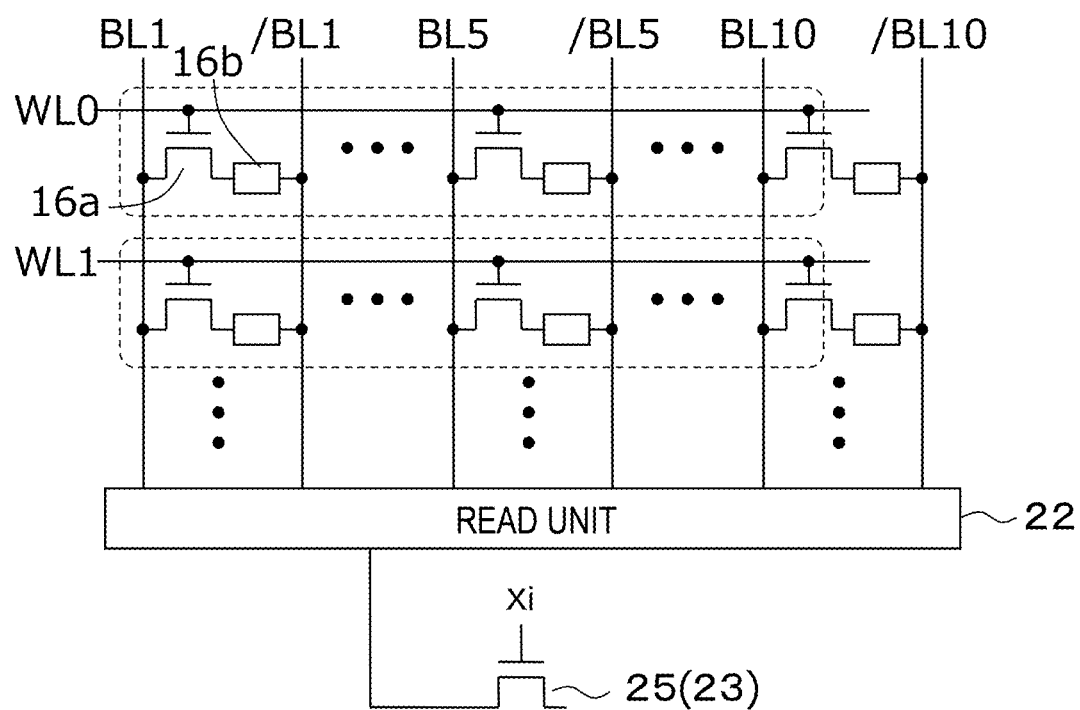
FIG. 18 is a diagram illustrating an example of a configuration of a product-sum calculation unit 23 that performs product-sum calculation.

FIG. 18 is a diagram illustrating an example of a configuration of the product-sum calculation unit 23 that performs the product-sum calculation. FIG. 18 illustrates an example in which, for example, ten memory cells 16 are arranged in a column direction and weights are represented by ten gradations. The number of synapses in a word line direction in FIG. 18 is set to 40, for example. When a weight of a specific synapse is read, the weight Wi thereof is input to a drain (or a source) of a transistor 25, and a gate voltage of this transistor 25 is denoted by Xi. The gate voltage Xi is a binary digital value. As a result, a value Wi*Xi obtained by multiplying the weight Wi and Xi is output from the source (or the drain) of the transistor 25. Incidentally, the single transistor 25 may be provided when a weight to be input to the drain (or the source) of the transistor 25 is an analog value, but a configuration in which a D/A converter that converts the read weights of 10 gradations into analog values is provided on a front stage side of the transistor 25, or the like is conceivable. On the other hand, when a weight to be input to the drain (or the source) of the transistor 25 is a digital value, the D/A converter is unnecessary, but a configuration of providing the transistors 25 corresponding to the number of gradations of weights, or the like conceivable.

A reading method of the read unit 22 that reads a weight stored in a memory cell area is arbitrary, and may uses, for example, a system of using the sense amplifier 19 or the current sum circuit. In the case of the system of using the sense amplifier 19, a switch circuit (not illustrated) may be provided between each bit line in the memory cell area and the sense amplifier 19, and bit lines to be read are successively switched by turning on/off the switch circuit. Alternatively, a plurality of the sense amplifiers 19 may be provided in a direction in which the bit lines are arrayed, and the respective sense amplifiers 19 may perform the read operation in parallel.

Figure 19:
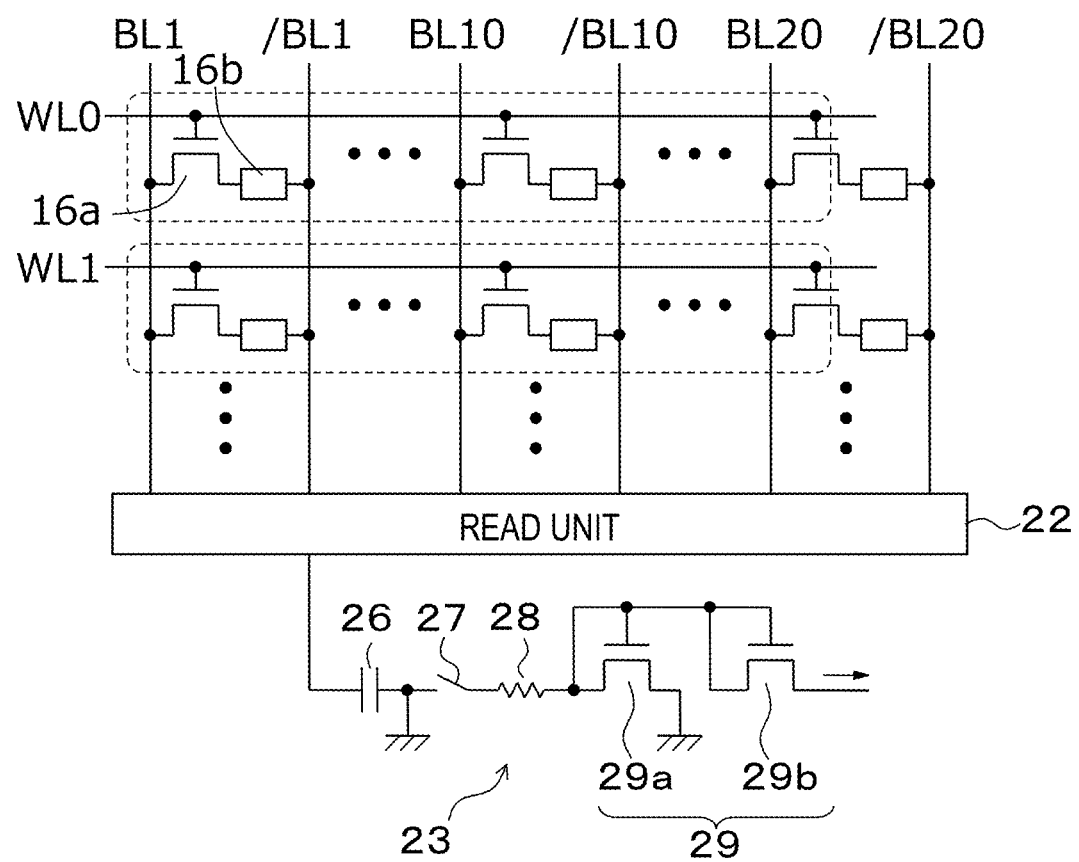
FIG. 19 is a diagram illustrating a reading system using a capacitor 26 and a current mirror circuit 29.

FIG. 19 is a diagram illustrating a reading system using a capacitor 26 and a current mirror circuit 29. The capacitor 26 of FIG. 19 accumulates charges according to data read sequentially from the respective bit lines. A switch circuit 27, a resistor 28, and the current mirror circuit 29 are connected to a ground side of the capacitor 26. The switch circuit 27 is turned on in a state where the charge accumulation of the capacitor 26 is completed. As a result, a current corresponding to the accumulated charge of the capacitor 26 flows to the current mirror circuit 29 via the resistor. The current mirror circuit 29 has a pair of transistors 29a and 29b, and current amplification can be performed by changing sizes of these transistors 29a and 29b. In addition, it is possible to omit the D/A converter since the capacitor 26 practically performs a D/A conversion operation. In this manner, it is possible to improve the power efficiency and area efficiency according to the reading system of FIG. 19.

Figure 20:
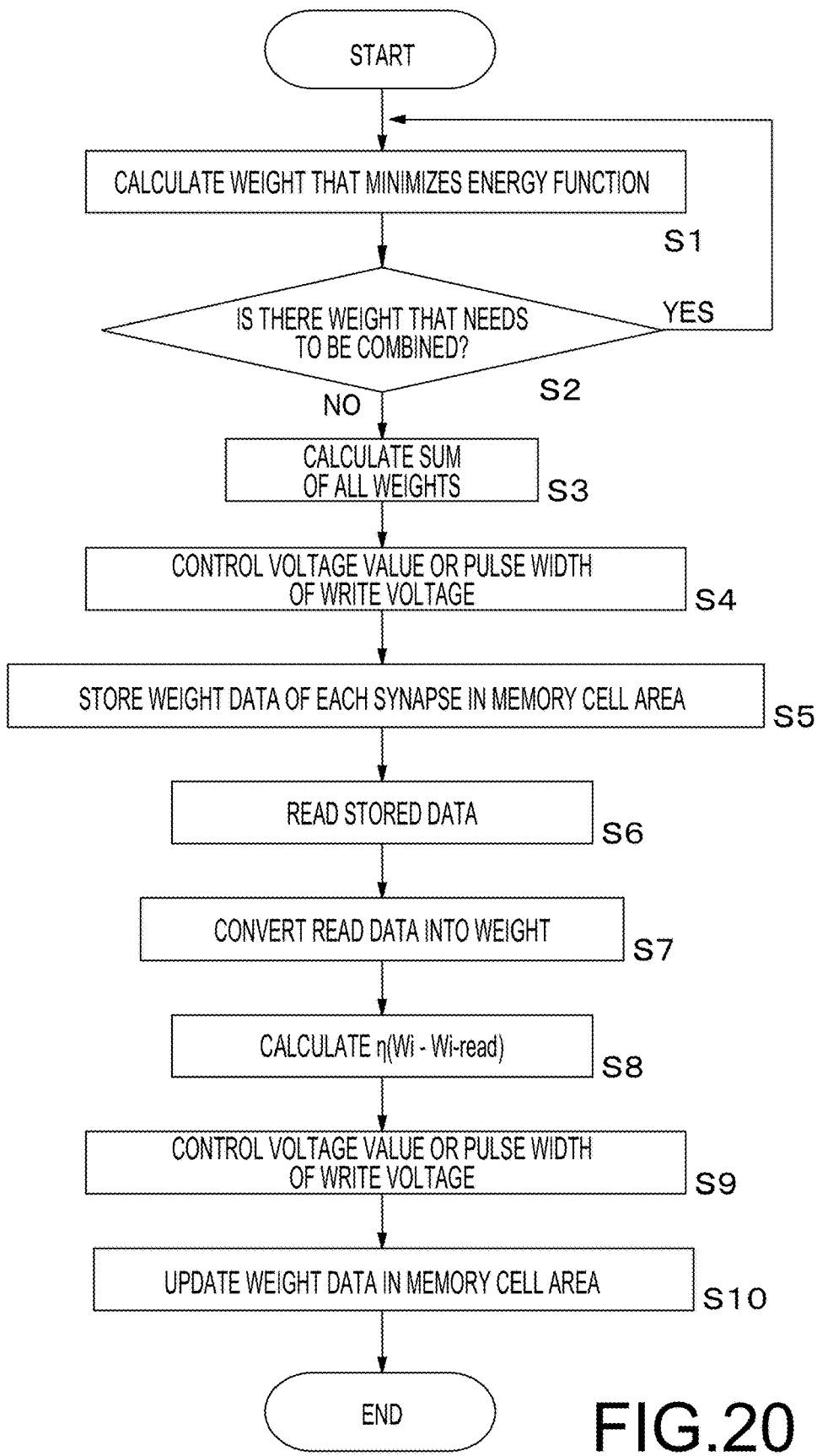
FIG. 20 is a flowchart illustrating an example of a processing procedure of the signal processing system 1.

FIG. 20 is a flowchart illustrating an example of a processing procedure of the signal processing system 1 when weights in the full-connect type network such as the Hopfield model are stored in a memory cell area.

First, for example, a weight that minimizes the energy function illustrated in Formula (1) is calculated (Step S1). Next, whether there is another weight that needs to be combined is determined (Step S2). When there is another weight, the processes of Steps S1 to S2 are repeated.

When the process of Step S1 is completed regarding all the weights, a sum of all the weights is calculated (Step S3). Next, at least one of the voltage value and the pulse width of the write voltage is controlled in accordance with to the calculated sum of the weights (Step S4).

Next, the weight of each synapse is written in the memory cell area (Step S5). For example, in the case of writing the weight as the analog value, the write voltage controlled in Step S4 is supplied to all bit lines in the memory cell area to simultaneously drive the respective bit lines before and after driving the word line. On the other hand, in the case of writing the weight as the digital value, the write voltage controlled in Step S4 is supplied to all bit lines used to write the digital value to drive these bit lines before and after driving the word line.

When the storage of the weight in the memory cell area is completed, next, the weights stored in the memory cell area are sequentially read (Step S6). At this time, the word lines corresponding to the synapses are sequentially driven to read the data of all the memory cells 16 in the bit line direction in a state where all the bit lines are pre-charged to a predetermined voltage.

Next, the read data is converted into a weight (Step S7). Next, a difference between the weight Wi before being stored in the memory cell area and the read weight Wi-read is calculated, and the difference is multiplied by the update coefficient η (Step S8). Then, at least one of the voltage value and the pulse width of the write voltage is controlled in accordance with the value calculated in Step S8 (Step S9), this write voltage is supplied to each bit line to update weight data in the memory cell area (Step S10).

Incidentally, when writing the weight to the memory cell area, the write voltage in accordance with the weight may be supplied to the bit line after first driving the word line, or the word line may be driven after supplying the write voltage in accordance with the weight to the bit line.

Figure 21:
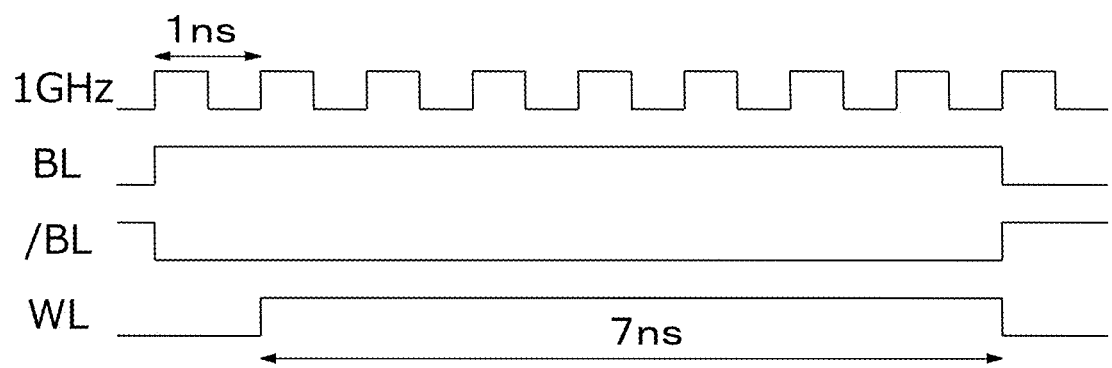
FIG. 21 is an operation timing chart when performing processes of Steps S5 and S6 in FIG. 20.

FIG. 21 is an operation timing chart when performing the processes of Steps S5 and S6 in FIG. 20. FIG. 21 illustrates an example in which a driving period of the word line is set to 7 ns. FIG. 21 illustrates an example in which the word line is driven after supplying the write voltage or a pre-charge voltage to the bit line in both Steps S5 and S6. The pre-charge voltage of the bit line is the same for all the bit lines of all the memory cells 16 connected to the word line. Contrary to FIG. 21, the write voltage or the pre-charge voltage may be supplied to the bit line after driving the word line. Contrary to FIG. 21, the driving may be performed with the bit line voltage after driving with the word line voltage.

Figure 22:
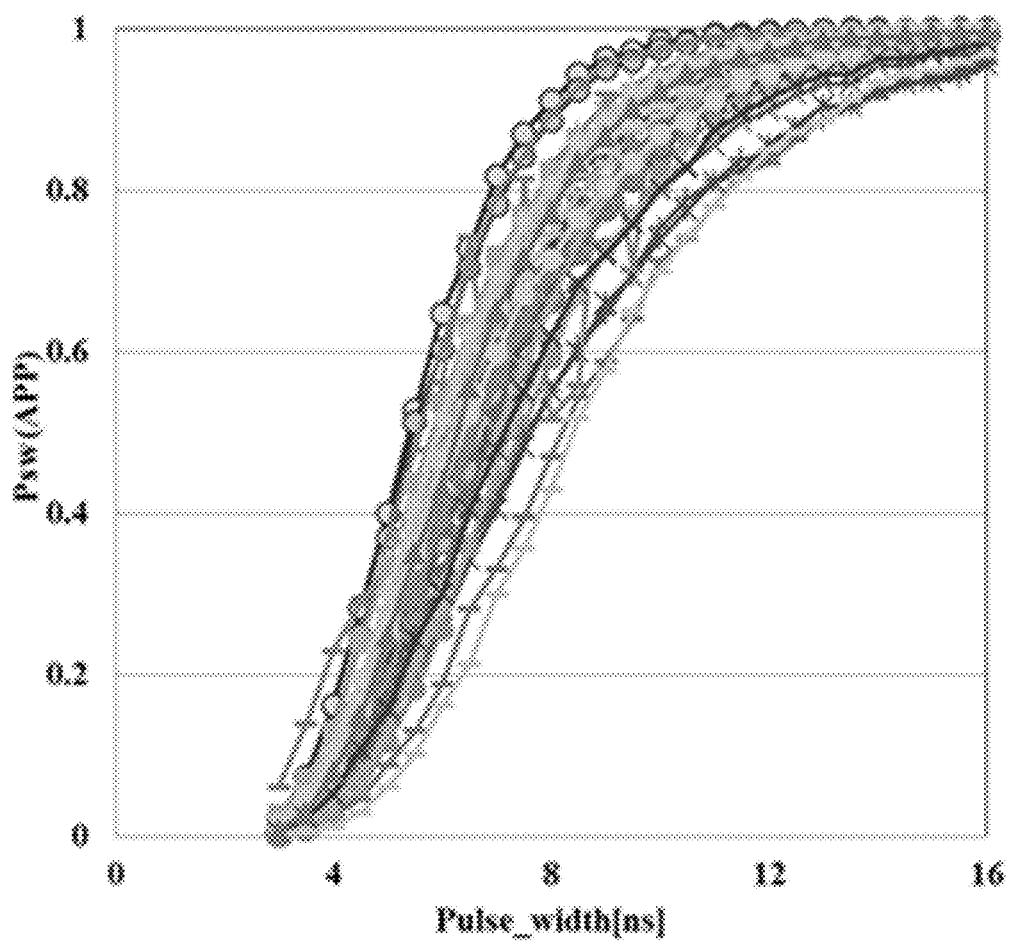
FIG. 22 is a graph of experimental results illustrating a state where reversal probabilities change.

As described above, the voltage value of the write voltage may be controlled or the pulse width of the write voltage may be controlled in accordance with the weight value. FIG. 22 is a graph of experimental results illustrating a state where reversal probabilities change when the write voltage is fixed at 0.45 V and the pulse width is changed within a range of 3 to 16 ns. In FIG. 22, the horizontal axis indicates the pulse width [ns] of the write voltage and the vertical axis indicates the reversal probability Psw. Although a plurality of curves is drawn in FIG. 22, the respective curves represent 36 synapses. Each synapse is distributed reflecting a variation of the MTJ elements to be formed. It is understood that the reversal probability change depending on the pulse width as illustrated in the FIG. 22. Accordingly, the pulse width may be controlled instead of controlling the voltage value of the write voltage. Alternatively, both the voltage value and the pulse width of the write voltage may be controlled.

In the system of reading the data from the memory cell area in Step S6 of FIG. 20, the data of all the bit lines may be simultaneously read, charges according to the read data may be accumulated in the capacitor and read by the current mirror circuit as described above. Alternatively, the data of all the bit lines may be simultaneously read and read using a circuit that integrates a sum of currents. Alternatively, a switch group may be provided between each bit line and the sense amplifier 19, and the data of the respective bit lines may be sequentially read by sequentially switching the switch group and sensed by the sense amplifier 19.

Figure 23:
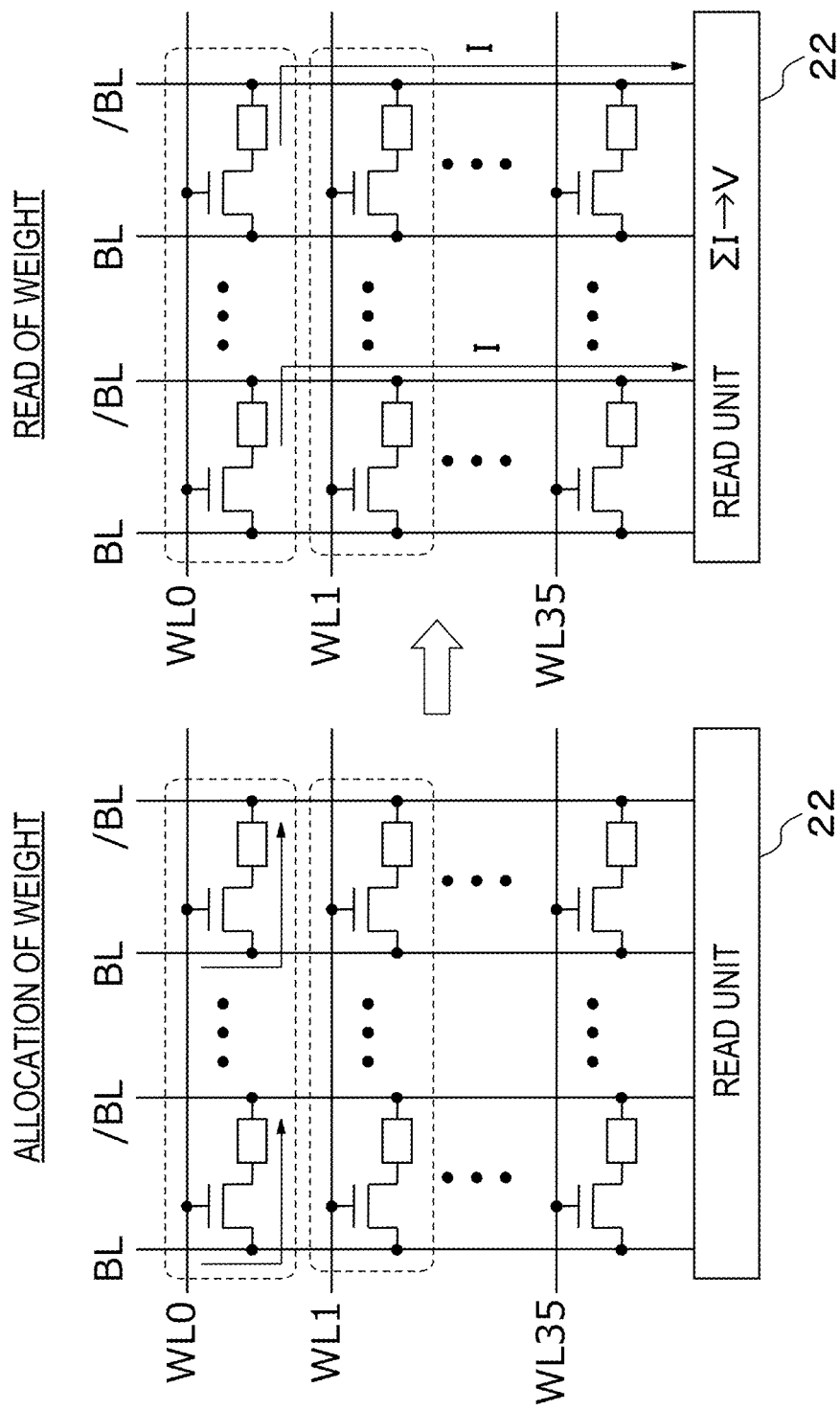
FIG. 23 is a diagram for describing a weight updating process in Step S10 of FIG. 20.

FIG. 23 is a diagram for describing the weight updating process in Step S10 of FIG. 20. At least one of the voltage value and the pulse width of the write voltage that needs to be supplied to the bit line is controlled based on the updated value which has been calculated in Step S8 of FIG. 20. Then, a predetermined voltage is supplied to the word line to drive the word line in a state where all the bit lines pre-charged by the controlled write voltage, and the data is written to all the memory cells 16 connected to this word line. This corresponds to the allocation of weights in FIG. 23. Next, in a state where all the bit lines are pre-charged, the corresponding word line is set to a predetermined read voltage to read the data stored in the memory cell 16. FIG. 23 illustrates a technique of obtaining a sum of currents flowing through each bit line by the sense amplifier 19 and converting the obtained sum into a voltage to obtain a gradation of a weight as an analog value.

Figure 24:
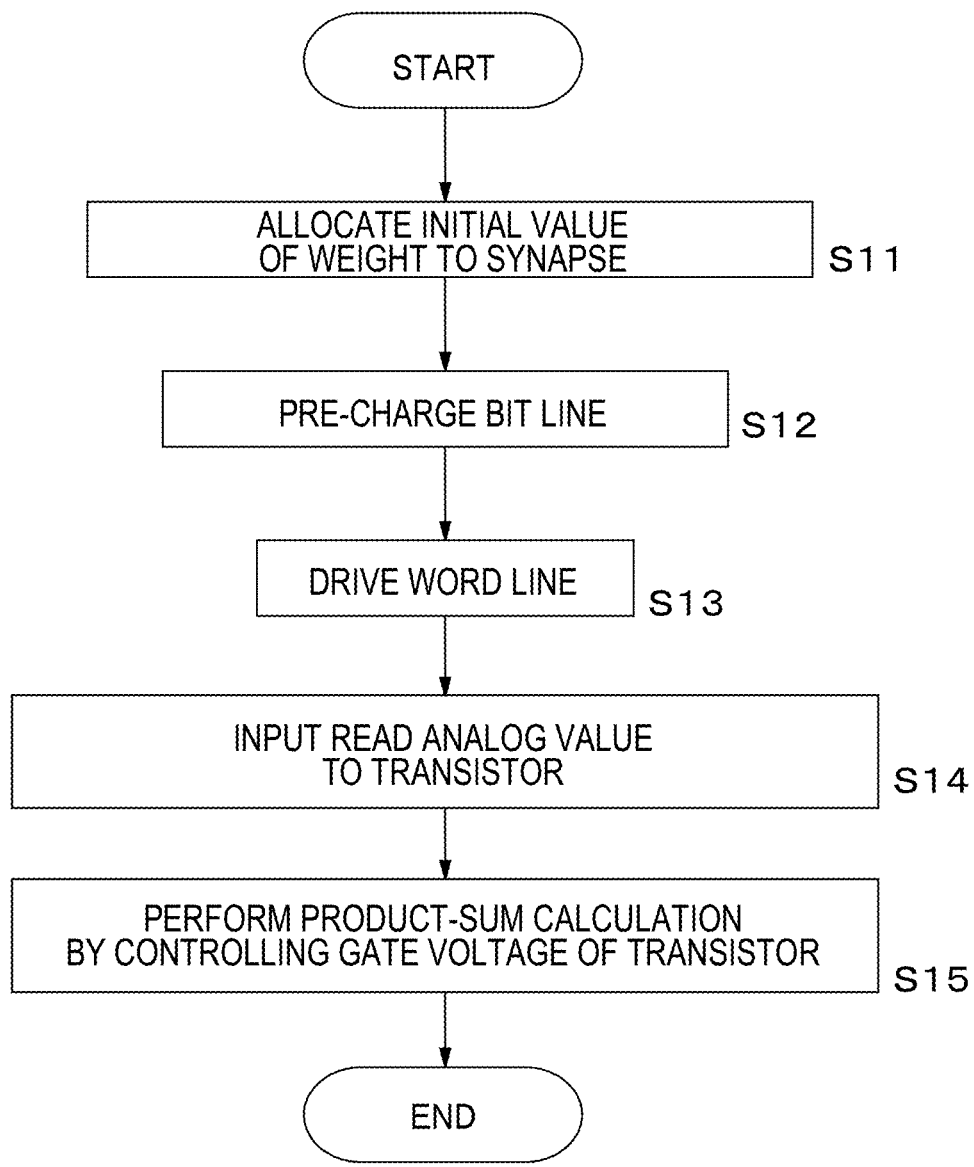
FIG. 24 is a flowchart illustrating an example of a processing procedure of non-learning time.

The deep neural network has a stage of causing a synapse to learn a weight so as to be capable of performing appropriate inference, association, and the like and a stage of performing the inference, the association, and the like, that is, non-learning time. FIG. 24 is a flowchart illustrating an example of a processing procedure at the time of non-learning, and FIG. 25 is a circuit diagram illustrating data flow at the non-learning time.

First, an initial value of a weight is allocated to a synapse (Step S11). Here, the initial value may be a random value. In addition, the initial value may be a weight derived, in advance, using training data as in learning with teacher data.

Next, the bit line is pre-charged (Step S12), and a specific word line is set to a predetermined read voltage to drive the word line (Step S13). As a result, data corresponding to the weight stored in the memory cell area is finally read as an analog voltage value via the sense amplifier 19, the current sum circuit, or the like.

Figure 25:
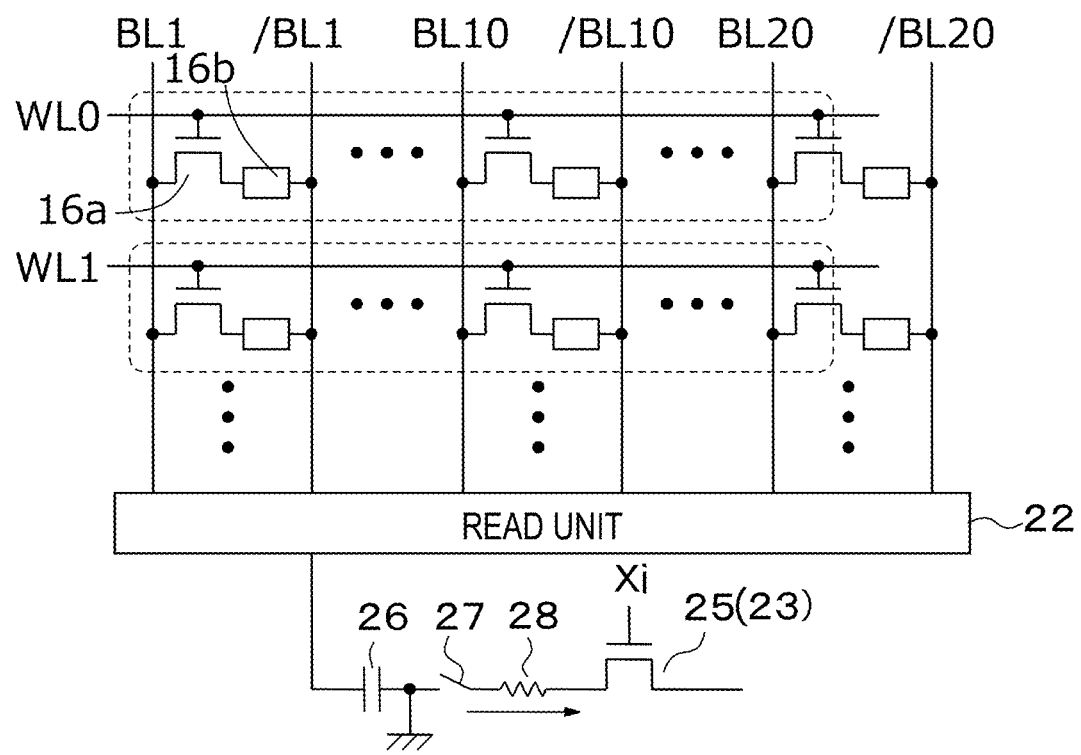
FIG. 25 is a circuit diagram illustrating data flow at the non-learning time.

As illustrated in FIG. 25, the read analog voltage value is input to the drain (or the source) of the transistor in the product-sum calculation unit 23 (Step S14). FIG. 25 illustrates an example in which a charge according to the read data is temporarily stored in the capacitor 26 and the analog voltage value across both ends of the capacitor 26 is input to the drain (or the source) of the transistor 25.

Incidentally, the data read from the memory cell area may be directly input to the drain (or the source) of the transistor without providing the capacitor 26 and the resistor.

Next, a result of performing the product-sum calculation WiXi of the weight and the gate voltage of the transistor by setting the gate voltage Xi of the transistor to 0 or 1, or by setting the gate voltage to the analog gradation voltage is obtained from the source (or drain) of the transistor (Step S15).

Figure 26:
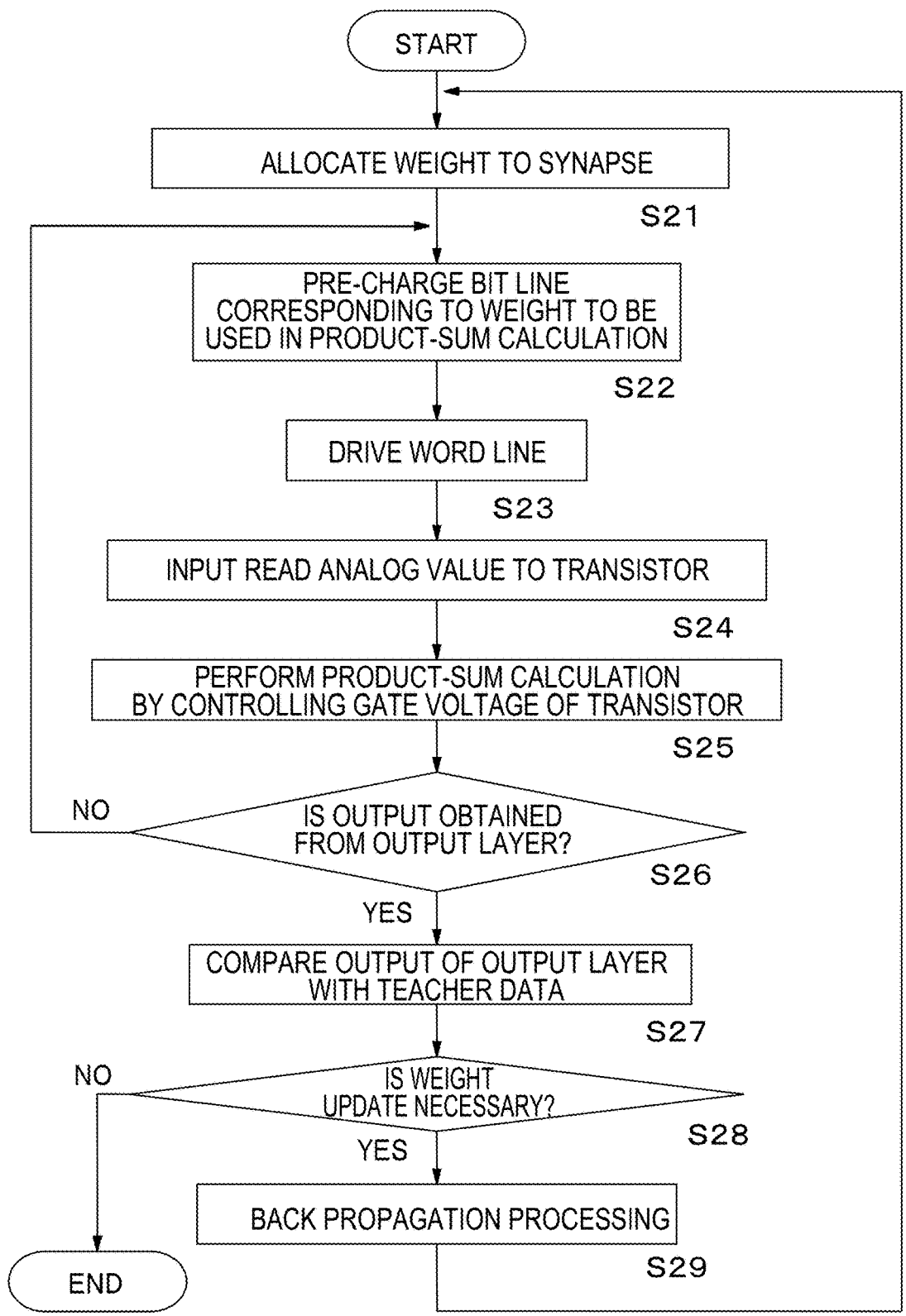
FIG. 26 is a flowchart illustrating an example of a processing procedure of a deep neural network learning process.

FIG. 26 is a flowchart illustrating an example of a processing procedure of a learning process of the deep neural network. A process of applying the synapse on a signal given to a neuron as an input and obtaining an output may be referred to as a forward process. The forward process includes the case of applying a weight as an analog value and the case of applying a weight as a digital value. When the weight is applied as the digital value, an output from the current sum circuit or the sense amplifier 19 circuit is binarized. Steps S21 to S25 of FIG. 26 are basically the same as Steps S11 to S15 of FIG. 24. In Step S21, for example, weights in all signal paths from an input layer to an output layer of the deep neural network are stored in the nonvolatile memory 3 as initial values. Processes of Steps S22 to S25 are sequentially repeated for each signal processing path from the input layer to the output layer. For example, in Steps S24 and S25, product sum calculation is performed for each signal processing path using the weights read from the nonvolatile memory 3. When the product-sum calculation process ends in Step S25, whether an output is obtained from the output layer is determined (Step S26). The processes from S22 to S25 are repeated, for example, when there is a plurality of intermediate layers (hidden layers). In addition, when no output has been obtained from the output layer, the processing returns to Step S22 and the processes of Steps S22 to S26 are repeated for the next signal processing path.

When it is determined that the output has been obtained from the output layer in Step S26, the output of the output layer is compared with teacher data (Step S27). Whether weight update is necessary is determined based on a result of the comparison (Step S28). Here, it is determined that the weight update is necessary when the output of the output layer and the teacher data are greatly different from each other. When it is determined that the weight update is necessary, processing such as back propagation is executed to perform calculation relating to the weight update along a reversed signal path from the output layer to the input layer, thereby updating the weight (Step S29). Thereafter, the processes of Step S21 and the subsequent steps are repeated. On the other hand, when it is determined that the weight update is unnecessary in Step S28, it is determined that the output of the output layer is valid to end the processing of the flowchart of FIG. 26. When updating the weight in Step S29, either the analog value or the digital value may be stored in the memory cell area as described above.

As illustrated in FIG. 17, each of the case of storing the weight as the analog values and the case of storing the weight as the digital value has advantages and disadvantages. Therefore, as illustrated in FIG. 27, an area to store the weight as the analog value and an area to store the weight as the digital value may be provided in the memory cell area.

Figure 27:
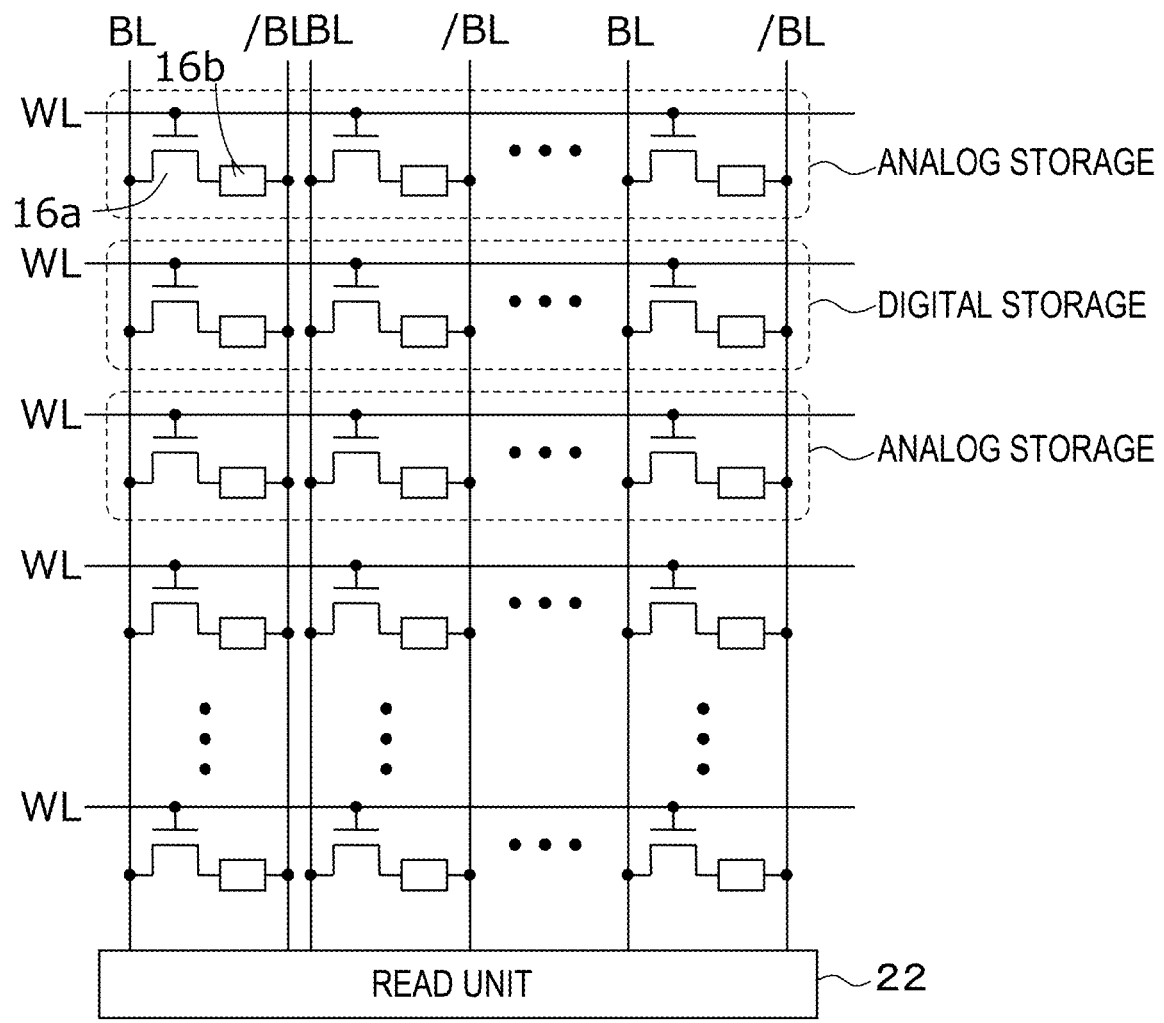
FIG. 27 is a diagram illustrating an example in which an area to store a weight as an analog value and an area to store a weight as a digital value are provided in a memory cell area.

In the example of FIG. 27, whether to store the weight as the analog value or the digital value is differentiated for each word line. As illustrated in FIG. 15A, the weight can be stored only by 4 bits assuming that the weight is represented by the fourth power of two in the case of the digital value of the first example. In addition, the weight can be stored by 16 bits of 0000000000000001 to 1111111111111111 assuming that the weight is represented by the fourth power of two in the case of the digital value of the second example as illustrated in FIG. 15B. Since 20 bit lines are required in the case of storing the weight as the analog value as described above, it is possible to reduce the number of bit lines by storing the weight as the digital value. When reading data from the memory cell area stored using the digital value, it is possible to reduce the power consumption by reading only the bit line storing the data.

Figure 28:
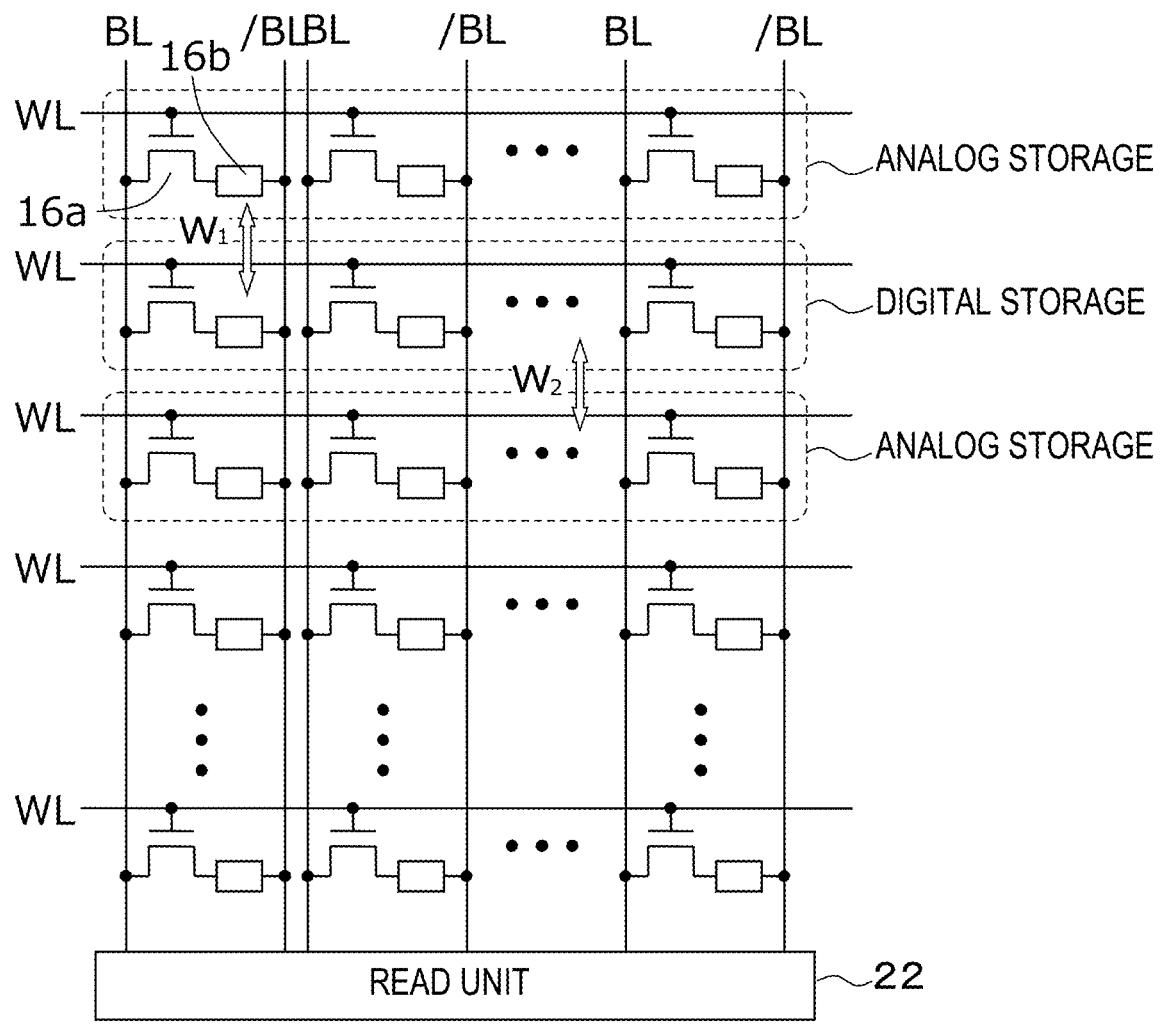
FIG. 28 is a view illustrating an example in which data of two weights that have been stored as analog values are stored as digital values in one word line.

Since the weight of 16 gradations can be stored using only 4 bits in the case of the digital value of the first example, it is possible to store information on two weights stored as the analog values in, for example, one word line to which the twenty memory cells 16 are connected. FIG. 28 illustrates an example in which word lines in which different weights W1 and W2 are stored as analog values are arranged on both sides of a word line storing the weight as the digital value of the first example, and data of these two weights W1 and W2, stored as the analog values, are stored as digital values in one word line.

In this manner, it is possible to reduce the memory cell area to be used for storage by storing the weights as the digital values. Accordingly, it is also possible to store data of a plurality of weights in the memory cell area connected to one word line.

In addition, the case of storing the weight as the digital value includes a case where a weight of an analog gradation is directly represented and stored in digital and a case where a weight of an analog gradation is binarized to 0 or 1 or is ternarized to −1. 0, or +1. As a result, the number of bits can be further reduced.

Incidentally, as illustrated in FIG. 17, it is necessary to take a measure to lower an error occurrence probability in the case of storing the weight as the digital value as compared with the case of storing the weight as the analog value. In particular, a value of the weight may be likely to be significantly different if even 1 bit is erroneous in the case of the digital value of the first example. Accordingly, it is desirable to store the weight as the analog value in the weight learning stage. Meanwhile, in the non-learning stage in which the weight is read and used for the product-sum calculation after end of the weight learning stage, the power consumption can be reduced as the number of bit lines from which the weight is read is smaller. Accordingly, the data of the weight stored in the analog value may be converted into a digital value and stored in the memory cell area connected to another word line at the stage where the weight learning stage has ended, and the digital value of the weight may be read and used for the non-learning processing.

Figure 29:
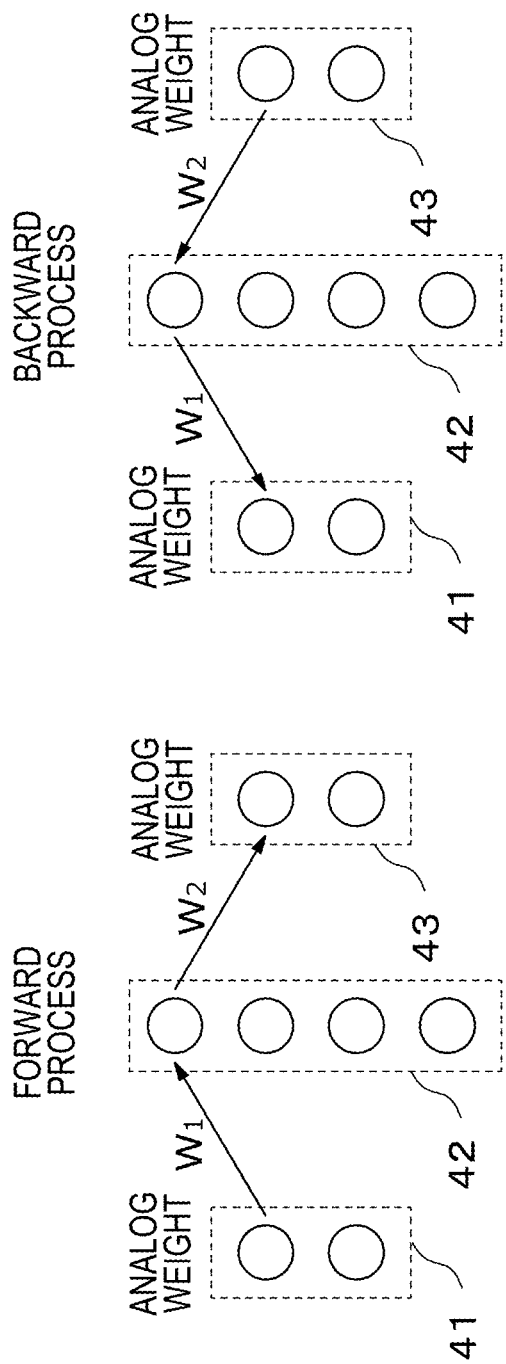
FIG. 29 is a view illustrating an example in which weights as analog values are used for both forward process and backward process.

For example, FIG. 29 illustrates an example in which a weight of an analog value is used for both a forward process and a backward process at the time of learning the weight in a neural network. A weight from an input layer 41 of the neural network to a hidden layer 42 is stored as an analog value in a memory cell area connected to a word line WL1 in FIG. 27, for example. In addition, a weight from the hidden layer 42 to an output layer 43 is stored as an analog value in a memory cell area connected to a word line WL3 in FIG. 27. The weights are stored as the analog values in the word lines WL1 and WL3 in FIG. 27 in both the forward process and the backward process at the learning stage.

Figure 30:
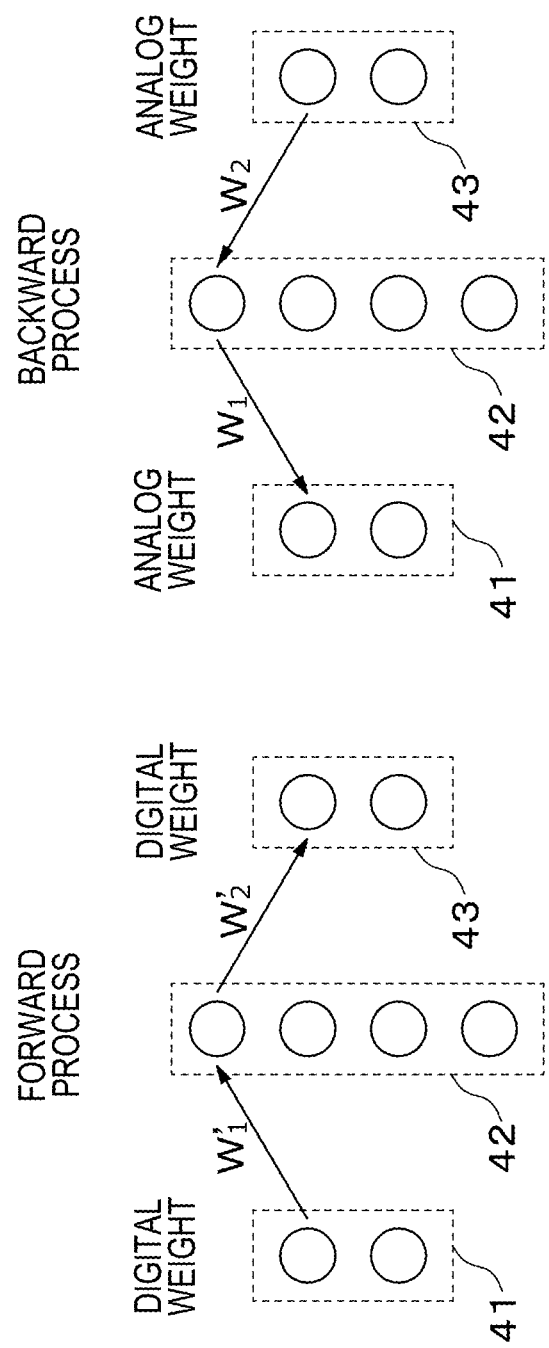
FIG. 30 is a view illustrating an example in which weights are stored as digital values in the forward process and weights are stored as analog values in the backward process.

On the other hand, FIG. 30 illustrates an example in which a weight is stored as a digital value in the forward process at the time of learning the weight in the neural network, and a weight is stored as an analog value in the backward process. When represented as the analog value, the weight is expressed in 16 gradations, for example. On the other hand, when represented as the digital value, the weight is represented by, for example, two gradations (1 and 0, or 1 and −1) or represented by three gradations (1, 0, and −1). In this manner, a process of thinning the analog value is performed when converting the analog value of the weight to the digital value. In the neural network, it is known that the precision does not decrease so much even if each interlayer weight is thinned out or not. On the other hand, it is difficult to obtain correct information in some cases at the time of updating the weight if the update is performed with the thinned weight. Therefore, the digital value of the weight is used in the forward process and the analog value of the weight is used in the backward process in FIG. 30. As a result, it is possible to reduce the number of bits that needs to be read from the memory cell area and to reduce the power consumption in the forward process of the neural network.

Figure 31A:
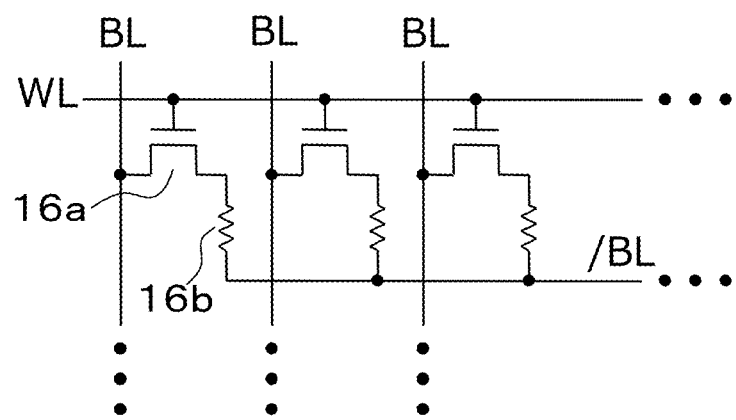
FIG. 31A is a diagram in which a bit line bar is set to a common potential.

In the memory cell area used in the present embodiment, a direction in which the word line extends is set as a row direction, and a direction in which the bit line extends is set as a column direction. In addition, each bit line has a pair of bit lines whose logic is reversed from each other. However, one of the pair of bit lines (hereinafter referred to as a bit line bar/BL) may be set to a common potential (for example, a ground potential) as illustrated in FIG. 31A. Since different bit lines are connected to each of the memory cells 16 arranged in the row direction even if the bit line bars have the common potential, data corresponding to a potential of each bit line is stored in each of the memory cells 16. When the bit line bars/BL are set to the common potential this manner, the number of wirings can be reduced, the area efficiency is improved, and a wiring delay can be also reduced.

Figure 31B:
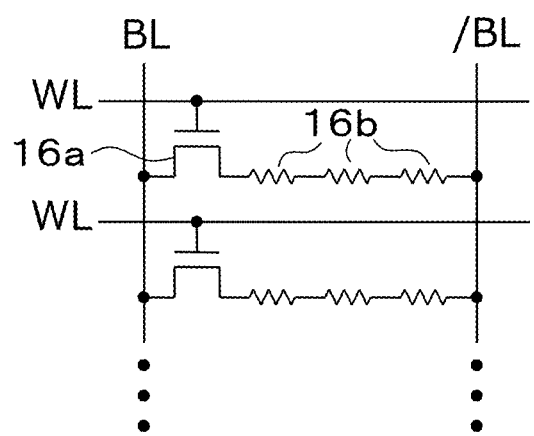
FIG. 31B is a diagram in which a plurality of memory cells 16 is connected in series between a bit line and a bit line bar.

In addition, as illustrated in FIG. 31B, a plurality of memory cells 16 may be connected in series between a bit line BL and the bit line bar/BL. In the case of FIG. 31B, three MTJ elements 16b are connected in series, and a state thereof can be stored using the number of MTJ elements whose logic has been reversed among these MTJ elements 16b. Since the number of bit lines BL as well as the bit line bars/BL can be reduced in the case of FIG. 31B, the area efficiency is improved as compared with the case of FIG. 31A.

Figure 32A:
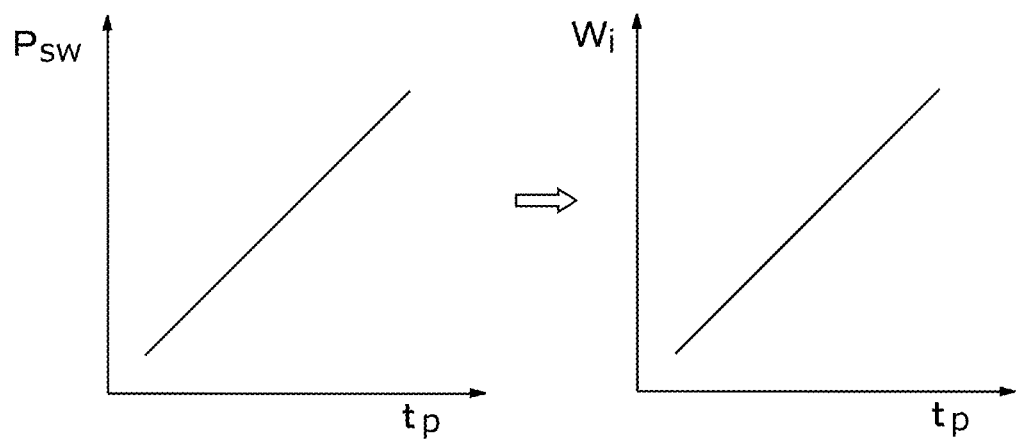
FIG. 32A is a graph illustrating characteristics of a memory cell when writing to the memory cell is performed by controlling a pulse width.

FIG. 32A is a graph illustrating characteristics of the memory cell 16 when writing to the memory cell 16 is performed by controlling the pulse width while setting the voltage value of the write voltage to be constant. As illustrated in FIG. 32A, it is possible to change the reversal probability Psw in a substantially linear manner by changing a pulse width tp of the write voltage. When controlling the pulse width at the time of write, for example, a driving time of a bit line connected to the memory cell 16 that needs to be subjected to writing is changed in a state where the word line is driven with a predetermined voltage so that the weight to be stored in the memory cell 16 can be changed. In this case, the controllability is improved since the weight to be stored can be controlled in a clock cycle for driving the bit line. In addition, since the pulse width of the write voltage and the reversal probability have a substantially linear relationship, it is easy to perform the process of converting the reversal probability into the weight by the weight conversion unit 33.

Figure 32B:
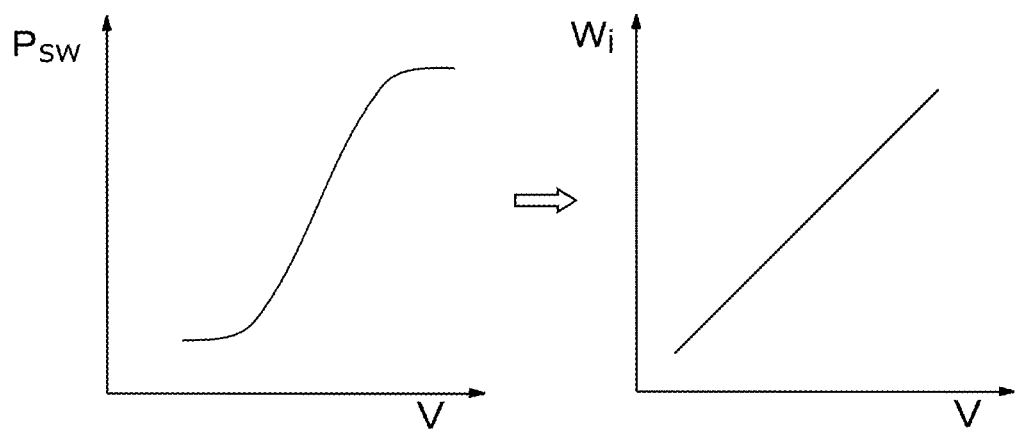
FIG. 32B is a graph illustrating characteristics of a memory cell when writing to the memory cell is performed by controlling a voltage value.

On the other hand, FIG. 32B is a graph illustrating characteristics of the memory cell 16 when writing to the memory cell 16 is performed by controlling the voltage value while setting the pulse width of the write voltage to be constant. When the voltage value of the write voltage is controlled according to the weight, the reversal probability Psw changes non-linearly. Accordingly, it is also necessary for the weight conversion unit 33 to perform non-linear processing to convert the reversal probability Psw into the weight Wi.

Figure 33:
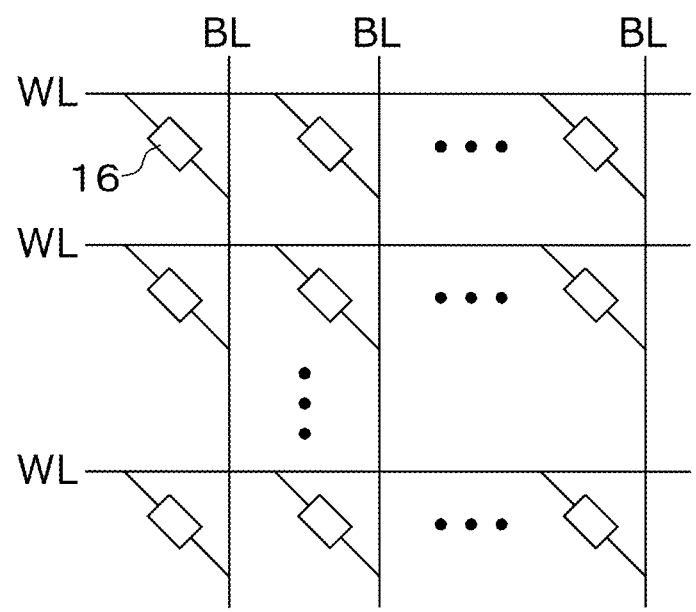
FIG. 33 is a diagram illustrating a memory cell array having a crossbar configuration.

The memory cell array 11 in which the weights are stored may have a crossbar configuration as illustrated in FIG. 33. In the memory cell array 11 of FIG. 33, each of the memory cells 16 is arranged near each intersection of word lines and bit lines. One weight is stored for each word line. There are a case where a resistance-change memory and a transistor are arranged between each word line and the bit line and a case where the resistance-change memory and a selector are arranged therebetween, either of which may be adopted. In the crossbar configuration, a pulse width or a pulse potential of a pulse applied to the word line and the bit line corresponds to Xi. As a result, it is possible to perform the process of calculating a sum of products WiXi with a simple configuration.

Figure 34:
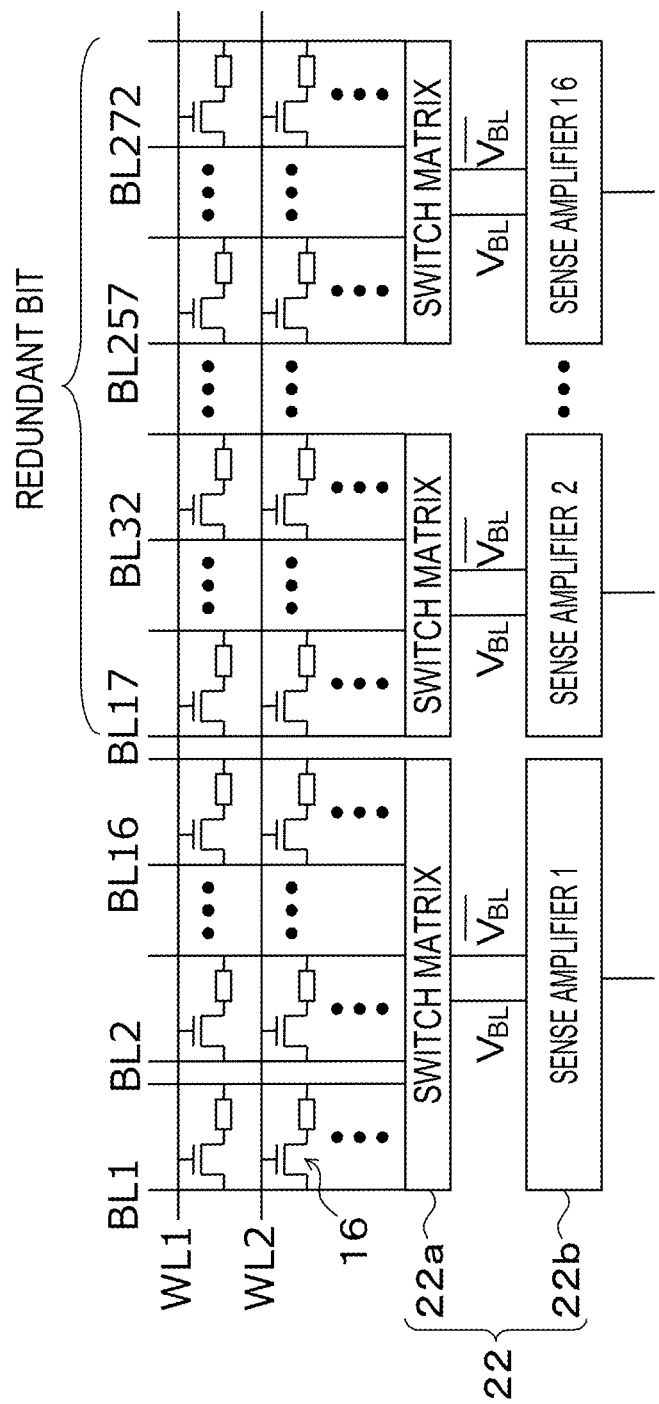
FIG. 34 is a diagram illustrating an example in which one synapse is stored using 16 bit lines connected to one word line.
Figure 35:
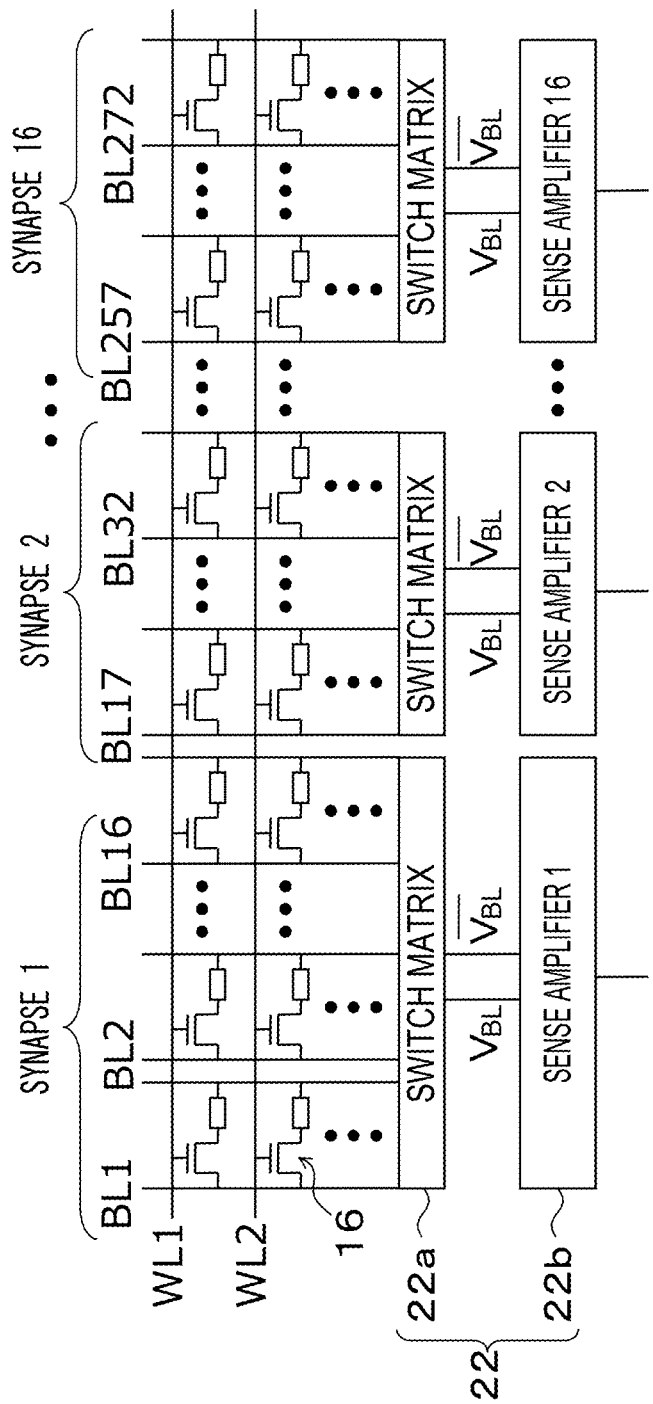
FIG. 35 is a diagram illustrating an example of storing a plurality of synapses.

The example in which one synapse (weight) is stored in a plurality of memory cells connected to one word line has been described in the above-described embodiment. In this example, however, it takes time to read the entire synapse when the number of synapses is large since different synapses are stored in the respective word lines. For example, as illustrated in FIG. 34, a case where one synapse is stored with 16 bit lines connected to one word line, and 36 synapses in total are stored is conceivable. Alternatively, as illustrated in FIG. 35, a case where one synapse is stored with 16 bit lines connected to one word line, and a plurality of synapses are stored in the same word line is conceivable. When the read unit 22 sequentially reads potentials of the respective bit lines with the sense amplifier system, the time of 50×16=800 ns is required to read one synapse assuming that it takes 50 ns to read one bit line and 10 ns to switch a bit line to be sensed. Since the word lines are sequentially driven, the time of 36×800 ns=28800 ns is required to read 36 synapses in the case of the array configuration of FIG. 34. Incidentally, FIGS. 34 and 35 illustrate an example in which the read unit 22 includes a plurality of sense amplifiers 22b and a plurality of switch matrices 22a.

Figure 36:
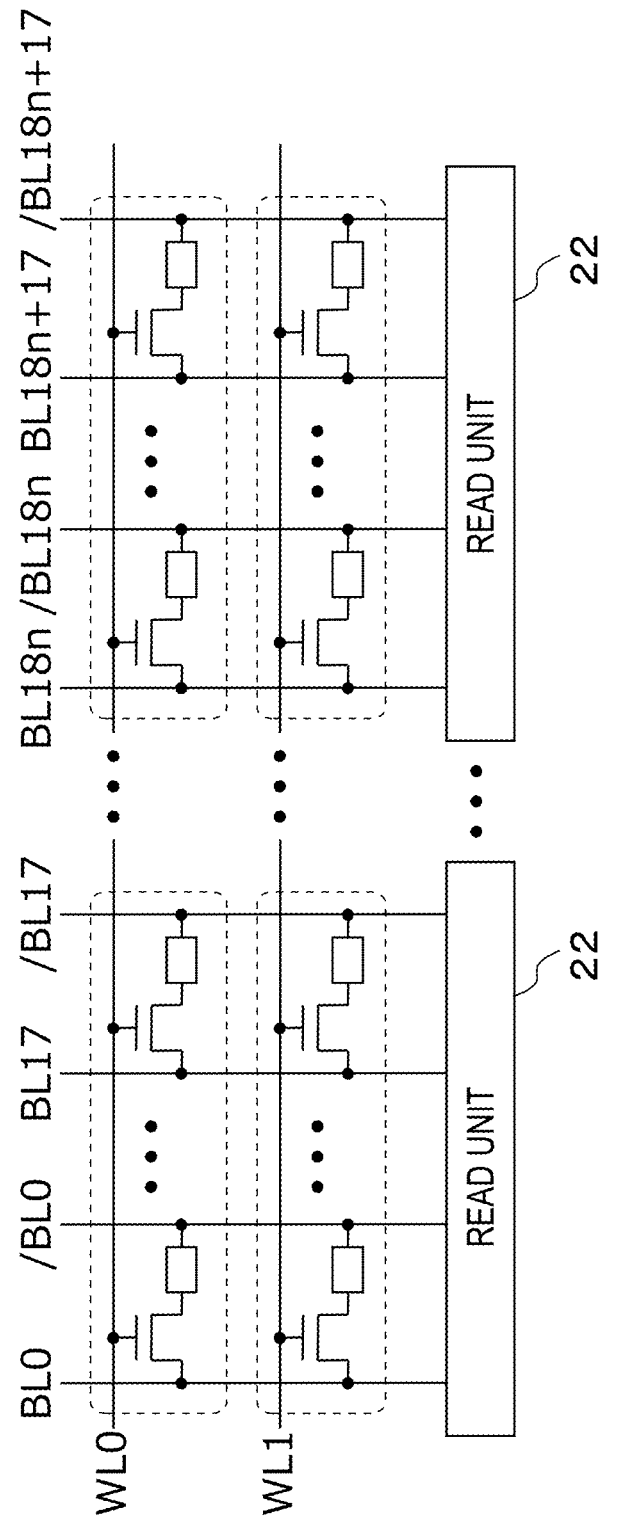
FIG. 36 is a diagram illustrating a memory cell area capable of storing a plurality of synapses in a plurality of memory cells connected to one word line.

A plurality of synapses may be stored in a plurality of memory cells connected to one word line as a technique of reducing the synapse reading time. FIG. 36 is a diagram illustrating the memory cell area capable of storing the plurality of synapses in the plurality of memory cells connected to one word line. A plurality of the read units 22 is provided in the extending direction of the word line. Each of the read units 22 sequentially reads the potentials of the respective bit lines using the sense amplifier system. The number of the read units 22 is, for example, sixteen, and in this case, n=15 in FIG. 36. For example, 18 bit line pairs are connected to each of the read units 22. The 18 bit line pairs are connected to each of the read units 22 so as to correspond to the configuration of the above-described embodiment in which the weights of 16 gradations (36 weights in total) are stored in the memory cell area using the 36 word lines. In FIG. 36, it is possible to store the weights of 16 gradations (36 weights in total) using two word lines.

The sixteen read units 22 in FIG. 36 operate simultaneously, and each of the read units 22 sequentially reads the potentials of the eighteen bit lines. Accordingly, the 16 read units 22 simultaneously read the potentials of the total of 16 bit lines at a certain timing. Therefore, potentials of 16 bit lines which are simultaneously read at each timing represent one synapse (weight) in the example of FIG. 36. Specifically, one weight is stored in the memory cells connected to the 16 bit lines among every 18 bit lines which are simultaneously read by the respective read units 22. Since the 18 bit line pairs are connected to each of the read units 22, the potential of each of the bit lines is read 18 times, so that it is possible to read 18 weights in one word line. Since two word lines are connected in FIG. 36, it is possible to read data of a total of 36 weights having the 16 gradations.

Assuming that 50 ns are required to read one bit line, it takes time of 50 ns×18=900 ns to read the 18 weights connected to one word line. Accordingly, 900 ns×2=1800 ns are required to read the 36 weights, and it is possible to read the weight at a much higher speed than in the case of reading the weight stored in the memory cell area in FIG. 4.

In this manner, it is possible to store and read the plurality of (for example, 16) synapse (weight) data by driving one word line in the memory cell area of FIG. 36, and thus, it is possible to significantly reduce the number of word lines in the memory cell area storing the weight, and to read a large number of weights promptly.

The memory cell area configured to store the weight described above may be provided at least partially as in the memory cell array 11 of FIG. 34. Therefore, a part of the memory cell array 11 may be used as the memory cell area configured to store the weight, and the remaining memory cell areas may be used as storage areas to be used by a processor (not illustrated) for various purposes. In addition, a memory size of the memory cell area configured to store the weight may be changed if necessary by allowing the gradation of the weight to be changed.

Figure 37:
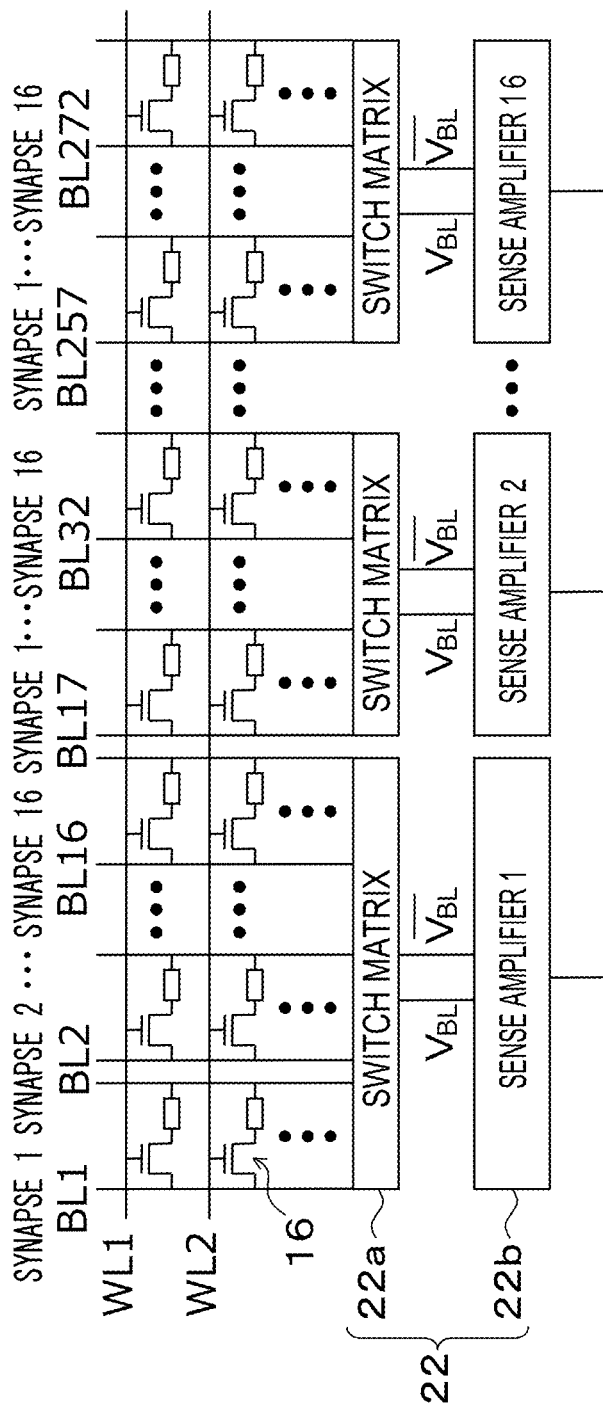
FIG. 37 is a diagram illustrating a first specific example in which weights of a plurality of synapse are included in one word line.

Although the 18 bit line pairs are connected to the single read unit 22 in FIG. 36, this is only an example, and the number of bit line pairs to be connected to one read unit 22 is arbitrary. In addition, only the two word lines are illustrated in FIG. 36, but the number of word lines is also arbitrary. FIG. 37 is a diagram illustrating a first specific example in which weights of a plurality of synapse are included in one word line. In FIG. 37, one sense amplifier 22b is connected for every 16 cells. That is, 16 bit line pairs are connected to one sense amplifier 22b. The switch matrix serves a role of switching bit lines and bit line bars connected to the sense amplifier 22b.

FIG. 37 illustrates an array configuration in which 16 cells are connected to one of the sense amplifiers 22b, and the sixteen sense amplifiers 22b are arranged, as an example. A bit line BL1, a bit line BL17, . . . , and a bit line BL257 are simultaneously pre-charged. Thereafter, when the word line WL1 is activated, a storage state of each cell is read simultaneously from sense amplifiers 1 to 16.

Figure 38:
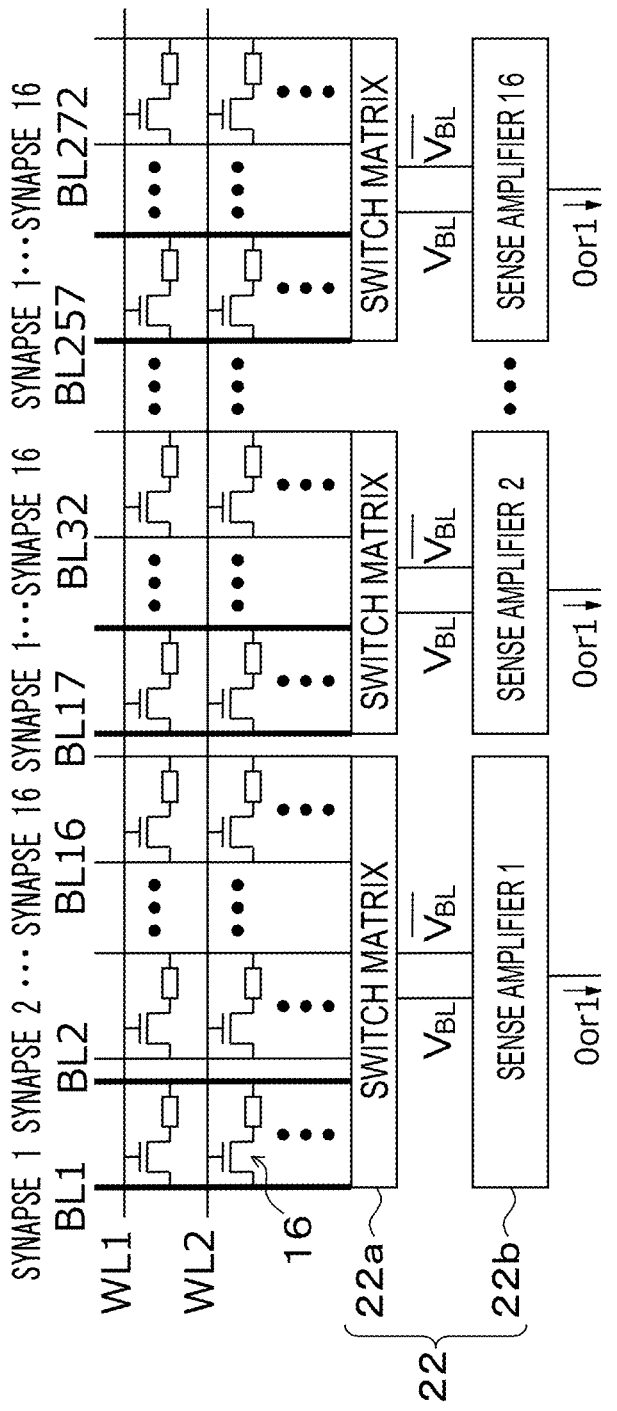
FIG. 38 is a diagram illustrating an example in which weights of one synapse are obtained by one-time reading operation.

Here, as illustrated in FIG. 38, it is possible to obtain weights of one synapse with one-time read operation assuming that memory cells connected to the bit line BL1, the bit line BL17, and the bit line BL257 serve gradations of weights of the same synapse. That is, the time of 50 ns is required to read one synapse. When the number of synapses is 36, it is possible to perform read for the time of 36×50=1800 ns. It is possible to perform the read at a much higher speed than in the case of reading the weight stored in the memory cell area of FIG. 34 or 35.

Figure 39:
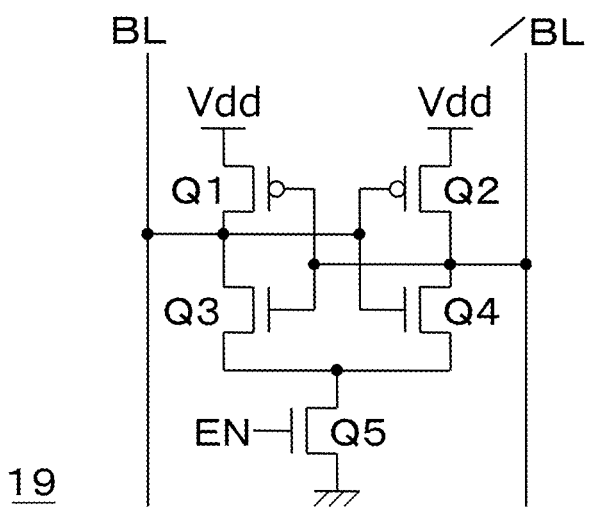
FIG. 39 is a diagram illustrating an example of a circuit configuration of a sense amplifier.

The sense amplifier 22b may have a configuration as illustrated in FIG. 39, for example. The sense amplifier 22b in FIG. 39 includes PMOS transistors Q1 and Q2 and NMOS transistors Q3, Q4, and Q5. The transistors Q1 and Q3 are cascode-connected to each other, and the transistors Q2 and Q4 are cascode-connected to each other. Each gate of the transistors Q1 and Q3 is connected to each drain of the transistors Q2 and Q4 and the bit line bar/BL. The gates of the transistors Q2 and Q4 are connected to the respective drains of the transistors Q1 and Q3 and the bit line BL. An enable signal EN is input to a gate of the transistor Q5. A drain of the transistor Q5 is connected to sources of the transistors Q3 and Q4.

Incidentally, the circuit configuration of the sense amplifier 22b in the present embodiment is not limited to FIG. 39, and sense amplifiers having various circuit configurations can be applied. For example, it may be configured such that bit lines of cells serving gradations are simultaneously pre-charged at the time of weight update to write data with the same voltage and the same pulse length by activating the word line.

Figure 40:
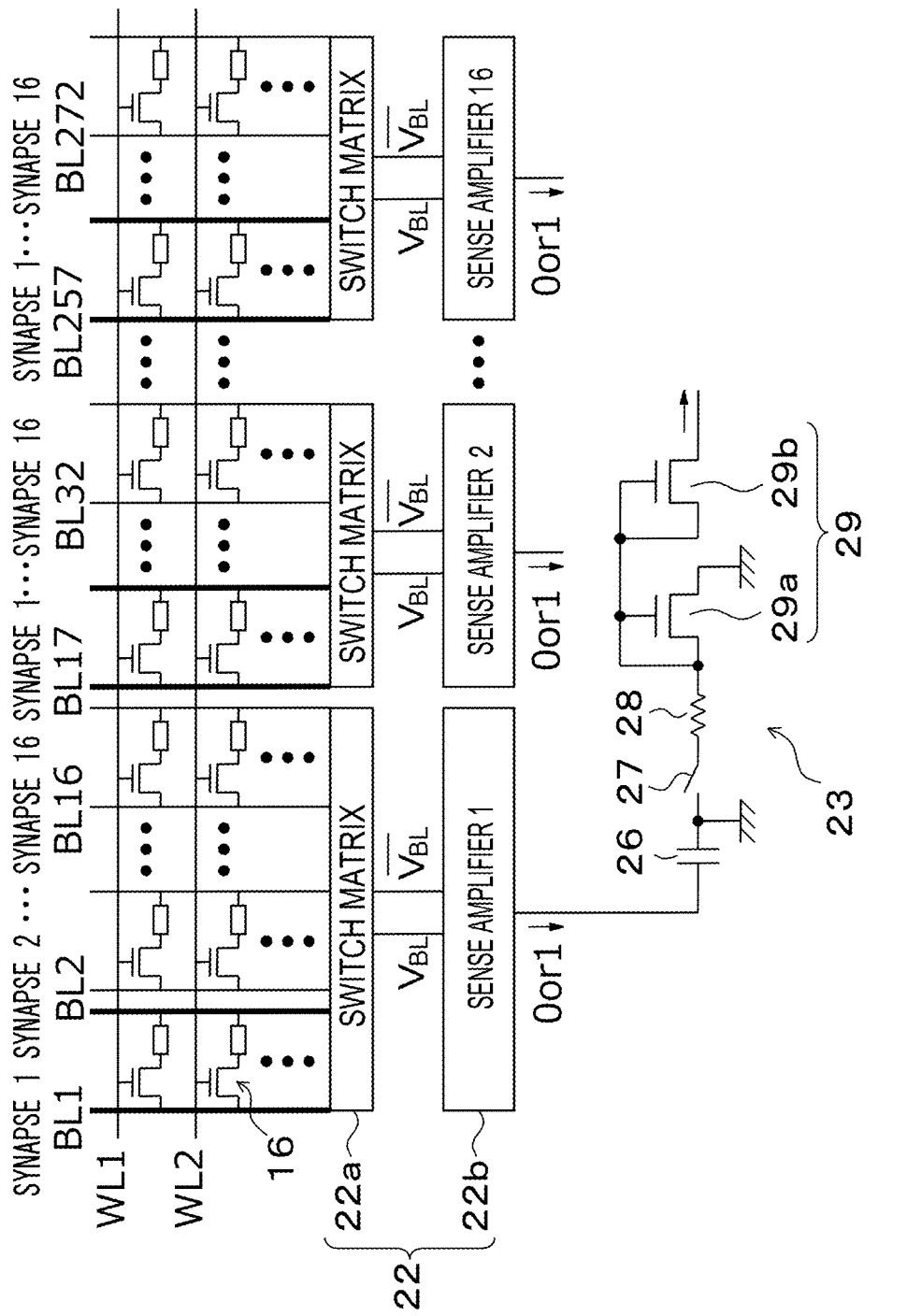
FIG. 40 is a diagram illustrating a configuration of a subsequent stage side of the sense amplifier.

A signal output via the sense amplifier 22b is 0 or 1, or high or low. It is possible to identify the analog value of the weight by inputting this output to the capacitor 26 illustrated in FIG. 40. This voltage may be directly used as the next input or may be amplified by the current mirror circuit 29 and used as the next input.

Figure 41:
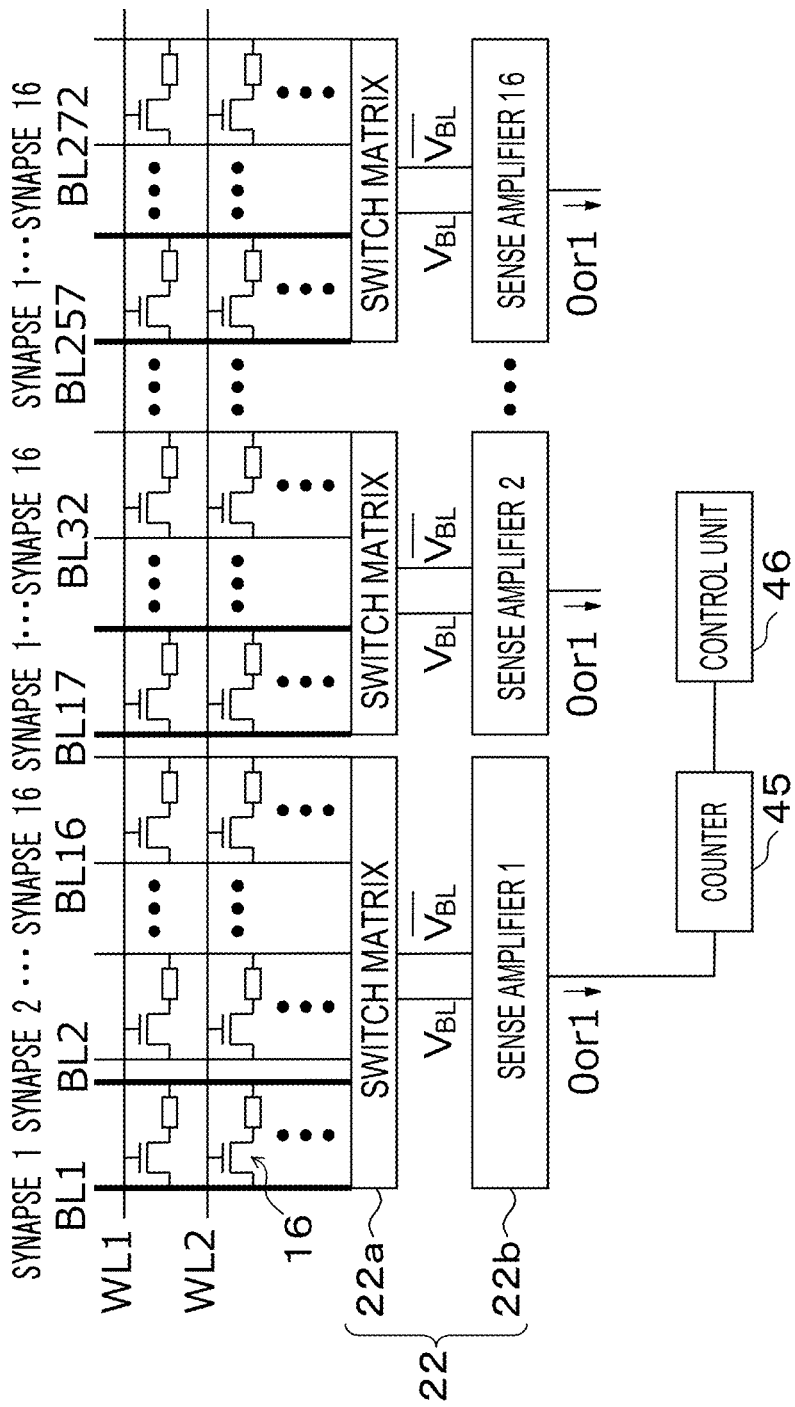
FIG. 41 is a diagram illustrating a modification of FIG. 40.

The signal output via the sense amplifier 22b is 0 or 1, or high or low. This output may be counted by a counter 45 illustrated in FIG. 41, and a cell array at the next stage may be driven by a control unit 46 that changes a voltage value or a pulse width according to such a counted value.

Figure 42:
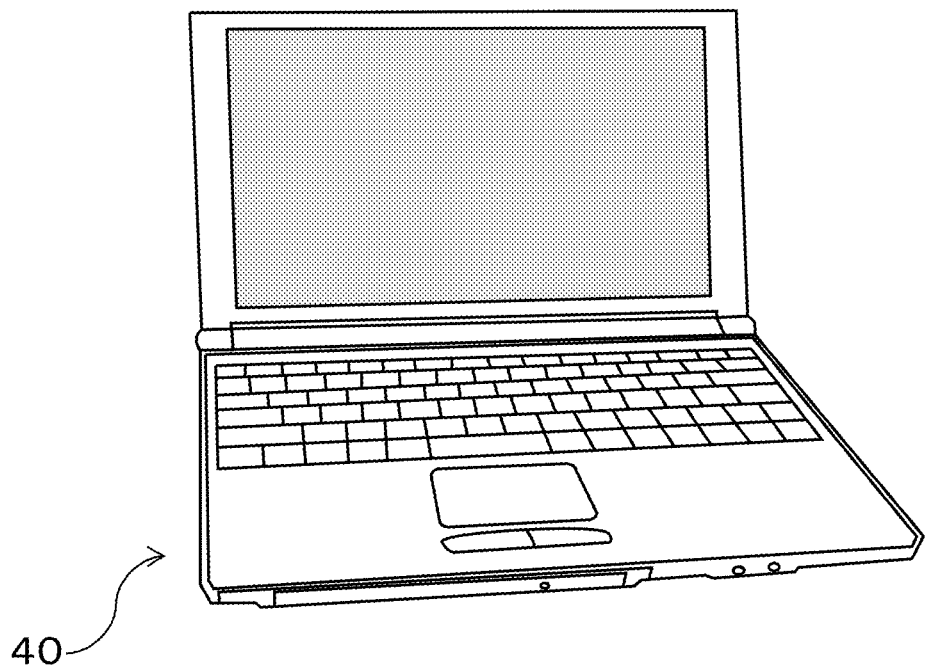
FIG. 42 is a view illustrating an appearance of a PC incorporating a signal processing system.

The signal processing system 1 according to the present embodiment described above may be mounted on a general-purpose personal computer (hereinafter referred to as a PC) 40 illustrated in FIG. 42, for example, or the system may be constructed using a dedicated hardware device. When the signal processing system 1 is mounted on the PC 40 of FIG. 42, the memory system 10 according to the present embodiment may be mounted on a memory board inside the PC 40. In addition, the network construction unit 2 and the information processing unit 4 of FIG. 1 may be executed by a processor of the PC 40 through software processing. Alternatively, hardware corresponding to the network construction unit 2 and the information processing unit 4 may be mounted inside the PC 40.

In addition, the signal processing system 1 according to the present embodiment may be mounted on one or a plurality of semiconductor chips. For example, when the signal processing system 1 is mounted on one semiconductor chip, the memory system 10 of FIG. 2 including the nonvolatile memory 3 of FIG. 1 is built in the semiconductor chip.

Here, examples of the resistance-change memory in the present embodiment include an STT-MRAM, an SOT-MRAM, a voltage-driven MRAM, a ReRAM, a CB-RAM, a PC-RAM, and the like. The ReRAM has a stacked structure of metal and an oxide and is an element in which a conductive path is formed in the oxide or the conductive path is broken by applying a voltage. The resistance-change memory may be the resistance-change element 16b utilizing a periodically-oscillating spin torque oscillator or a phenomenon in which a closure domain (vortex or skyrmion) occurs as precession of magnetization occurs by applying a voltage.

Next, specific examples of the signal processing system 1 and the nonvolatile memory 3 inside the memory system 10 according to the present embodiment will be described.

(Example of Using STT-MRAM)

The nonvolatile memory is a spin-transfer torque magnetic tunnel junction MRAM (STT-MRAM). It is known that speed of magnetization reversal of the STT-MRAM changes depending on an operating current. The STT-MRAM has a magnetic tunnel junction (MTJ) element and a cell transistor. For example, magnetization reversal occurs with a magnitude of 20 uA (micro-ampere) with a current having a pulse width of 5 ns in an MTJ element 16b having a diameter of 20 nm. Magnetization reversal occurs with a magnitude of 30 uA with a current having a pulse width of 3 ns. Magnetization reversal occurs with a magnitude of 50 uA with a current having a pulse width of 2 ns. Here, when a current having a magnitude of 20 uA flows at 3 ns, the magnetization reversal occurs stochastically. In this manner, the STT-MRAM has a feature that the magnetization reversal changes stochastically depending on the pulse width or the magnitude of the pulse voltage. The MTJ element 16b is connected to a source or a drain of the cell transistor 16a. The current value flowing through the MTJ element 16b is changed using a method of changing a bit line voltage Vdd, a method of changing a substrate bias, a method of changing a gate voltage, and the like as described above. For example, the gate voltage may be reduced by about 30% when halving the current flowing through the cell transistor 16a. At this time, it is possible to cause a target current value to flow to the MTJ element 16b as long as characteristics of the cell transistor 16a are in a saturation area even if a resistance value of the transistor is changed by changing the gate voltage.

Figure 43:
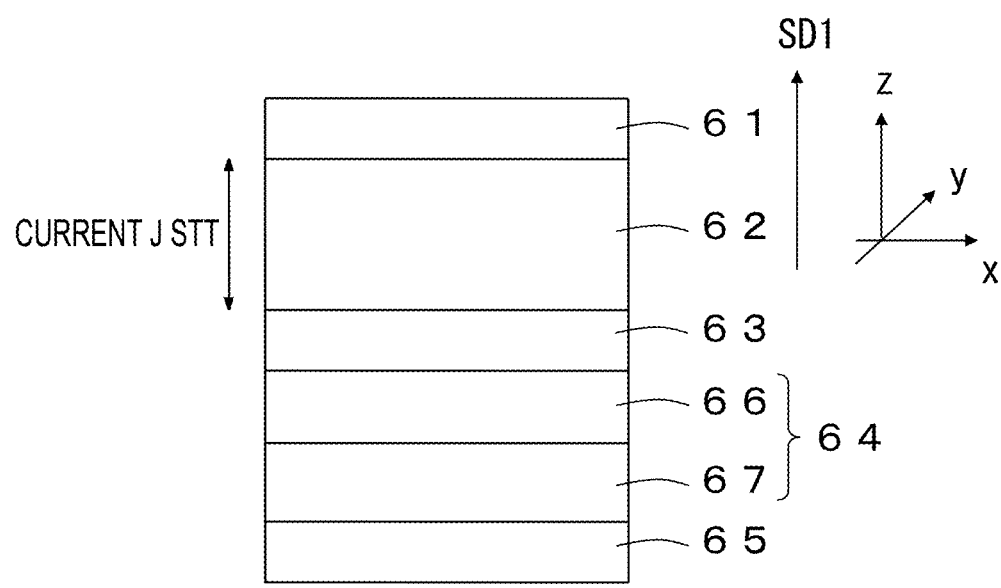
FIG. 43 is a view illustrating a cross-sectional structure of an STT-MRAM.

FIG. 43 is a view illustrating a cross-sectional structure of the STT-MRAM. The STT-MRAM has a structure in which a first conductive layer 61, a first ferromagnetic layer 62, a first nonmagnetic layer 63, a second ferromagnetic layer 64, and a second conductive layer 65 are stacked in this order. The first ferromagnetic layer 62 is a reference layer with a fixed magnetization direction. The second ferromagnetic layer 64 is a storage layer with a variable magnetization direction. The first nonmagnetic layer 63 (spacer layer) is provided between the first ferromagnetic layer 62 and the second ferromagnetic layer 64. The second ferromagnetic layer 64 may be configured to have a first portion and a second portion or configured to have no division.

Either the first ferromagnetic layer 62 or the second ferromagnetic layer 64 is directly or indirectly connected to the first conductive layer 61. In addition, either the first ferromagnetic layer 62 or the second ferromagnetic layer 64 is directly or indirectly connected to the second conductive layer 65.

Hereinafter, a stacked body of the first conductive layer 61, the first ferromagnetic layer 62, the first nonmagnetic layer 63, the second ferromagnetic layer 64, and the second conductive layer 65 will be called a stacked body SB1. A film thickness of the first ferromagnetic layer 62 is 0.5 to 15 nm, and typically 2 to 10 nm. A film thickness of the second ferromagnetic layer 64 is 0.5 to 10 nm, and typically 0.8 to 3 nm.

The first ferromagnetic layer 62 and the second ferromagnetic layer 64 can be made, for example, using a metal material containing at least any element selected from the group consisting of iron (Fe), cobalt (Co), nickel (Ni), manganese (Mn), and chromium (Cr). Further, it is possible to use an alloy containing at least any element selected from the above-described group and at least any metal selected from the group consisting of platinum (Pt), palladium (Pd), iridium (Ir), ruthenium (Ru), rhodium (Rh), gallium (Ga), and germanium (Ge).

In the first ferromagnetic layer 62 and the second ferromagnetic layer 64, a composition of the contained magnetic material, a condition of heat treatment, and the like are adjusted. Accordingly, for example, characteristics such as a magnetization amount and magnetic anisotropy can be adjusted in the first ferromagnetic layer 62 and the second ferromagnetic layer 64. For example, a first portion 66 and a second portion 67 can be formed in the second ferromagnetic layer 64. In addition, the first ferromagnetic layer 62 and the second ferromagnetic layer 64 can be made, for example, using an amorphous alloy of rare earth and transition metal such as TbFeCo and GdFeCo. For example, a stacked structure such as Co/Pt, Co/Pd, and Co/Ni may be used for the first ferromagnetic layer 62 and the second ferromagnetic layer 64. A vertical magnetization film is formed as Co/Ru, Fe/Au, Ni/Cu, or the like is combined with an underlayer. It is possible to use the Co/Ru, Fe/Au, Ni/Cu, or the like as the first ferromagnetic layer 62 and the second ferromagnetic layer 64 by controlling a crystal orientation direction of the film. The first ferromagnetic layer 62 and the second ferromagnetic layer 64 may contain an additive, for example, aluminum (Al), germanium (Ge), nitrogen (N), phosphorus (P), arsenic (As), boron (B), silicon (Si), or the like.

For example, a Heusler alloy may be used for at least one of the first portion 66 and the second portion 67. The Heusler alloy is an alloy, for example, having an $L2_1$ structure and a composition such as $X_2YZ$. In this case, at least one of the first portion 66 and the second portion 67 contains, for example, the Heusler alloy containing at least any one of Co, Mn, Fe, Ni, Cu, Rh, Ru, and Pd.

For example, the first portion 66 and the second portion 67 contain a first Heusler alloy. The first Heusler alloy contains at least any one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

For example, a saturation magnetization Ms of the second portion 67 can be increased by using the first Heusler alloy for the second portion 67.

For example, the first portion 66 and the second portion 67 may contain a second Heusler alloy. The second Heusler alloy contains at least any one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The second Heusler alloy to be used for the first portion 66 has a relatively small saturation magnetization Ms. For example, it is possible to set the saturation magnetization such that Ms<400 emu/cc. As a result, for example, it is possible to reduce a leakage magnetic field to an adjacent magnetic storage element.

In the present embodiment, the above-described Heusler alloy may be used for either the first portion 66 or the second portion 67, or the above-described Heusler alloy may be used for both the first portion 66 and the second portion 67. It is desirable to use the second Heusler alloy for the first portion 66. As a result, for example, it is possible to suppress a leakage magnetic field to a peripheral element. It is desirable to use the first Heusler alloy for the second portion 67.

The first nonmagnetic layer 63 can be made, for example, using an insulating material functioning as a nonmagnetic tunnel barrier layer. Specifically, it is possible to use, for example, an oxide, a nitride, or a fluoride containing at least any element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

The nonmagnetic tunnel barrier layer is, for example, a nonmagnetic layer which has an insulator and causes a current (tunnel current) generated by a tunnel effect to flow when a voltage is applied. A thickness of the nonmagnetic tunnel barrier layer is, for example, 2 nm or smaller. As a result, the tunnel current flows through the nonmagnetic tunnel barrier layer when the voltage is applied.

The first nonmagnetic layer 63 can be made using, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, or the like. The first nonmagnetic layer 63 can be made using, for example, a nonmagnetic semiconductor (ZnOx, InMn, GaN, GaAs, TiOx, Zn, Te, or one of these doped with transition metal) or the like.

A thickness of the first nonmagnetic layer 63 is desirably set to a value in a range of about 0.2 nanometer (nm) to 2.0 nm. As a result, for example, an excessive increase in resistance is suppressed while securing the uniformity of an insulating film.

The first conductive layer 61 and the second conductive layer 65 are made using, for example, a conductive magnetic material or a conductive nonmagnetic material. For example, a magnetic material containing at least any element selected from the group consisting of iron (Fe), cobalt (Co), nickel (Ni), manganese (Mn), and chromium (Cr) can be used as the conductive magnetic material. Further, an alloy containing at least any element selected from the above-described group and at least any element selected from the group consisting of platinum (Pt), palladium (Pd), iridium (Ir), ruthenium (Ru), and rhodium (Rh) may be used.

For example, any metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy containing two or more metal selected from the above-described group can be used as the conductive nonmagnetic material used for the first conductive layer 61 and the second conductive layer 65.

Further, the conductive nonmagnetic material used for the first conductive layer 61 and the second conductive layer 65 may be at least any of a conductive nitride, a conductive oxide, and a conductive fluoride containing at least any element selected from the above-described group. The conductive nonmagnetic material used for the first conductive layer 61 and the second conductive layer 65 may be a carbon nanotube, a carbon nanowire, graphene, or the like.

A conductive protection film may be provided on the first conductive layer 61 and the second conductive layer 65. In this case, the protection film can be made, for example, using an alloy containing at least any element selected from the group consisting of tantalum (Ta), ruthenium (Ru), copper (Cu), gold (Au), silver (Ag), and aluminum (Al), or a material such as graphene. Considering an electromigration resistance and a low resistance, it is desirable to use any element selected from the group consisting of copper (Cu) and aluminum (Al) or an alloy containing these for the protection film.

There is a case where a transistor is directly or indirectly connected to at least one of the first conductive layer 61 and the second conductive layer 65. At this time, for example, a source portion or a drain portion of the transistor may be used for the above-described at least one of the first conductive layer 61 and the second conductive layer 65. In addition, at this time, for example, a contact portion connected to the source portion or the drain portion of the transistor may be used for the above-described at least one of the first conductive layer 61 and the second conductive layer 65.

A direction parallel to a stacking direction SD1 of the stacked body SB1 is set as a Z-axis direction. One axis perpendicular to a Z axis is set as an X axis. An axis perpendicular to the X axis and the Z axis is set as a Y axis. A film surface of a layer included in the stacked body SB1 is parallel to an X-Y plane. For example, a main surface 10a is parallel to the X-Y plane.

In the MTJ element 16b, spin-polarized electrons are caused to act on the second ferromagnetic layer 64 by causing a current to flow through the stacked body SB1 in the stacking direction SD1. As a result, a magnetization direction of the first portion 66 of the second ferromagnetic layer 64 and a magnetization direction of the second portion 67 are determined in accordance with a direction of the current.

<Vertical Magnetization MTJ>

For example, the first ferromagnetic layer 62 functions as a first magnetization-fixed layer. In the first ferromagnetic layer 62, for example, the magnetization is fixed in a direction substantially perpendicular to the film surface. The magnetization direction of the first ferromagnetic layer 62 is substantially parallel to the stacking direction SD1. For example, synthetic antiferro magnetization (antiferromagnetic coupling) occurs in the first portion and the second portion. That is, there is a case where the magnetization directions are opposite to each other. In addition, there is a case where the magnetization directions may be oriented in the same direction as another example.

In this case, magnetization occurs in the form of magnetostatic coupling or ferromagnetic coupling.

The second ferromagnetic layer 64 functions, for example, as a magnetic storage layer. In addition, when the second ferromagnetic layer 64 has the first portion and the second portion, for example, the magnetization direction of the first portion 66 is substantially perpendicular to the film surface and substantially parallel to the stacking direction SD1. The first portion is on the first nonmagnetic layer 63 side. The magnetization of the first portion 66 is reversible. The first portion 66 serves a role of increasing the spin injection efficiency at the time of magnetization reversal. The second portion is on the second conductive layer 65 side.

In the second portion 67 of the second ferromagnetic layer 64, for example, the magnetization direction of the second portion is substantially perpendicular to the film surface and substantially parallel to the stacking direction SD1. The magnetization of the second portion 67 is reversible. The second portion serves the role of storing data.

<In-Plane Magnetization MTJ>

For example, the first ferromagnetic layer 62 functions as a first magnetization-fixed layer. In the first ferromagnetic layer 62, for example, the magnetization is fixed in a direction substantially parallel to the film surface. The magnetization direction of the first ferromagnetic layer 62 is substantially perpendicular to the stacking direction SD1.

The second ferromagnetic layer 64 functions, for example, as a magnetic storage layer. In addition, when the second ferromagnetic layer 64 has the first portion and the second portion, for example, the magnetization direction of the first portion 66 is substantially parallel to the film surface and substantially perpendicular to the stacking direction SD1. The first portion is on the first nonmagnetic layer 63 side. The magnetization of the first portion 66 is reversible. The first portion 66 serves a role of increasing the spin injection efficiency at the time of magnetization reversal. The second portion is on the second conductive layer 65 side. For example, synthetic antiferro magnetization (antiferromagnetic coupling) occurs in the first portion and the second portion. That is, there is a case where the magnetization directions are opposite to each other. In addition, there is a case where the magnetization directions may be oriented in the same direction as another example. In this case, magnetization occurs in the form of magnetostatic coupling or ferromagnetic coupling.

In the second portion 67 of the second ferromagnetic layer 64, for example, the magnetization direction of the second portion 67 is substantially parallel to the film surface and substantially perpendicular to the stacking direction SD1. The magnetization of the second portion 67 is reversible. The second portion serves the role of storing data.

<Cross-Sectional Shape of MTJ>

A shape of the stacked body SB1 when projected onto the XY plane is arbitrary. Examples of the shape of the stacked body SB1 when projected onto the X-Y plane include a circle, an ellipse, a flat circle, a polygon, and the like. In the case of the polygon, it is preferable to have three or more corners such as a quadrangle or a hexagon.

In addition, the polygon may be rounded.

A shape of the stacked body SB1 when projected onto a plane parallel to the Z axis (for example, a Z-X plane or a Z-Y plane) is arbitrary. Examples of the shape of the stacked body SB1 (the shape cut along a plane perpendicular to the film plane) when projected onto the plane parallel to the Z axis can include a tapered shape or an inverted tapered shape.

<Magnetic Shield>

At least a part of a side surface SS1 of the stacked body SB1 may be covered with a magnetic shield. In other words, the magnetic shield faces at least a part of the side surface of the stacked body SB1. A shape of the magnetic shield when projected onto the X-Y plane is, for example, a ring shape that surrounds the stacked body SB1.

The magnetic storage element further includes a protective layer provided between the side surface of the stacked body SB1 and the magnetic shield. A thickness of the protective layer is desirably, for example, 2 nm to 30 nm.

For example, the side surface of the stacked body SB1 is covered with the magnetic shield such as permalloy (Py) with the protective layer such as SiN and $Al_2O_3$ interposed therebetween. As a result, for example, when a plurality of magnetic storage elements is arranged, the operation of the stacked body SB1 is prevented from being adversely affected by a leakage magnetic field from an adjacent magnetic storage element. For example, an effective magnetic field acting on the stacked body SB1 is substantially the same in each storage cell (the stacked body SB1), and thus, variations in the reversal current between bits are prevented. In addition, it is possible to prevent the leakage magnetic field from the stacked body SB1 from acting on the adjacent magnetic storage element. As a result, it is possible to arrange the plurality of magnetic storage elements to be close to each other, and to improve the degree of integration. For example, it is possible to improve a storage density of a nonvolatile storage device.

The magnetic shield can be made, for example, using any metal selected from the group consisting of iron (Fe), cobalt (Co), nickel (Ni), manganese (Mn), and chromium (Cr), or an alloy containing two or more metal selected from this group. The magnetic shield may be, for example, an alloy containing at least any metal selected from the group consisting of iron (Fe), cobalt (Co), nickel (Ni), manganese (Mn), and chromium (Cr) and at least any metal selected from the group consisting of platinum (Pt), palladium (Pd), iridium (Ir), ruthenium (Ru), rhodium (Rh), gallium (Ga), and germanium (Ge).

It is possible to adjust characteristics of the magnetic shield by adjusting a composition of a magnetic material contained in the magnetic shield and a condition of heat treatment. The magnetic shield may be, for example, an amorphous alloy of rare earth and transition metal such as TbFeCo and GdFeCo. In addition, a stacked structure such as Co/Pt, Co/Pd, and Co/Ni may be used for the magnetic shield.

The protective layer can be made, for example, using an oxide, a nitride, or a fluoride containing at least any element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). For example, SiN is used for the protective layer.

(Example of Using SOT-MRAM)

Figure 44:
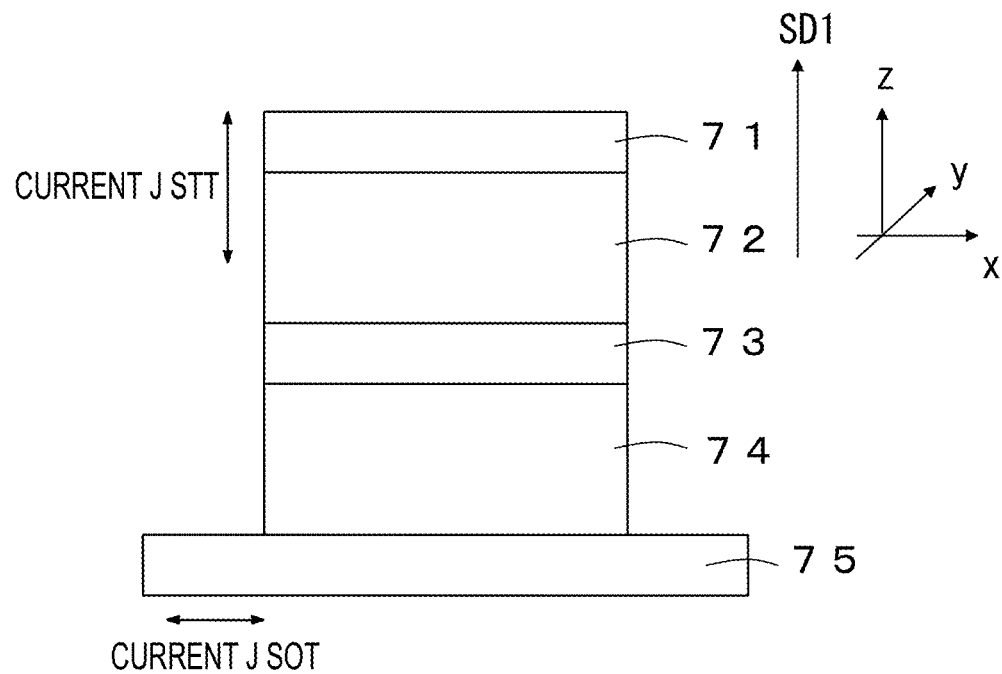
FIG. 44 is a view illustrating a cross-sectional structure of an SOT-MRAM.

The nonvolatile memory forming a single-layer memory 7 may be a spin-orbit torque magnetic tunnel junction MRAM (SOT-MRAM). FIG. 44 is a view illustrating a cross-sectional structure of the SOT-MRAM. The SOT-MRAM has a structure in which a first conductive layer 71, a first ferromagnetic layer 72, a first nonmagnetic layer 73, a second ferromagnetic layer 74, and a second conductive layer 75 are stacked in this order.

The first ferromagnetic layer 72 is a reference layer with a fixed magnetization direction. The second ferromagnetic layer 74 is a storage layer with a variable magnetization direction. The first nonmagnetic layer 73 (spacer layer) is provided between the first ferromagnetic layer 72 and the second ferromagnetic layer 74.

The first ferromagnetic layer 72 and the first conductive layer 71 are directly or indirectly connected to each other. In addition, the second ferromagnetic layer 74 and the second conductive layer 75 are directly or indirectly connected to each other. A stacked body of the first conductive layer 71, the first ferromagnetic layer 72, the first nonmagnetic layer 73, the second ferromagnetic layer 74, and the second conductive layer 75 will be called a stacked body SB1.

When a current ($J_{SOT}$) is caused to flow to the second conductive layer 75 using a material having strong spin orbit interaction to be described later, a spin orbit field Hso is generated. The spin orbit field can also be a spin orbit torque Tso acting on magnetization of the second ferromagnetic layer 74. With the use of the spin orbit field, a magnetization direction of the second ferromagnetic layer 74 can be directly reversed. In addition, a current ($J_{STT}$) may be caused to flow to reverse the magnetization direction of the second ferromagnetic layer 74 while causing the current ($J_{SOT}$) to flow to make the spin orbit field Hso act on the second ferromagnetic layer 74. In either case, the time required for magnetization reversal of the second ferromagnetic layer 74 can be changed by changing a magnitude of the current ($J_{SOT}$). For example, it is possible to change the magnetization direction of the second ferromagnetic layer 74 within the time of 0.5 ns or less using a certain current ($J_{STT}$). In addition, it is possible to change the magnetization direction of the second ferromagnetic layer 74 within the time of 0.2 ns or less using a larger current ($J_{STT}$). In this manner, a current value required for magnetization reversal increases as a pulse width decreases.

A film thickness of the first ferromagnetic layer 72 is 0.5 to 15 nm, and typically 2 to 10 nm.

A film thickness of the second ferromagnetic layer 74 is 0.1 to 5 nm, and preferably 2 nm or smaller.

The first ferromagnetic layer 72 and the second ferromagnetic layer 74 can be made, for example, using a metal material containing at least any element selected from the group consisting of iron (Fe), cobalt (Co), nickel (Ni), manganese (Mn), and chromium (Cr). Further, it is possible to use an alloy containing at least any element selected from the above-described group and at least any metal selected from the group consisting of platinum (Pt), palladium (Pd), iridium (Ir), ruthenium (Ru), rhodium (Rh), gallium (Ga), and germanium (Ge).

In the first ferromagnetic layer 72 and the second ferromagnetic layer 74, a composition of the contained magnetic material, a condition of heat treatment, and the like are adjusted. Accordingly, for example, characteristics such as a magnetization amount and magnetic anisotropy can be adjusted in the first ferromagnetic layer 72 and the second ferromagnetic layer 74. For example, the second ferromagnetic layer 74 may be divided into a first portion and a second portion. In addition, the first ferromagnetic layer 72 and the second ferromagnetic layer 74 can be made, for example, using an amorphous alloy of rare earth and transition metal such as TbFeCo and GdFeCo. For example, a stacked structure such as Co/Pt, Co/Pd, and Co/Ni may be used for the first ferromagnetic layer 72 and the second ferromagnetic layer 74. A vertical magnetization film is formed as Co/Ru, Fe/Au, Ni/Cu, or the like is combined with an underlayer. It is possible to use the Co/Ru, Fe/Au, Ni/Cu, or the like as the first ferromagnetic layer 72 and the second ferromagnetic layer 74 by controlling a crystal orientation direction of the film. The first ferromagnetic layer 72 and the second ferromagnetic layer 74 may contain an additive, for example, aluminum (Al), germanium (Ge), nitrogen (N), phosphorus (P), arsenic (As), boron (B), silicon (Si), or the like.

The first ferromagnetic layer 72 and the second ferromagnetic layer 74 may be made using, for example, a Heusler alloy.

The Heusler alloy is an alloy, for example, having an $L2_1$ structure and a composition such as $X_2YZ$. In this case, at least one of a first portion 76 and a second portion 77 contains, for example, the Heusler alloy containing at least any one of Co, Mn, Fe, Ni, Cu, Rh, Ru, and Pd.

The first ferromagnetic layer 72 and the second ferromagnetic layer 74 contain, for example, a first Heusler alloy. The first Heusler alloy contains at least any one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

For example, a saturation magnetization Ms of the second portion 77 can be increased by using the above-described first Heusler alloy.

The first ferromagnetic layer 72 and the second ferromagnetic layer 74 contain, for example, a second Heusler alloy. The second Heusler alloy contains at least any one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

The above-described second Heusler alloy has a relatively small saturation magnetization Ms. For example, it is possible to set the saturation magnetization such that Ms<A400 emu/cc. As a result, for example, it is possible to reduce a leakage magnetic field to an adjacent magnetic storage element.

In the present embodiment, the above-described Heusler alloy may be used for either the first ferromagnetic layer 72 or the second ferromagnetic layer 74, or the above-described Heusler alloy may be used for both the first ferromagnetic layer 72 and the second ferromagnetic layer 74. It is desirable to use the second Heusler alloy for the second ferromagnetic layer 74. As a result, for example, it is possible to suppress a leakage magnetic field to a peripheral element. It is desirable to use the first Heusler alloy for the second portion 77.

The first nonmagnetic layer 73 can be made, for example, using an insulating material functioning as a nonmagnetic tunnel barrier layer. Specifically, it is possible to use, for example, an oxide, a nitride, or a fluoride containing at least any element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

The nonmagnetic tunnel barrier layer is, for example, a nonmagnetic layer which has an insulator and causes a current (tunnel current) generated by a tunnel effect to flow when a voltage is applied. A thickness of the nonmagnetic tunnel barrier layer is, for example, 2 nm or smaller. As a result, the tunnel current flows through the nonmagnetic tunnel barrier layer when the voltage is applied.

The first nonmagnetic layer 73 can be made using, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, or the like. The first nonmagnetic layer 73 can be made using, for example, a nonmagnetic semiconductor (ZnOx, InMn, GaN, GaAs, TiOx, Zn, Te, or one of these doped with transition metal) or the like.

A thickness of the first nonmagnetic layer 73 is desirably set to a value in a range of about 0.2 nanometer (nm) to 2.0 nm. As a result, for example, an excessive increase in resistance is suppressed while securing the uniformity of an insulating film.

The first conductive layer 71 is made using, for example, a conductive magnetic material or a conductive nonmagnetic material. For example, a magnetic material containing at least any element selected from the group consisting of iron (Fe), cobalt (Co), nickel (Ni), manganese (Mn), and chromium (Cr) can be used as the conductive magnetic material. Further, an alloy containing at least any element selected from the above-described group and at least any element selected from the group consisting of platinum (Pt), palladium (Pd), iridium (Ir), ruthenium (Ru), and rhodium (Rh) may be used.

For example, any metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy containing two or more metal selected from the above-described group can be used as the conductive nonmagnetic material used for the first conductive layer 71.

Further, the conductive nonmagnetic material used for the first conductive layer 71 may be at least any of a conductive nitride, a conductive oxide, and a conductive fluoride containing at least any element selected from the above-described group. The conductive nonmagnetic material used for the first conductive layer 71 may be a carbon nanotube, a carbon nanowire, graphene, or the like.

The second conductive layer 75 is a film having the strong spin orbit interaction that can be used to switch a magnetic moment of the second ferromagnetic layer 74 (storage layer). The second conductive layer 75 can be used to generate the spin orbit field Hso. The spin orbit field can also be a spin orbit torque Tso acting on magnetization of the second ferromagnetic layer 74. In the present invention, the material having the strong spin orbit interaction is used for the second conductive layer 75. In such a material, the spin-orbit interaction includes both a spin Hall effect and a Rashba effect, but one of the two effects is dominant. Consequently, the spin Hall effect and the Rashba effect are described as follows. The spin Hall effect is generally regarded as a bulk effect. Substances that often exhibit the spin Hall effect include heavy metal or substances doped with heavy metal. For example, such substances may be selected from M doped with A and B. A contains Y, Zr, Nb, Mo, Tc, Ru, Rh, Pd, Cd, In, Sb, Te, Hf, Ta (including a highly resistive amorphous β-Ta), W, Re, Os, Ir, Pt, Au, Hg, Tl, Pb, Bi, Po, At, and/or combinations thereof. M contains at least one of Al, Ti, V, Cr, Mn, Cu, Zn, Ag, Hf, Ta, W, Re, Pt, Au, Hg, Pb, Si, Ga, GaMn and GaAs. B contains at least one of V, Cr, Mn, Fe, Co, Ni, P, S, Zn, Ga, Ge, As, Se, Y, Zr, Nb, Mo, Tc, Ru, Rh, Pd, Ag, Cd, InSb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, and Yb. For example, Ta, Pd, Cd, Cu, Au, Bi, Ir, Ru, W, and the like may be directly used. For example, the second conductive layer 75 is made using Cu doped with Ir and/or Cu doped with Bi doped with Bi, or can include these.

As for another material having the strong spin orbit interaction, the origin from which the spin orbit field Hso is generated relates to the spin orbit interaction at an interface. The strong spin orbit effect at the interface relates to crystal field gradients in an interface direction and a vertical direction, which is often referred to as the Rashba effect. Here, the Rashba effect refers to the spin orbit interaction at the interface without being limited thereto. An interface for the second conductive layer 75 needs to differ between at least predetermined embodiments in order to obtain a considerable magnitude of the Rashba effect. For example, the Rashba effect can be generated when a Pt film is used as the second conductive layer 75, a Co film is used as the second ferromagnetic layer 74, and MgO is used as the first nonmagnetic layer 73. The second conductive layer 75 may be an alloy. For example, the second conductive layer 75 can contain at least one of, Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Jr, Pt, Au, Hg, Tl, Pb, Bi, Po, At, La, Ce, Pr, Nd, Pm, Sm, Eu, Gd, Tb, Dy, Ho, Er, Tm, and Yb, and/or combinations thereof. In another embodiment, the second conductive layer 75 contains a surface alloy of A/B (for example, an atom of A arranged on the (111) surface of B, which is the main substance), but an upper atomic layer is a mixture of A and B. A contains at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Jr, Pt, Au, Hg, Tl, Pb, Bi, Po, At, La, Ce, Pr, Nd, Pm, Sm, Eu, Gd, Tb, Dy, Ho, Er, Tm, and Yb. B contains at least one of Si, Zn, Cu, Ag, Au, W, Zn, Cr, Pt, and Pd. In many embodiments, A contains other two or three substances.

A film thickness of the second conductive layer 75 is 0.5 to 100 nm, and typically 0.5 to 10 nm. The film thickness of the second conductive layer 75 is desirably 5 nm or smaller.

A conductive protection film may be provided on the first conductive layer 71 and the second conductive layer 75. In this case, the protection film can be made, for example, using an alloy containing at least any element selected from the group consisting of tantalum (Ta), ruthenium (Ru), copper (Cu), gold (Au), silver (Ag), and aluminum (Al), or a material such as graphene. Considering an electromigration resistance and a low resistance, it is desirable to use any element selected from the group consisting of copper (Cu) and aluminum (Al) or an alloy containing these for the protection film.

When a current ($J_{SOT}$) is caused to flow to the second conductive layer 75 using a material having strong spin orbit interaction to be described later, a spin orbit field Hso is generated. The spin orbit field can also be a spin orbit torque Tso acting on magnetization of the second ferromagnetic layer 74. With the use of the spin orbit field, a magnetization direction of the second ferromagnetic layer 74 can be directly reversed. In addition, a current ($J_{STT}$) may be caused to flow to reverse the magnetization direction of the second ferromagnetic layer 74 while causing the current ($J_{SOT}$) to flow to make the spin orbit field Hso act on the second ferromagnetic layer 74. In either case, the time required for magnetization reversal of the second ferromagnetic layer 74 can be changed by changing a magnitude of the current ($J_{SOT}$). When $J_{STT}=0$, it is possible to change the magnetization direction of the second ferromagnetic layer 74 within the time of 0.5 ns or less using a certain current ($J_{SOT}$). In addition, it is possible to change the magnetization direction of the second ferromagnetic layer 74 within the time of 0.2 ns or less using a larger current ($J_{SOT}$). In addition, when $J_{SOT}$ is applied as a finite value as another example, it is possible to change the magnetization direction of the second ferromagnetic layer 74 within the time of 0.5 ns or less using a certain current ($J_{STT}$). In addition, it is possible to change the magnetization direction of the second ferromagnetic layer 74 within the time of 0.2 ns or less using a larger current ($J_{STT}$). In this manner, a current value required for magnetization reversal increases as a pulse width decreases.

A film thickness of the first ferromagnetic layer 72 is 0.5 to 15 nm, and typically 2 to 10 nm.

A film thickness of the second ferromagnetic layer 74 is 0.1 to 5 nm, and preferably 3 nm or smaller.

A film thickness of the second conductive layer 75 is 0.5 to 100 nm, and typically 0.5 to 10 nm. The film thickness of the second conductive layer 75 is desirably 5 nm or smaller.

It is preferable to set the film thickness of the second conductive layer 75 to be thinner since it is possible to decrease the current necessary for reversal of the magnetization of the second ferromagnetic layer 74.

The vertical magnetization of the first ferromagnetic layer and the second ferromagnetic layer 74 is suitable for miniaturization. As a result, it is possible to increase the degree of integration of the memory cell array 11. Since a wiring length is shortened, an access cycle is shortened, and the processing performance is improved.

A magnetic field may be externally applied. It is desirable that the main component of its application direction be in the X-Y plane. For example, an in-plane magnetic field is applied.

When the first ferromagnetic layer 72 and the second ferromagnetic layer 74 are subjected to in-plane magnetization, a cross-sectional shape of the MTJ may be flat. As a result, the in-plane magnetization state is easily maintained. In the case of the in-plane magnetization, the spin orbit field is likely to act, and thus, the magnetization reversal can be achieved even if a size of the MTJ is increased to some extent. As a result, the MTJ becomes less likely to lose stored information against thermal disturbance.

A magnetic field may be externally applied so as to cancel a shift magnetic field in the second ferromagnetic layer 74. It is desirable that the main component of its application direction be in the X-Y plane. For example, an in-plane magnetic field is applied.

<Vertical Magnetization MTJ>

For example, the first ferromagnetic layer 72 functions as a first magnetization-fixed layer. In the first ferromagnetic layer 72, for example, the magnetization is fixed in a direction substantially perpendicular to the film surface. The magnetization direction of the first ferromagnetic layer 72 is substantially parallel to the stacking direction SD1.

The second ferromagnetic layer 74 functions, for example, as a magnetic storage layer. The magnetization direction is substantially perpendicular to the film surface and substantially parallel to the stacking direction SD1. The magnetization direction can be reversed. The vertical magnetization of the first ferromagnetic layer 72 and the second ferromagnetic layer 74 is suitable for miniaturization. As a result, it is possible to increase the degree of integration of the memory cell array 11. Since a wiring length is shortened, an access cycle is shortened, and the processing performance is improved. A magnetic field may be externally applied. In this case, it is desirable to have the main component in the X-Y plane.

<In-Plane Magnetization MTJ>

For example, the first ferromagnetic layer 72 functions as a first magnetization-fixed layer. In the first ferromagnetic layer 72, for example, the magnetization is fixed in a direction substantially parallel to the film surface. The magnetization direction of the first ferromagnetic layer 72 is substantially perpendicular to the stacking direction SD1.

The second ferromagnetic layer 74 functions, for example, as a magnetic storage layer. The magnetization direction is substantially parallel to the film surface and substantially perpendicular to the stacking direction SD1. The magnetization direction can be reversed.

When the first ferromagnetic layer 72 and the second ferromagnetic layer 74 are subjected to in-plane magnetization, a cross-sectional shape of the MTJ may be flat. As a result, the in-plane magnetization state is easily maintained. In the case of the in-plane magnetization, the spin orbit field is likely to act, and thus, the magnetization reversal can be achieved even if a size of the MTJ is increased to some extent. As a result, the MTJ becomes less likely to lose stored information against thermal disturbance. A magnetic field may be externally applied. In this case, it is desirable to have the main component in the X-Y plane.

(Example of Using Voltage Application-Driven Anisotropy-Change MRAM)

A description will be given regarding a case where a magnetoresistance effect memory (voltage application-driven anisotropy-change MRAM) is used as the nonvolatile memory. A first ferromagnetic layer is a reference layer with a fixed magnetization direction. A second ferromagnetic layer is a storage layer with a variable magnetization direction. A first nonmagnetic layer (spacer layer) is provided between the first ferromagnetic layer and the second ferromagnetic layer.

Either the first ferromagnetic layer or the second ferromagnetic layer is directly or indirectly connected to a first conductive layer. In addition, either the first ferromagnetic layer or the second ferromagnetic layer is directly or indirectly connected to a second conductive layer.

A stacked body of the first conductive layer, the first ferromagnetic layer, the first nonmagnetic layer, the second ferromagnetic layer, and the second conductive layer will be called a stacked body SB1.

Here, materials forming the first ferromagnetic layer and the second ferromagnetic layer are the same as those of the STT-MRAM. In addition, materials forming the first nonmagnetic layer, the first conductive layer, and the second conductive layer are also the same as those of the STT-MRAM.

Here, a storage unit, which includes a magnetic storage element including the stacked body SB1 and a magnetic field applying unit that applies a magnetic field containing a component in a first in-plane direction perpendicular to a stacking direction to the second ferromagnetic layer, and a control unit, which is electrically connected to the magnetic storage element and executes a setting operation of changing a voltage between the first ferromagnetic layer and the second ferromagnetic layer of the magnetic storage element from a first setting voltage to a second setting voltage, are provided. It is assumed that a change of a component of an anisotropic magnetic field of the second ferromagnetic layer in the stacking direction when the first setting voltage is changed to the second setting voltage is $\Delta H$ (Oerstedt), the component of the anisotropic magnetic field of the second ferromagnetic layer in the stacking direction is $H_u$ (Oerstedt), a component of the magnetic field applied by the magnetic field applying unit in the first in-plane direction is $H_{ext}$ (Oerstedt), and a component of the anisotropic magnetic field of the second ferromagnetic layer in the first in-plane direction is $H_{dx}$ (Oerstedt). In a nonvolatile storage device satisfying the condition expressed by the following formula (3), the magnetic field applied by the magnetic field applying unit causes the magnetization reversal as the magnetic anisotropy of the second ferromagnetic layer is changed by applying the voltage. In this case, since the magnetization reversal speed changes depending on a magnitude of the second setting voltage, it is possible to change memory characteristics using the voltage.

$$\Delta H > (H_u + H_{dx}) \frac{(H_u + H_{dx} - H_{ext})}{(H_u + H_{dx} + H_{ext})} \qquad (3)$$

In addition, the following configuration may be provided as another example. A first ferromagnetic layer is a reference layer with a fixed magnetization direction. A second ferromagnetic layer is a storage layer with a variable magnetization direction. A first nonmagnetic layer (spacer layer) is provided between the first ferromagnetic layer and the second ferromagnetic layer.

Either the first ferromagnetic layer or the second ferromagnetic layer is directly or indirectly connected to a first conductive layer. In addition, either the first ferromagnetic layer or the second ferromagnetic layer is directly or indirectly connected to a second conductive layer.

A stacked body of the first conductive layer, the first ferromagnetic layer, the first nonmagnetic layer, the second ferromagnetic layer, and the second conductive layer will be called a stacked body SB1. Here, materials forming the first ferromagnetic layer and the second ferromagnetic layer are the same as those of the STT-MRAM. In addition, materials forming the first nonmagnetic layer, the first conductive layer, and the second conductive layer are also the same as those of the STT-MRAM.

The stacked body SB1 has such a structure that a part or more of the second ferromagnetic layer portion is surrounded by the third conductive layer. The third conductive layer and the stacked body SB1 are in contact with each other with the protective layer, which has been described in the STT-MRAM, interposed therebetween, and there is no conduction therebetween. It is possible to apply a voltage to the third conductive layer. In this case, when the voltage is applied to the third conductive layer at the same time of (or before) performing a write operation onto the second ferromagnetic layer, the magnetic anisotropy of the second ferromagnetic layer changes, and it is possible to speed up the magnetization reversal with respect to the current. Since the magnetization reversal speed changes, it is possible to change the memory characteristics using the voltage.

(Example of Using Domain Wall Motion Memory)

A description will be given regarding a case where a domain wall motion memory (domain wall motion MRAM) is used as the nonvolatile memory. A first ferromagnetic layer is a reference layer with a fixed magnetization direction. A second ferromagnetic layer is a storage layer with a variable magnetization direction. The second ferromagnetic layer includes a domain wall. A first nonmagnetic layer (spacer layer) is provided between the first ferromagnetic layer and the second ferromagnetic layer.

Either the first ferromagnetic layer or the second ferromagnetic layer is directly or indirectly connected to a first conductive layer. In addition, either the first ferromagnetic layer or the second ferromagnetic layer is directly or indirectly connected to a second conductive layer.

Figure 45:
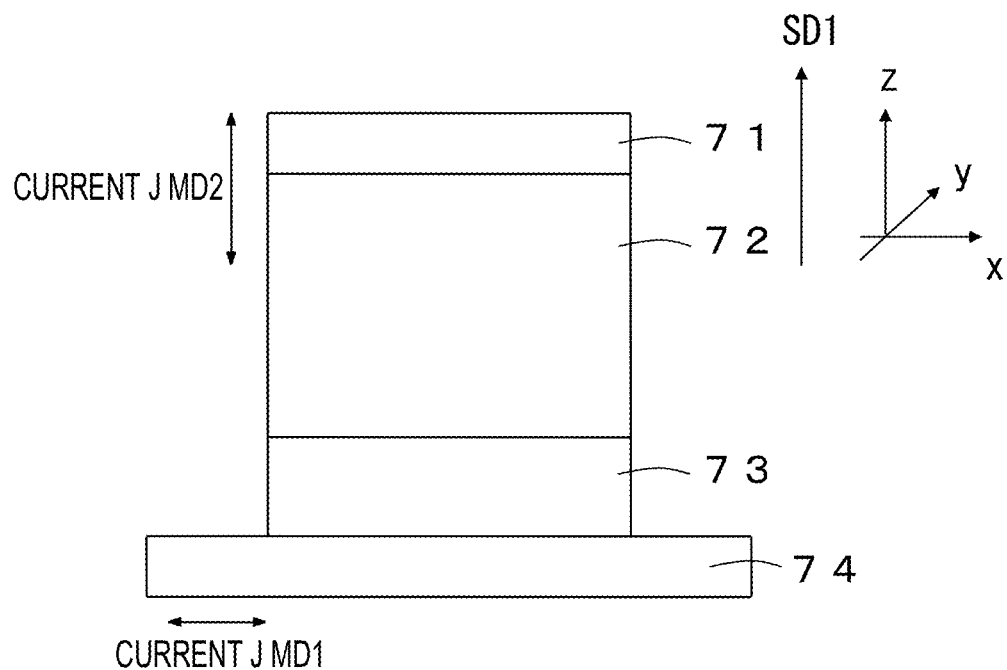
FIG. 45 is a schematic view illustrating a stacked body of a domain wall motion memory.

A stacked body of the first conductive layer, the first ferromagnetic layer, the first nonmagnetic layer, the second ferromagnetic layer, and the second conductive layer will be called a stacked body SB1. FIG. 45 is a schematic view illustrating the stacked body SB1. Here, the second conductive layer is not drawn in order for simplification.

Here, materials forming the first ferromagnetic layer and the second ferromagnetic layer are the same as those of the STT-MRAM. In addition, materials forming the first nonmagnetic layer, the first conductive layer, and the second conductive layer are also the same as those of the STT-MRAM. Here, JMD1 represents a current at the time of write, and JMD2 represents a current used at the time of read.

<Vertical Magnetization MTJ>

For example, the first ferromagnetic layer 72 functions as a first magnetization-fixed layer. In the first ferromagnetic layer 72, for example, the magnetization is fixed in a direction substantially perpendicular to the film surface. The magnetization direction of the first ferromagnetic layer 72 is substantially parallel to the stacking direction SD1.

The second ferromagnetic layer 74 functions, for example, as a magnetic storage layer. The magnetization direction of the second ferromagnetic layer is substantially perpendicular to the film surface and substantially parallel to the stacking direction SD1.

The second ferromagnetic layer includes an area with upward magnetization and an area with downward magnetization. That is, the second ferromagnetic layer includes the domain wall.

Figure 46:
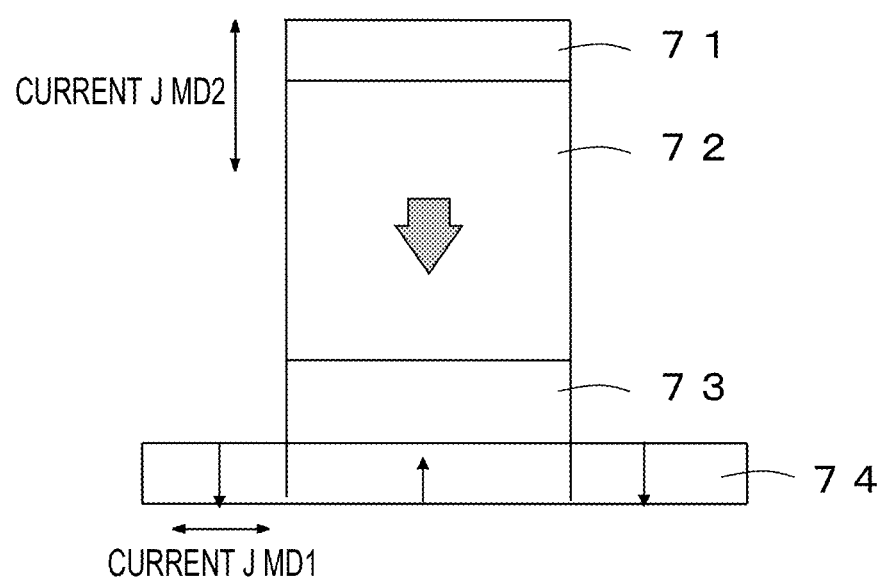
FIG. 46 is a schematic view illustrating the stacked body of the domain wall motion memory.

A boundary of the domain wall can move in the x direction by the current JMD1. For example, as illustrated in FIG. 46, when the magnetization direction of the first ferromagnetic layer is a downward direction and the magnetization direction of the second ferromagnetic layer is an upward direction in an area, positioned below the first ferromagnetic layer in the drawing, the stacked body SB1 is in an anti-parallel state of magnetization. In this case, when the read current JMD2 flows, a high resistance is observed.

In FIG. 46, when the write current JMD1 flows, the position of the domain wall moves in the x direction. As a result, when the magnetization of the second ferromagnetic layer is directed downward in the area positioned below the first ferromagnetic layer in the drawing, the magnetization of the stacked body SB1 is in a parallel state. In this case, when the read current JMD2 flows, a low resistance is observed.

<In-Plane Magnetization MTJ>

For example, the first ferromagnetic layer 72 functions as a first magnetization-fixed layer. In the first ferromagnetic layer 72, for example, the magnetization is fixed in a direction substantially parallel to the film surface. The magnetization direction of the first ferromagnetic layer 72 is substantially perpendicular to the stacking direction SD1.

The second ferromagnetic layer 74 functions, for example, as a magnetic storage layer. The magnetization direction of the second ferromagnetic layer is substantially parallel to the film surface and substantially perpendicular to the stacking direction SD1. The second ferromagnetic layer includes an area with rightward magnetization and an area with leftward magnetization. That is, the second ferromagnetic layer includes the domain wall. A method of moving the domain wall and a resistance state are the same as those in the case of the vertical magnetization MTJ described above.

In particular, there is a case where a spin vortex structure (skyrmion) is generated in a magnetic material when using a material such as $MnSi$, $FeGe$, $Cu_2OSeO_3$, $BaFe_{12-x}Sc_xO_{19}$, $La_{2-x}Sr_{1+x}Mn_2O_7$, $Fe_{1-x}Co_xSi$, $Mn_{1-x}Fe_xGe$, $Mn_{1-x}Fe_xSi$, and $Ba(Fe_{1-x-0.05}Sc_xMg_{0.05})_{12}O_{19}$. The skyrmion is easily formed when the second ferromagnetic layer 64 is made using a material, such as MnSi and FeGe, which has a chiral crystal structure with no reversal symmetry, such as a B20 type structure, to reduce the thickness. Thus, any material forming the skyrmion can be used as the second ferromagnetic layer 64 of the present disclosure without being limited to the above-described material. The skyrmion has topological stability and also can be driven with the lower current density as compared to the domain wall. For example, the JMD1 can be made lower than the case of the domain wall.

<MTJ in Which In-Plane Magnetization and Vertical Magnetization Are Mixed>

In FIG. 43, the first ferromagnetic layer 62 functions, for example, as a first magnetization-fixed layer. In the first ferromagnetic layer 62, for example, the magnetization is fixed in a direction substantially perpendicular to the film surface.

The magnetization direction of the first ferromagnetic layer 62 is substantially parallel to the stacking direction SD1. The second ferromagnetic layer 64 functions, for example, as a magnetic storage layer. The magnetization direction of the second ferromagnetic layer is substantially parallel to the film surface and substantially perpendicular to the stacking direction SD1.

In this case, the second ferromagnetic layer periodically rotates when a current flows. This is referred to as oscillation in some cases. In this case, a third ferromagnetic layer is further provided in the stacking direction, and the magnetization direction thereof is set to be substantially parallel to the film surface and the orientation thereof is fixed. This third ferromagnetic layer functions as a reference layer at the time of causing a current to flow to read a magnetization state. Then, it is possible to change the magnetization direction depending on the time of causing the current to flow to the second ferromagnetic layer. In addition, such an element is also referred to the spin torque oscillator in some cases.

In FIG. 43, the first ferromagnetic layer 62 functions, for example, as a first magnetization-fixed layer. In the first ferromagnetic layer 62, for example, the magnetization is fixed in a direction substantially parallel to the film surface.

The magnetization direction of the first ferromagnetic layer 62 is substantially perpendicular to the stacking direction SD1. The second ferromagnetic layer 64 functions, for example, as a magnetic storage layer. The magnetization direction of the second ferromagnetic layer is substantially perpendicular to the film surface and substantially parallel to the stacking direction SD1.

In this case, the second ferromagnetic layer periodically rotates when a current flows. This is referred to as oscillation in some cases. In this case, a third ferromagnetic layer is further provided in the stacking direction, and the magnetization direction thereof is set to be substantially perpendicular to the film surface and the orientation thereof is fixed. This third ferromagnetic layer functions as a reference layer at the time of causing a current to flow to read a magnetization state. Then, it is possible to change the magnetization direction depending on the time of causing the current to flow to the second ferromagnetic layer. In addition, such an element is also referred to the spin torque oscillator in some cases.

(Example of Using Resistance-Change Memory)

A case where a resistance-change memory is used as the nonvolatile memory will be described. The resistance variable memory includes a first electrode, a second electrode, a resistance change film connected between the first and second electrodes and capable of being reversibly changed between first and second resistance states. The vertical relationship between the first and second electrodes is not particularly limited. For example, the second electrode may be present on the top of the first electrode, or the first electrode may be present on the top of the second electrode. In addition, each of the first and second electrodes and the resistance change film may have a single-layer structure or have a multilayer structure including a plurality of layers. Further, a diode may be connected in series to a resistance change element including the first and second electrodes and the resistance change film. The first and second electrodes are made of metal such as Ni, Pt, Au, Ag, Cu, Ru, Ir, Co, Ti, Al, Rh, Nb, and W, a conductive semiconductor such as polysilicon doped with impurities, or a silicide of these metal and conductive semiconductor. In addition, the first and second electrodes may have a compound such as TiAlN, SrRuO$_3$, RuN, TiN, TaN, LaNiO$_x$, PtIrO$_x$, PtRhO$_x$, TaAloN, and InSnO$_x$. The resistance change film comprises a metal oxide such as HfO$_x$, SiO$_x$, Ta$_x$O$_y$, ZnO, TiO$_2$, NiO, WO$_x$, Nb$_2$O$_5$, CuO$_2$, Al$_x$O$_y$, CoO, Fe$_2$O$_3$, SrTiO$_3$, SrZrO$_3$, and (BaSr)TiO$_3$. The resistance change film is capable of being reversibly changed between at least two resistance states. Even in this case, if the voltage value to be applied to the memory is changed, the time required for the state change changes similarly to the STT-MRAM.

(Example of Using Phase-Change Memory)

A case where a phase-change memory is used as a nonvolatile memory will be described. The phase-change memory includes a first electrode, a second electrode, a resistance change film connected between the first and second electrodes and capable of reversibly changing between the first and second resistance states. The vertical relationship between the first and second electrodes is not particularly limited. For example, the second electrode may be present on the top of the first electrode, or the first electrode may be present on the top of the second electrode. In addition, each of the first and second electrodes and the resistance change film may have a single-layer structure or have a multilayer structure including a plurality of layers. Further, a diode may be connected in series to a resistance change element including the first and second electrodes and the resistance change film. The first and second electrodes are made of metal such as Ni, Pt, Au, Ag, Cu, Ru, Ir, Co, Ti, Al, Rh, Nb, and W, a conductive semiconductor such as polysilicon doped with impurities, or a silicide of these metal and conductive semiconductor. In addition, the first and second electrodes may have a compound such as TiAlN, SrRuO$_3$, RuN, TiN, TaN, LaNiO$_x$, PtIrO$_x$, PtRhO$_x$, TaAlN, and InSnO$_x$. The resistance change film may contain a chalcogenide-based material and other materials. For example, the chalcogenide may contain O (oxygen), S (sulfur), Se (Selenium), Te (tellurium), or the like of Group VIA of the periodic table. The chalcogenide may contain Ge (germanium), Sn (tin), or the like of Group IVA. The chalcogenide may contain Sb (antimony), Ga (gallium), In (indium), or Ag (silver). In addition to this, the resistance change film may be formed using a compound such as Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te/, Ge/Sb/Se/Te, and Te/Ge/Sb/S. For example, a compound such as Te$_a$Ge$_b$Sb$_{100-(a+b)}$ can be exemplified when taking Ge/Sb/Te as an example. Other examples include Ge$_2$Sb$_2$Te$_5$, GeSb$_2$Te$_4$, GeSb$_4$Te$_7$, and the like. The resistance change film may contain transition metal such as Cr (chromium), Fe (iron), Ni (nickel), Nb (niobium), Pd (palladium), and Pt (platinum). These may form a mixture or a compound with the above Ge/Sb/Te.

Even in this case, if the voltage value to be applied to the memory is changed, the time required for the state change changes similarly to the STT-MRAM.

The memory system according to the present embodiment described above includes: a nonvolatile memory having a plurality of readable and writable memory cells; a write voltage control unit that controls at least one of a voltage value and a pulse width of a write voltage of the nonvolatile memory according to a weight of a signal processing path or a signal processing node; a write unit that writes data in two or more memory cell groups out of the plurality of memory cells using the write voltage controlled by the write voltage control unit; a reversal probability detection unit that detects a reversal probability of the memory cell group when writing data is written by the write unit; and a weight conversion unit that converts the detected reversal probability into a weight.

The write unit may collectively write data to two or more memory cell groups among the plurality of memory cells using the write voltage controlled by the write voltage control unit. The reversal probability indicates a ratio of the number of memory cells whose logic is reversed among the memory cell groups.

The memory system may include a difference detection unit that detects a difference between the weight converted by the weight conversion unit and the weight used by the write voltage control unit to control the write voltage; and a weight update unit that updates a weight to be used by the write voltage control unit to control the write voltage based on the difference. The write voltage control unit may control at least one of the voltage value and the pulse width of the write voltage according to the weight updated by the weight update unit.

The weight update unit may update a weight to be used by the write voltage control unit to control the write voltage based on a value obtained by multiplying the difference by a predetermined update coefficient.

The write voltage control unit may control at least one of the voltage value and the pulse width of the write voltage according to a weight that minimizes energy when performing calculation processing with a predetermined signal processing network in which a weight is allocated to a signal processing path or signal processing node.

The weight update unit may further include a weight-sum calculation unit that calculates a sum of a plurality of weights. The write voltage control unit may control at least one of the voltage value and the pulse width of the write voltage according to a weight calculated by the weight-sum calculation unit.

The memory cell group may be provided as many as necessary to write a weight as an analog value, and identical data may be collectively written into the memory cell group at the write voltage controlled by the write voltage control unit.

The memory cell group may be provided as many as a number of bits of a bit string representing a weight in binary numbers, and data may be collectively written in each wiring corresponding to the bit string at the write voltage controlled by the write voltage control unit in the memory cell group.

The memory cell group may be provided as many as a number of kinds of weights, and data may be collectively written in each wiring corresponding to the number of kinds of weights at the write voltage controlled by the write voltage control unit in the memory cell group.

The nonvolatile memory may have: a first group of memory cells corresponding to a number necessary to write a weight as an analog value; and a second group of memory cells corresponding to a number of bits of a bit string representing a weight in binary numbers. When update of the reversal probability is completed using the first group of memory cells, the write unit may write information on a weight corresponding to the reversal probability at time of completion to the second group of memory cells.

The nonvolatile memory may have a third group of memory cells which are provided in a different area from the first group of memory cells and necessary to write a weight as an analog value. When update of the reversal probabilities corresponding to different weights using the first group of memory cells and the third group of memory cells is completed, the write unit may write information on weights corresponding to the reversal probabilities of the first group of memory cells and the third group of memory cells at time of completion to the second group of memory cells.

The memory system may further include a read unit that collectively or sequentially reads data stored in the memory cell group after completion of update of the reversal probability in the nonvolatile memory.

The memory system may further include a product-sum calculation unit that performs product-sum calculation processing of multiplying a weight corresponding to the reversal probability included in the data read by the read unit by a predetermined signal.

The read unit may have a sense amplifier that sequentially reads data stored in the first group of memory cells or a current sum circuit that detects a sum of currents according to the data stored in the first group of memory cells.

The memory cell area including the memory cell group may have: a plurality of first wirings arranged in a first direction and corresponding to different weights; and a plurality of second wirings arranged in a second direction crossing the first direction and configured to store or read values of the weights. The write unit may supply the same write voltage to some or all of the plurality of second wirings when any first wiring among the plurality of first wirings is driven.

The memory cell area including the memory cell group may have: a plurality of first wirings arranged in a first direction and corresponding to a plurality of different weights; a plurality of second wirings arranged in a second direction crossing the first direction and configured to store or read values of the weights; and a plurality of read units provided for each group of two or more second wirings among the plurality of second wirings. The write unit may repeatedly perform a process of writing weight data to each of a plurality of memory cells by collectively selecting each second wiring from among the groups of the second wirings corresponding to each of the plurality of read units and collectively driving a plurality of the collectively selected second wirings until selecting all the second wirings among the groups of the second wirings. Each of the plurality of read units may repeatedly perform a process of collectively selecting each second wiring from among the groups of the second wirings and collectively reading the weight data from a plurality of memory cells connected to a plurality of the collectively selected second wirings until selecting all the second wirings among the groups of the second wirings.

Each of the plurality of second wirings may have a pair of wirings whose logic is opposite to each other, and one of the pair of wirings provided in each of the plurality of second wirings may be set to a common electric potential.

The semiconductor storage device according to the present embodiment includes: a nonvolatile memory cell array having a plurality of readable and writable memory cells; a write voltage control unit that controls at least one of a voltage value and a pulse width of a write voltage of the nonvolatile memory cell array according to a weight of a signal processing path or a signal processing node; a write unit that collectively writes data in two or more memory cell groups among the plurality of memory cells using the write voltage controlled by the write voltage control unit; and a reversal probability detection unit that detects a reversal probability indicating a ratio of a number of memory cells whose logic is reversed among the memory cell groups when data is written in the write unit.

A signal processing system according to the present embodiment includes: a network construction unit that constructs a signal processing network including a weight of a signal processing path or a signal processing node; a nonvolatile memory that stores the weight; and an information processing unit that reads the weight from the nonvolatile memory and performs calculation processing in accordance with the signal processing network. The nonvolatile memory has: a plurality of readable and writable memory cells; a write voltage control unit that controls at least one of a voltage value and a pulse width of a write voltage of the nonvolatile memory according to the weight of the processing network; a write unit that collectively writes data in two or more memory cell groups among the plurality of memory cells using the write voltage controlled by the write voltage control unit; and a reversal probability detection unit that detects a reversal probability indicating a ratio of a number of memory cells whose logic is reversed among the memory cell groups when data is written in the write unit.

In this manner, the write voltage of the nonvolatile memory is controlled according to the weight of the signal processing path or the signal processing node to perform write to the nonvolatile memory, and the reversal probability of the data read from the nonvolatile memory is converted into the weight and used for signal processing in the present embodiment, and thus, the nonvolatile memory can be used for storage of the weight.

It is necessary to perform calculation using a large number of weights at high speed in the course of signal processing in the signal processing networks such as the neural network. In the present embodiment, however, the weight data can be stored in the nonvolatile memory by positively using the nonvolatile memory whose reversal probability is changed by controlling the write voltage and utilizing the difference in reversal probability. For example, the MRAM typified by the MTJ element 16b has the characteristic that the reversal probability is changed depending on the voltage value or the pulse width of the write voltage in addition to the excellent write resistance, and thus, can be used to store the weight by utilizing such characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a nonvolatile memory having a plurality of readable and writable memory cells;
a write voltage control unit that controls at least one of a voltage value and a pulse width of a write voltage of the nonvolatile memory in accordance with a weight of a signal processing path or a signal processing node;
a write unit that writes data in two or more memory cell groups among the plurality of memory cells using the write voltage controlled by the write voltage control unit;
a reversal probability detection unit that detects a reversal probability of the memory cell group when writing data is written by the write unit;
a weight conversion unit that converts the detected reversal probability into a weight,
a difference detection unit that detects a difference between the weight converted by the weight conversion unit and the weight used by the write voltage control unit to control the write voltage; and
a weight update unit that updates a weight to be used by the write voltage control unit to control the write voltage based on the difference,
wherein the write voltage control unit controls at least one of the voltage value and the pulse width of the write voltage in accordance with the weight updated by the weight update unit.

2. The memory system according to claim 1, wherein the weight update unit updates a weight to be used by the write voltage control unit to control the write voltage based on a value obtained by multiplying the difference by a predetermined update coefficient.

3. The memory system according to claim 1, wherein the write voltage control unit controls at least one of the voltage value and the pulse width of the write voltage in accordance with a weight that minimizes energy when performing calculation processing with a predetermined signal processing network in which a weight is allocated to a signal processing path or signal processing node.

4. The memory system according to claim 1, further comprising
a weight-sum calculation unit that calculates a sum of a plurality of weights,
wherein the write voltage control unit controls at least one of the voltage value and the pulse width of the write voltage in accordance with a weight calculated by the weight-sum calculation unit.

5. The memory system according to claim 1, wherein the memory cell group is provided as many as necessary to write a weight as an analog value, and identical data is collectively written into the memory cell group at the write voltage controlled by the write voltage control unit.

6. The memory system according to claim 1, wherein the memory cell group is provided as many as a number of bits of a bit string representing a weight in binary numbers, and data is collectively written in each wiring corresponding to the bit string at the write voltage controlled by the write voltage control unit in the memory cell group.

7. The memory system according to claim 1, wherein the memory cell group is provided as many as a number of kinds of weights, and data is collectively written in each wiring corresponding to the number of kinds of weights at the write voltage controlled by the write voltage control unit in the memory cell group.

8. The memory system according to claim 1, wherein the nonvolatile memory comprises:
a first group of memory cells corresponding to a number necessary to write a weight as an analog value; and
a second group of memory cells corresponding to a number of bits of a bit string representing a weight in binary numbers, and
when update of the reversal probability is completed using the first group of memory cells, the write unit writes information on a weight corresponding to the reversal probability at time of completion to the second group of memory cells.

9. The memory system according to claim 8, wherein the nonvolatile memory comprises a third group of memory cells which are provided in a different area from the first group of memory cells and necessary to write a weight as an analog value, and
when update of the reversal probabilities corresponding to different weights using the first group of memory cells and the third group of memory cells is completed, the write unit writes information on weights corresponding to the reversal probabilities of the first group of memory cells and the third group of memory cells at time of completion to the second group of memory cells.

10. The memory system according to claim 1, further comprising
a read unit that collectively or sequentially reads data stored in the memory cell group after completion of update of the reversal probability in the nonvolatile memory.

11. The memory system according to claim 10, further comprising
a product-sum calculation unit that performs product-sum calculation processing of multiplying a weight corresponding to the reversal probability included in the data read by the read unit by a predetermined signal.

12. The memory system according to claim 10, wherein
the read unit comprises a sense amplifier that sequentially reads data stored in the first group of memory cells or a current sum circuit that detects a sum of currents in accordance with the data stored in the first group of memory cells.

13. The memory system according to claim 1, wherein
the memory cell area including the memory cell group comprises:
a plurality of first wirings arranged in a first direction and corresponding to different weights; and
a plurality of second wirings arranged in a second direction crossing the first direction and configured to store or read values of the weights, and
the write unit supplies the same write voltage to some or all of the plurality of second wirings when any first wiring among the plurality of first wirings is driven.

14. The memory system according to claim 1, wherein
the memory cell area including the memory cell group comprises:
a plurality of first wirings arranged in a first direction and corresponding to a plurality of different weights;
a plurality of second wirings arranged in a second direction crossing the first direction and configured to store or read values of the weights; and
a plurality of read units provided for each group of two or more second wirings among the plurality of second wirings,
the write unit repeatedly performs a process of writing weight data to each of a plurality of memory cells by collectively selecting each second wiring from among the groups of the second wirings corresponding to each of the plurality of read units and collectively driving a plurality of the collectively selected second wirings until selecting all the second wirings among the groups of the second wirings, and
each of the plurality of read units repeatedly performs a process of collectively selecting each second wiring from among the groups of the second wirings and collectively reading the weight data from a plurality of memory cells connected to a plurality of the collectively selected second wirings until selecting all the second wirings among the groups of the second wirings.

15. The memory system according to claim 14, wherein
each of the plurality of second wirings comprises a pair of wirings whose logic is opposite to each other, and one of the pair of wirings provided in each of the plurality of second wirings is set to a common electric potential.

16. A semiconductor storage device comprising:
a nonvolatile memory cell array having a plurality of readable and writable memory cells;
a write voltage control unit that controls at least one of a voltage value and a pulse width of a write voltage of the nonvolatile memory cell array in accordance with a weight of a signal processing path or a signal processing node;
a write unit that collectively writes data in two or more memory cell groups among the plurality of memory cells using the write voltage controlled by the write voltage control unit;
a reversal probability detection unit that detects a reversal probability indicating a ratio of a number of memory cells whose logic is reversed among the memory cell groups when data is written in the write unit;
a weight conversion unit that converts the detected reversal probability into a weight;
a difference detection unit that detects a difference between the weight converted by the weight conversion unit and the weight used by the write voltage control unit to control the write voltage; and
a weight update unit that updates a weight to be used by the write voltage control unit to control the write voltage based on the difference,
wherein the write voltage control unit controls at least one of the voltage value and the pulse width of the write voltage in accordance with the weight updated by the weight update unit.

17. A signal processing system comprising:
a network construction unit that constructs a signal processing network including a weight of a signal processing path or a signal processing node;
a nonvolatile memory that stores the weight; and
an information processing unit that reads the weight from the nonvolatile memory and performs calculation processing in accordance with the signal processing network,
wherein the nonvolatile memory comprises:
a plurality of readable and writable memory cells;
a write voltage control unit that controls at least one of a voltage value and a pulse width of a write voltage of the nonvolatile memory in accordance with the weight of the processing network;
a write unit that collectively writes data in two or more memory cell groups among the plurality of memory cells using the write voltage controlled by the write voltage control unit; and
a reversal probability detection unit that detects a reversal probability indicating a ratio of a number of memory cells whose logic is reversed among the memory cell groups when data is written in the write unit.

* * * * *